United States Patent
Wyatt et al.

(10) Patent No.: US 12,196,783 B2
(45) Date of Patent: Jan. 14, 2025

(54) RESISTORS, CURRENT SENSE RESISTORS, BATTERY SHUNTS, SHUNT RESISTORS, AND METHODS OF MAKING

(71) Applicant: VISHAY DALE ELECTRONICS, LLC, Columbus, NE (US)

(72) Inventors: Todd Wyatt, Columbus, NE (US); Tom Bertsch, Norfolk, NE (US); Joshua Johnson, Columbus, NE (US); Aaron Krause, Columbus, NE (US); Sara Vo, Columbus, NE (US); Darin Glenn, Columbus, NE (US)

(73) Assignee: Vishay Dale Electronics, LLC, Columbus, NE (US)

( * ) Notice: Subject to any disclaimer, the term of this patent is extended or adjusted under 35 U.S.C. 154(b) by 0 days.

(21) Appl. No.: 18/096,951

(22) Filed: Jan. 13, 2023

(65) Prior Publication Data

US 2023/0341440 A1    Oct. 26, 2023

Related U.S. Application Data

(63) Continuation of application No. 17/317,233, filed on May 11, 2021, now Pat. No. 11,555,831.

(60) Provisional application No. 63/068,243, filed on Aug. 20, 2020.

(51) Int. Cl.
| | |
|---|---|
| *G01R 1/20* | (2006.01) |
| *H01C 1/148* | (2006.01) |
| *H01C 7/13* | (2006.01) |
| *H01C 17/232* | (2006.01) |

(52) U.S. Cl.
CPC ............ *G01R 1/203* (2013.01); *H01C 1/148* (2013.01); *H01C 7/13* (2013.01); *H01C 17/232* (2013.01)

(58) Field of Classification Search
CPC .......... H01C 1/148; H01C 7/13; H01C 17/22; H01C 17/232; H01C 17/242; G01R 1/203
See application file for complete search history.

(56) References Cited

U.S. PATENT DOCUMENTS

| | | |
|---|---|---|
| 4,079,349 A | 3/1978 | Dorfeld |
| 4,200,970 A | 5/1980 | Schonberger |
| 4,529,958 A | 7/1985 | Person et al. |
| 4,620,365 A | 11/1986 | Burger et al. |

(Continued)

FOREIGN PATENT DOCUMENTS

| | | |
|---|---|---|
| CN | 1308728 A | 8/2001 |
| CN | 2490589 Y | 5/2002 |

(Continued)

OTHER PUBLICATIONS

JP 2009266977 translation (Year: 2009).*

(Continued)

*Primary Examiner* — Kyung S Lee
(74) *Attorney, Agent, or Firm* — Volpe Koenig

(57) ABSTRACT

A plurality of resistors are disclosed herein. The resistor may include one or more resistive elements and a plurality of conductive portions. Openings or slots, which can be configured to adjust temperature coefficient or resistance (TCR) values of the resistor, are formed in the resistive elements. The shape, quantity, and orientation of the openings or slots can vary. In one aspect, header assemblies are provided for securing or holding pins relative to the resistors.

26 Claims, 25 Drawing Sheets

(56) References Cited

U.S. PATENT DOCUMENTS

| | | | |
|---|---|---|---|
| 4,907,341 A | 3/1990 | Chapel, Jr. et al. | |
| 5,015,989 A | 5/1991 | Wohlfarth et al. | |
| 5,214,407 A * | 5/1993 | McKim, Jr | H01C 17/24 |
| | | | 338/195 |
| 5,287,083 A | 2/1994 | Person et al. | |
| 5,604,477 A | 2/1997 | Rainer et al. | |
| 5,621,240 A | 4/1997 | Ellis | |
| 5,815,065 A | 9/1998 | Hanamura | |
| 5,953,811 A * | 9/1999 | Mazzochette | H01C 17/22 |
| | | | 29/874 |
| 5,999,085 A | 12/1999 | Szwarc et al. | |
| 6,097,276 A | 8/2000 | Van Den Broek et al. | |
| 6,150,920 A | 11/2000 | Hashimoto et al. | |
| 6,181,234 B1 * | 1/2001 | Szwarc | H01C 1/144 |
| | | | 338/53 |
| 6,189,767 B1 | 2/2001 | Haspeslagh | |
| 6,348,392 B1 | 2/2002 | Nakayama et al. | |
| 6,356,179 B1 | 3/2002 | Yamada | |
| 6,401,329 B1 | 6/2002 | Smejkal et al. | |
| 6,489,693 B1 | 12/2002 | Hetzler | |
| 6,492,896 B2 | 12/2002 | Yoneda | |
| 6,646,430 B1 | 11/2003 | Skerritt et al. | |
| 6,946,845 B2 | 9/2005 | Hetzler | |
| 7,170,295 B2 | 1/2007 | Hetzler | |
| RE39,660 E | 5/2007 | Swarc et al. | |
| 7,380,333 B2 | 6/2008 | Tsukada et al. | |
| D616,387 S | 5/2010 | Chou et al. | |
| 7,843,309 B2 | 11/2010 | Zandman et al. | |
| 7,911,319 B2 | 3/2011 | Smith | |
| 8,031,043 B2 | 10/2011 | Schultz et al. | |
| D654,881 S | 2/2012 | Chou et al. | |
| 8,183,976 B2 | 5/2012 | Lo et al. | |
| 8,198,977 B2 | 6/2012 | Smith et al. | |
| 8,242,878 B2 | 8/2012 | Smith et al. | |
| 8,248,202 B2 | 8/2012 | Brackhan | |
| 8,525,637 B2 | 9/2013 | Smith et al. | |
| 8,581,687 B2 | 11/2013 | Belman | |
| 8,598,976 B2 | 12/2013 | Hetzler | |
| 8,878,643 B2 | 11/2014 | Smith et al. | |
| 8,884,733 B2 * | 11/2014 | Hetzler | H01C 7/06 |
| | | | 338/195 |
| 9,396,849 B1 | 7/2016 | Wyatt et al. | |
| 9,400,294 B2 | 7/2016 | Smith et al. | |
| 9,460,834 B2 | 10/2016 | Croci | |
| 9,779,860 B2 | 10/2017 | Smith et al. | |
| D811,335 S | 2/2018 | Weng | |
| 10,163,553 B2 | 12/2018 | Kameko et al. | |
| D837,171 S | 1/2019 | Vasoya | |
| D837,623 S | 1/2019 | Powers | |
| 10,217,550 B2 | 2/2019 | Smith et al. | |
| D844,577 S | 4/2019 | Venk | |
| D855,569 S | 8/2019 | Featherstone | |
| 10,438,730 B2 | 10/2019 | Kao et al. | |
| 10,545,176 B2 | 1/2020 | Harvey et al. | |
| 10,670,637 B2 | 6/2020 | Kaupp | |
| 10,796,826 B2 | 10/2020 | Smith et al. | |
| D905,786 S | 12/2020 | Vitale | |
| 11,067,063 B2 | 7/2021 | Li et al. | |
| D949,807 S | 4/2022 | Wada | |
| 11,313,881 B2 | 4/2022 | Krummenacher et al. | |
| 11,313,885 B2 | 4/2022 | Choi | |
| 11,387,020 B2 | 7/2022 | Kim | |
| 11,415,601 B2 | 8/2022 | Hung | |
| 11,555,831 B2 * | 1/2023 | Wyatt | G01R 1/44 |
| 2002/0031860 A1 | 3/2002 | Tanimura | |
| 2002/0130761 A1 | 9/2002 | Tsukada | |
| 2004/0216303 A1 | 11/2004 | Berlin et al. | |
| 2004/0263150 A1 | 12/2004 | Hetzler | |
| 2005/0200451 A1 | 9/2005 | Tsukada | |
| 2009/0085715 A1 * | 4/2009 | Zandman | H01C 1/014 |
| | | | 29/621 |
| 2009/0195348 A1 | 8/2009 | Smith et al. | |
| 2009/0205196 A1 | 8/2009 | Grudin et al. | |
| 2010/0237982 A1 | 9/2010 | Brackhan et al. | |
| 2012/0154104 A1 | 6/2012 | Hetzler | |
| 2013/0181807 A1 * | 7/2013 | Hetzler | H01C 7/06 |
| | | | 338/7 |
| 2015/0054531 A1 * | 2/2015 | Smith | G01R 1/203 |
| | | | 29/610.1 |
| 2017/0003322 A1 | 1/2017 | Nakamura | |
| 2017/0089955 A1 | 3/2017 | Yogou | |
| 2019/0326038 A1 | 10/2019 | Smith et al. | |
| 2020/0200799 A1 * | 6/2020 | Hung | H01C 1/14 |
| 2021/0020339 A1 | 1/2021 | Smith et al. | |
| 2021/0158997 A1 | 5/2021 | Endo | |
| 2022/0057436 A1 | 2/2022 | Wyatt | |

FOREIGN PATENT DOCUMENTS

| | | | |
|---|---|---|---|
| CN | 101960538 A | | 1/2011 |
| CN | 102696079 A | | 9/2012 |
| CN | 103180916 A | | 6/2013 |
| CN | 111354523 A | | 6/2020 |
| DE | 202021103627 U1 | | 7/2021 |
| EP | 0605800 B1 | | 3/1996 |
| EP | 0716427 A2 | | 6/1996 |
| EP | 1313109 A2 | | 5/2003 |
| EP | 1473741 A2 | | 11/2004 |
| FR | 2529374 A1 | | 12/1983 |
| JP | S57117204 A | | 7/1982 |
| JP | H0325994 A | | 2/1991 |
| JP | H05006801 U | | 1/1993 |
| JP | H06267707 A | | 9/1994 |
| JP | H07201529 A | | 8/1995 |
| JP | H11283802 A | | 10/1999 |
| JP | 2000269012 A | | 9/2000 |
| JP | 2001155902 A | | 6/2001 |
| JP | 2002050501 A | | 2/2002 |
| JP | 2002519672 A | | 7/2002 |
| JP | 2003197403 A | | 7/2003 |
| JP | 2004047603 A | | 2/2004 |
| JP | 2005181056 A | | 7/2005 |
| JP | 2006112868 A | | 4/2006 |
| JP | 2007221006 A | | 8/2007 |
| JP | 2007329421 A | | 12/2007 |
| JP | 2009141171 A | | 6/2009 |
| JP | 2009266977 | * | 11/2009 |
| JP | 2012-521099 A | | 9/2012 |
| JP | 2013-504213 A | | 7/2014 |
| JP | D1657430 S | | 4/2020 |
| JP | 2020-102626 A | | 1/2022 |
| KR | 20090085715 A | | 8/2009 |
| KR | 101398145 B1 | | 5/2014 |
| KR | 101603005 B1 | | 3/2016 |
| TW | D206856 S | | 9/2020 |
| WO | 0000833 A1 | | 1/2000 |
| WO | 2008039208 A1 | | 4/2008 |
| WO | 2015062682 A1 | | 5/2015 |
| WO | 2019097925 A1 | | 5/2019 |

OTHER PUBLICATIONS

International Search Report and Written Opinion received in international application No. PCT/US2021/031732, mailed Aug. 24, 2021 (15 pages).

MagLab, Manganin Shunt Resitor for High Precision Current Measurement, R100-BAR-03 Shunt Resistor, Rev. 006 (Jan. 2018), Available at: https://webarchive.org/web/2020*/https://www.maglab.ch/wp-content/uploads/2018/02/20180118_R100-BAR-03_rev006.pdf (Oct. 22, 2020).

Isabellenhutte, designed for high power, elextronica 2004, Munich, German (Nov. 9-12), 5 pages.

Bodo's Power System, IGBT Modules, May 2009, p. 39 (www.bodospower.com).

Bodo's Power System, News, Jul. 2009, p. 7 (www.bodospower.com).

Hendricks, Vishay, Fast Facts, "WSBS and WSBM Battery Shunt, Current Sense Resistors Wanted Poster and Presentation," (Jan. 2014).

(56) References Cited

OTHER PUBLICATIONS

Isabellenhutte, ISA-WELD.RTM.—SMD Prazisionswiderstande/ SMD precision resistors, Technical Data, Issue BVR—Jul. 11, 2005, 4 pages.

Isabellenhutte, ISA-WELD.RTM.—SMD Prazisionswiderstande/ SMD precision resistors, Technical Data, Issue BVR—Feb. 5, 2008, 4 pages.

Isabellenhutte, ISA-WELD.RTM.—SMD Prazisionswiderstande/ SMD precision resistors, Technical Data, Issue BVR—Feb. 17, 2009, 4 pages.

Isabellenhutte, ISA-PLAN.RTM.—Prazisionswiderstande/ precision resistors, Typ/type PMU, Issue: May 1999, 3 pages.

Isabellenhutte, ISA-WELD.RTM.—SMD Prazisionswiderstande/ SMD precision resistors, Technical Data, Issue BVB-2008-02-05, 4 pages.

Isabellenhutte, ISA-PLAN.RTM.—ISA-WELD.RTM.—technology: Precision and power resistors for highest requirements, the m.OMEGA.-concept, Issue May 2007, 6 pages.

Isabellenhutte, ISA-WELD.RTM. Precision and power resistors, Optimized shunts for energy metering market, Issue Oct. 2008, 2 pages.

Isabellenhutte, ISA-PLAN.RTM.—Prazisionswiderstande/ precision resistors, Typ/type BVR. Technical Data, Issue: Jan. 1, 2004, 3 pages.

Isabellenhutte, ISA-WELD.RTM. Precision and power resistors made of composite materials, SMD-Shunts for high current applications, Issue May 2005, 2 pages.

Power Electronics Europe, Inverter Design "Shunt Current Measuring up to 800A in the inverter," Issue 7 2009, 4 pages.

Isabellenhutte Resistors Selection Guide, Issue Apr. 2009, 10 pages.

Isabellenhutte, ISA-PLAN.RTM.—SMD Prazisionswiderstande/ SMD precision resistors, Technical Data, Issue PMU-2009-05-08, 4 pages.

Isabellenhutte, ISA-PLAN.RTM.—SMD precision resistors, Technical Data, Issue PMB-2005-12-12, 4 pages.

Isabellenhutte, ISA-WELD.RTM.—SMD Prazisionswiderstande/ SMD precision resistors, Technical Data, Issue BVO-2008-10-22, 4 pages.

Isabellenhutte, ISA-WELD® // Precision resistors, BVB Size 2725, Issue 19, (Sep. 2014).

Isabellenhutte, ISA-WELD® // Precision resistors, BVN 1216, Issue 30, (Sep. 2015).

Isabellenhutte, ISA-WELD® // Precision resistors, BVZ // Size 4026, Issue 22, (Aug. 2018).

International Preliminary Report on Patentability received in international application No. PCT/US2021/031732, mailed Feb. 16, 2023 (14 pages).

Steve Bush, "800A Resistor Gets Tapped Holes for Mounting and Connections" Oct. 24, 2017.

"Bourns Model CSM2F-8518 Series Current Sense Resistor w/ Tinned Terminals" Jul. 23, 2018.

"Vishay Power Metal Strip Shunt Resistor" Apr. 11, 2017.

* cited by examiner

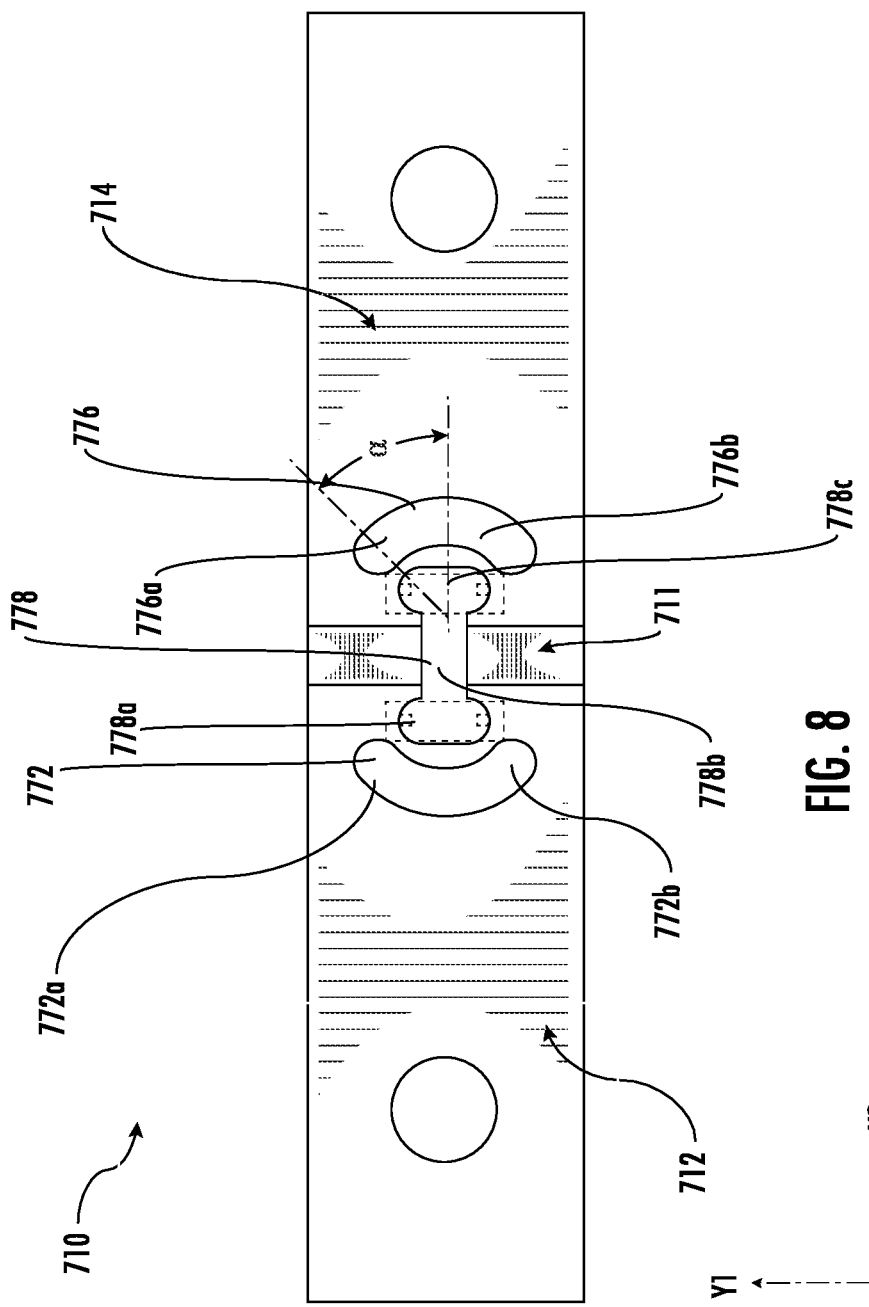
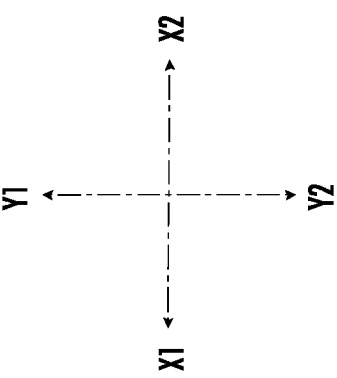
FIG. 8

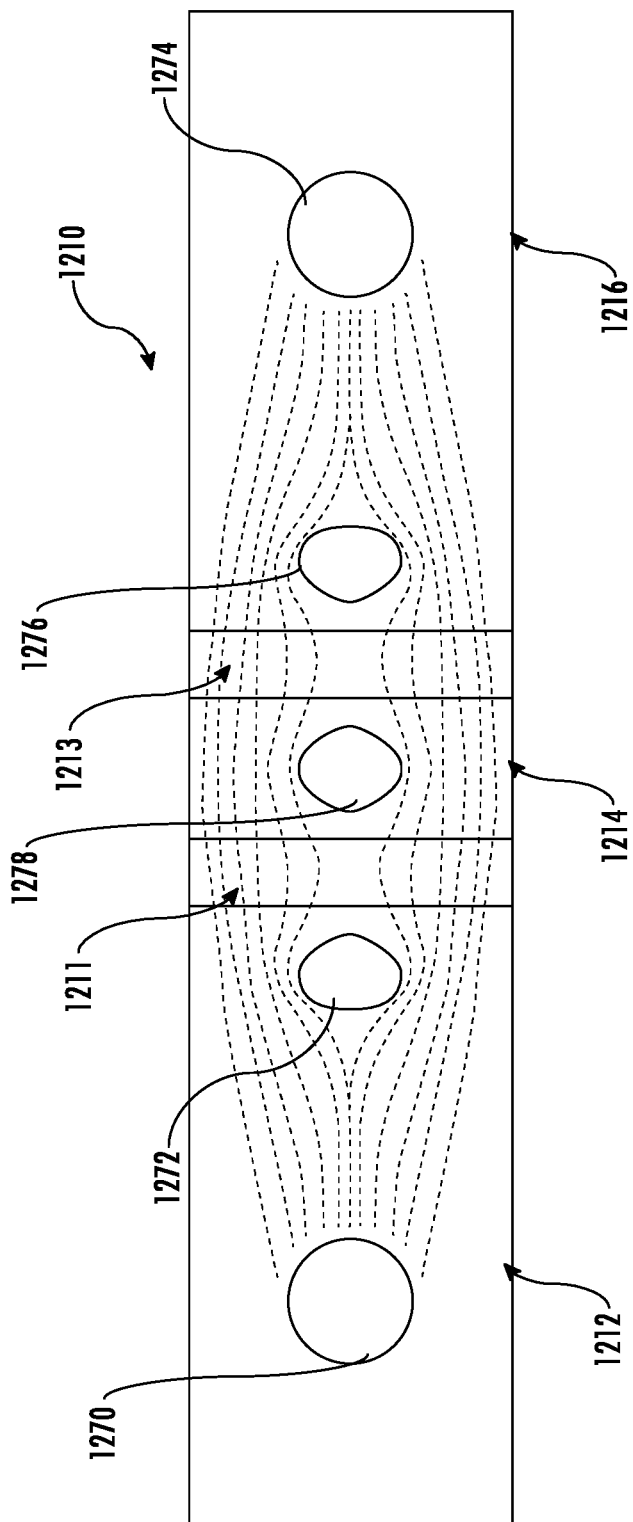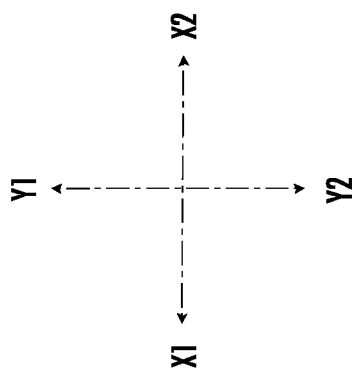
FIG. 12

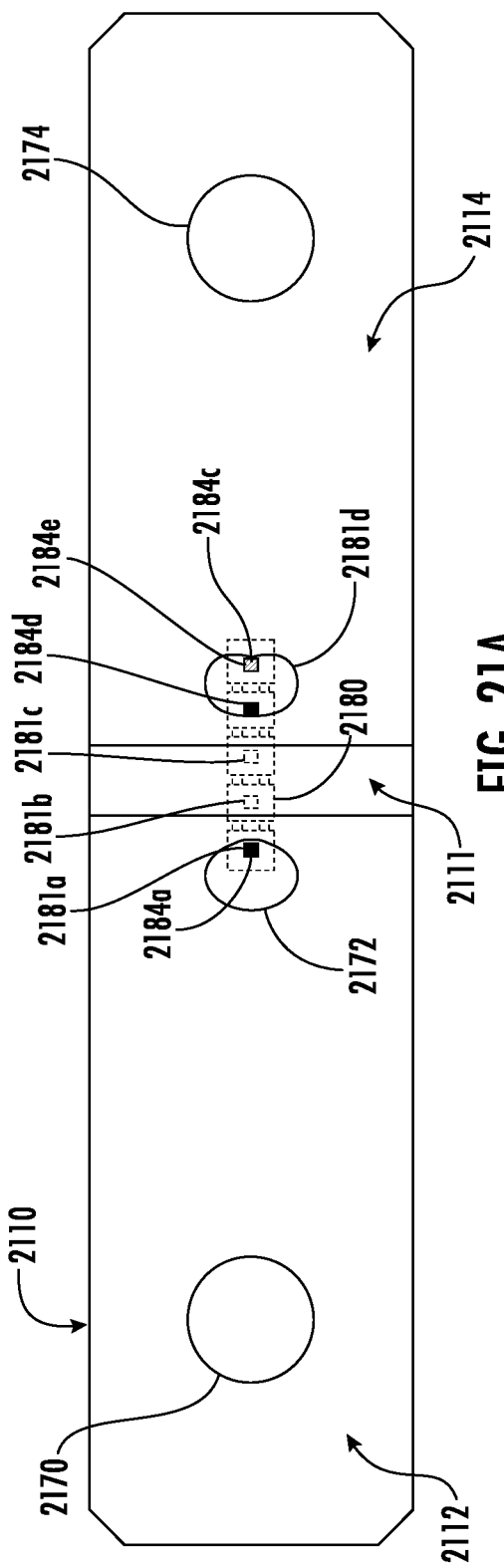
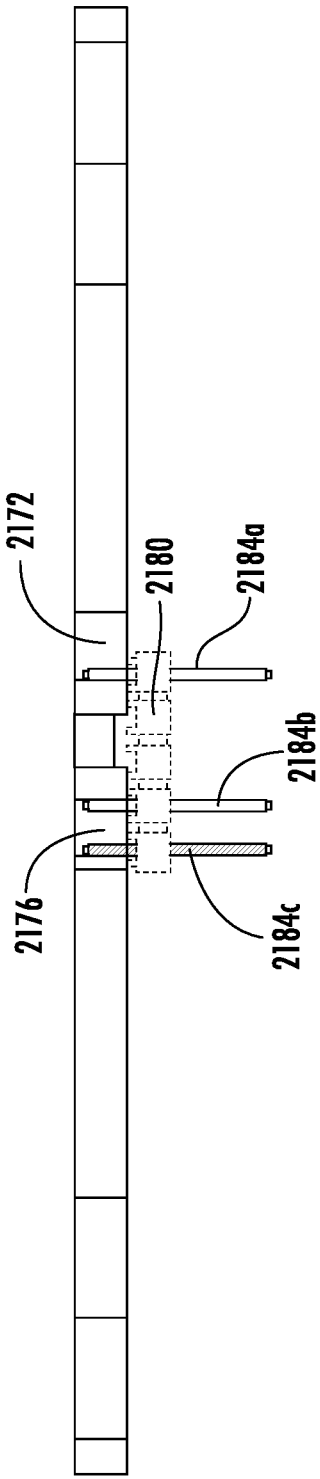
FIG. 21A
FIG. 21B

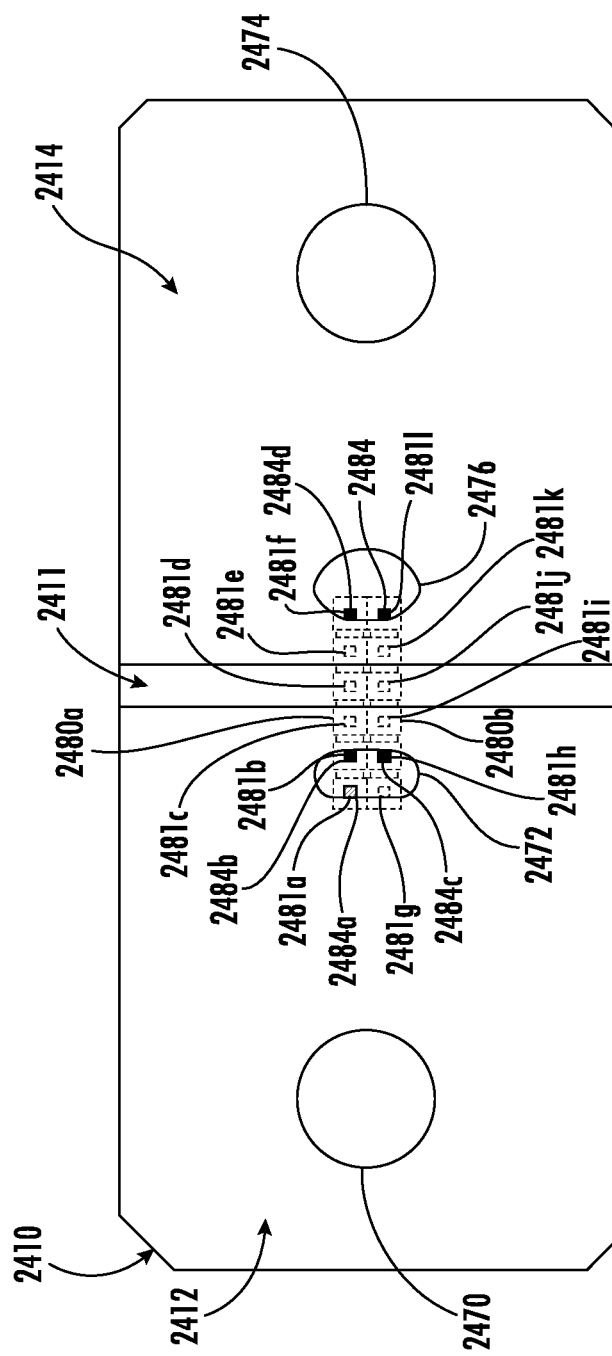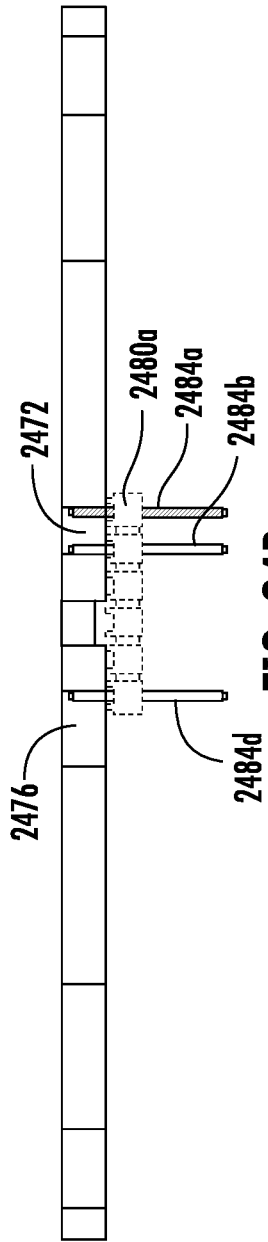
FIG. 24A
FIG. 24B

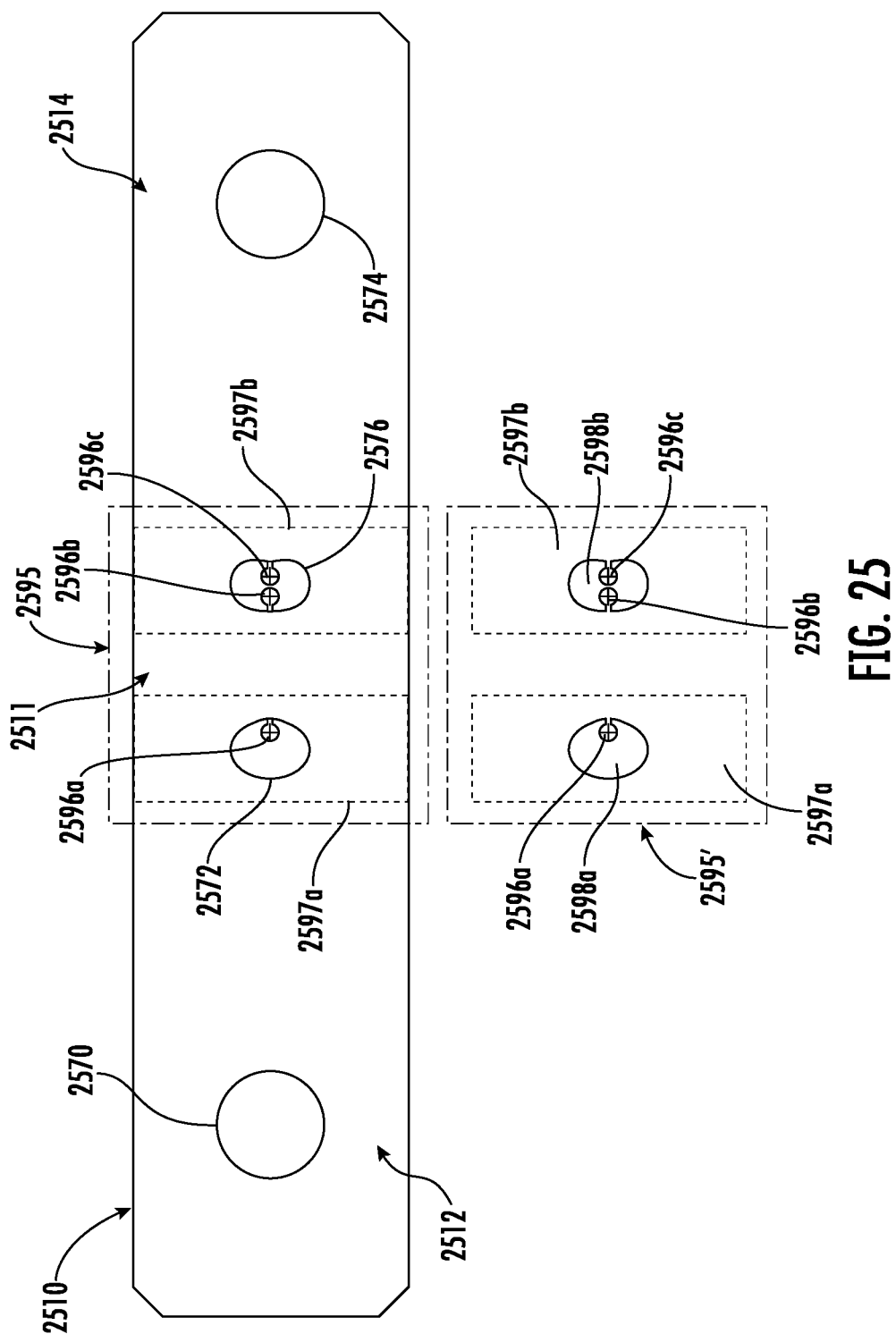

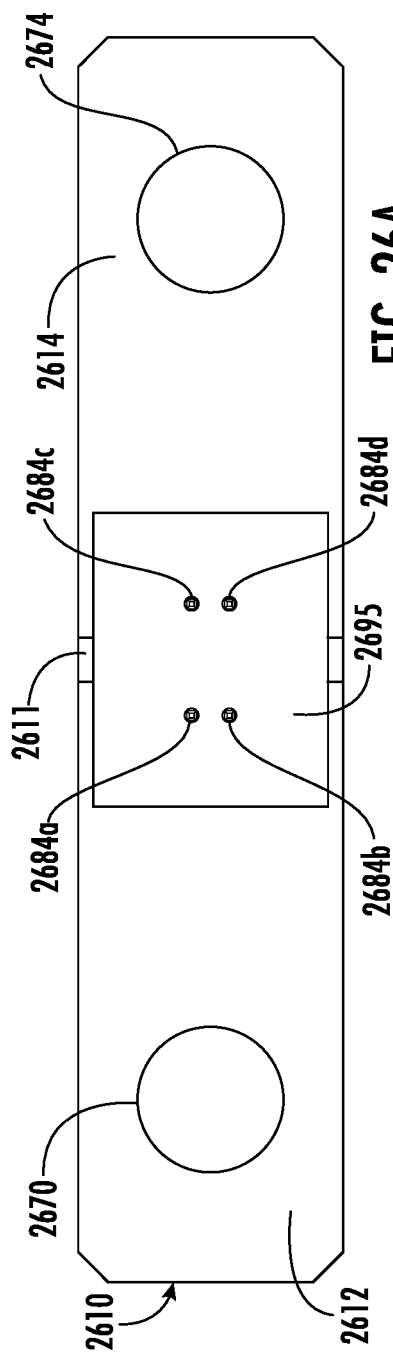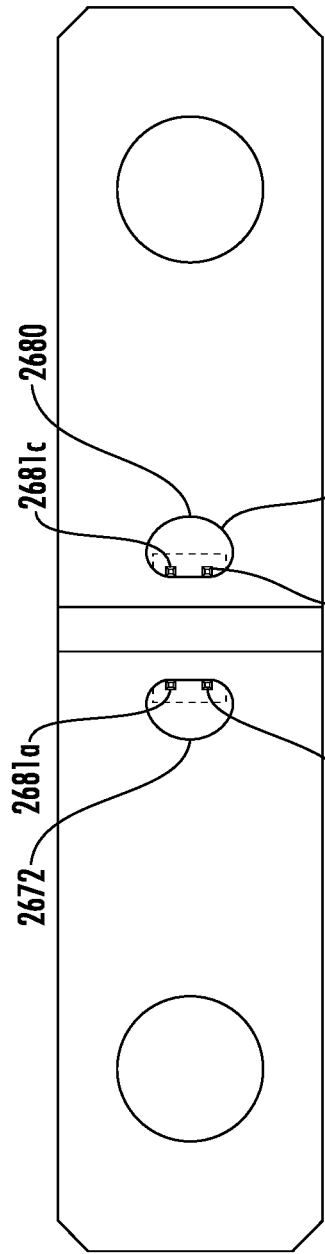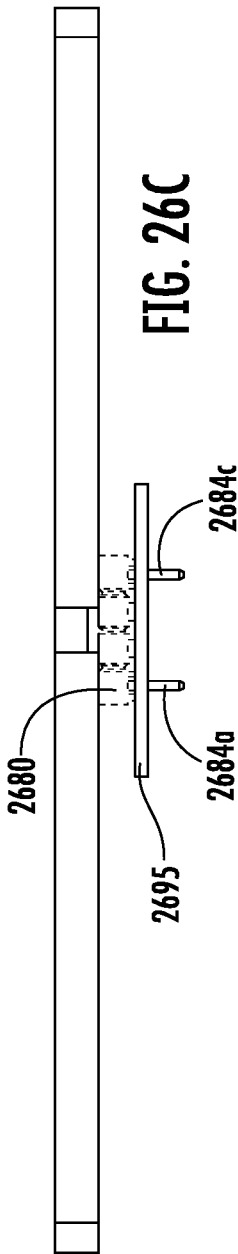

RESISTORS, CURRENT SENSE RESISTORS, BATTERY SHUNTS, SHUNT RESISTORS, AND METHODS OF MAKING

CROSS REFERENCE TO RELATED APPLICATION(S)

This application is a continuation of U.S. patent application Ser. No. 17/317,233, filed May 11, 2021, which claims the benefit of U.S. Provisional Patent Application 63/068,243, filed Aug. 20, 2020, the entire contents of all of which are incorporated by reference as if fully set forth herein.

FIELD OF THE INVENTION

The present invention relates to resistors, current sense resistors, battery shunts, and shunt resistors, having various arrangements of conductive portions and resistive elements.

BACKGROUND

Current sense resistors and/or shunt resistors and/or battery shunts, as they may be referred to by those of skill in the art, are known types of resistors used widely, for example, in the automotive field. These types of resistors may be used, for example and by way of illustration, to measure electric current. Their construction typically includes a flat strip of a resistive material that is coupled between high conductivity metal terminals forming the main terminals of the device.

Redundancy of systems to maintain safe operation if the primary system fails is a requirement in automotive applications. Full electric car application requirements now involve systems that use multiple traditional single element battery shunts adding to space requirements and increased cost.

Various systems utilize different methods for temperature compensation, such as added temperature sensing components and programming to compensate for the shape of the resistance vs. temperature plot which add overall expense to designs.

What is needed is an improved configuration and method of making a current sense resistor or battery shunt.

There is further a need for an improved resistor with the ability to easily, accurately, and efficiently, adjust the temperature coefficient of resistance (TCR) of the resistor.

There is further a need for the ability to sense current in battery management circuits that allows for users to connect redundant systems to the same circuit with different control or sensing units creating increased safety due to the redundancy.

SUMMARY

Various resistors and methods of manufacturing resistors are provided.

The various designs of the invention provide for an expansion and improvement of the features to improve the resistance change with temperature such as those contained in U.S. Pat. No. 8,878,643, the entire contents of which are incorporated herein by reference, and include additional ways of isolating the voltage sense points that can then be used for mounting pins inside of those features via connectors such as headers that can then be used for external connection to the sense points. This also simplifies the manufacturing process. This sense point mounting inside of the isolation feature further enhances the voltage sense isolation by concentrating the contact area inside of the thickness of the part as opposed to just on one surface.

In an aspect of the invention, the resistor comprises a first conductive portion, a first resistive element, a second conductive portion, and second resistive element, and a third conductive portion. In this aspect, the resistor may be referred to or considered a dual resistive element shunt.

The first conductive portion has a first or outer side and a second or inner side. The first resistive element has a first or outer side and a second or inner side. The second conductive portion has a first side and a second side. The second resistive element has a first or outer side and a second or inner side. The third conductive portion has a first or outer side and a second or inner side. The first conductive portion is attached at the second or inner side to the first or outer side of the first resistive element. The first conductive portion and the first resistive element may be connected, joined, bonded, or attached by various means such as welding, bonding, adhesives, or other known attachment means for bonding conductive materials and resistive materials.

The first resistive element is attached at the second or inner side to the first side of the second conductive portion. The first resistive element and the second conductive portion may be connected, joined, bonded, or attached by various means.

The second conductive portion is attached at the second side to the second or inner side of the second resistive element. The second conductive portion and the second resistive element may be connected, joined, bonded, or attached by various means.

The second resistive element is attached at the first or outer side to the second or inner side of the third conductive portion. The second resistive element and the third conductive portion may be connected, joined, bonded, or attached by various means.

In an aspect of the invention, the resistor comprises a first conductive portion, a first resistive element, and a second conductive portion. In this aspect, the resistor may be referred to or considered a redundant sense shunt, or a redundant current sense shunt.

Additional sense contact points to create a ground reference point connection for dual low or high side ground system requirements can easily be added to these headers if required by the final application.

The "openings" described herein may also be considered or referred to as "slots" or "holes." The term "slots" may be used to refer to a type of opening that has an elongated profile in at least one direction or dimension. In some aspects, the term opening is used generically to refer to a slot or hole.

The "conductive portions" described herein may also be considered or referred to as "terminals" or "conductive terminals."

The openings (slots or holes) in the conductive portions configured to adjust, change, impact, effect, or modify the TCR value of the resistor may be considered "TCR adjustment slots," or "TCR compensation openings," or "TCR slots." These may also be referred to as "boots" or "features."

Also shown and described are various header pins, as are known in the art. These may be referred to as "connectors," "brackets," or "frames," and provide support for the conductive pins that will electrically connect the resistor to other electrical parts, components, equipment or devices.

According to various aspects of the invention, the TCR compensation openings can also be adjusted or changed in shape and size to enhance, adjust, modify, or change the temperature coefficient of resistance (TCR) in different designs and values as needed for a selected use. Such adjustments can be done in a very precise manner resulting in very low TCR values limiting the need for extra devices and programming to track the TCR plot of a given product design.

In aspects described herein, the resistors may include a plurality of resistive elements and provide for various TCR adjustment openings, slots or areas, as well as various connection points for voltage sensing, which provide what can be referred to as a redundant configuration or redundancy.

The above summaries are not intended to represent every embodiment or every aspect of the present disclosure. Rather, the foregoing summaries merely provides an exemplification of some of the aspects and features set forth herein. The above features, as well as other features of the present disclosure, will be apparent from the following detailed description of representative embodiments and modes for carrying out the disclosure when taken in connection with the accompanying drawings and appended claims. Moreover, this disclosure expressly includes any and all combinations and subcombinations of the elements and features presented herein.

BRIEF DESCRIPTION OF THE DRAWINGS

FIG. 8 illustrates a front view of a resistor according to an aspect of the invention.

FIG. 12 illustrates a flux path of a resistor according to one aspect of the invention.

FIG. 21A illustrates a front view of another embodiment of a resistor according to an aspect of the invention.

FIG. 21B illustrates a cross sectional view from a side edge of the resistor of FIG. 21A.

FIG. 24A illustrates a front view of another embodiment of a resistor according to an aspect of the invention.

FIG. 24B illustrates a cross sectional view from a side edge of the resistor of FIG. 24A.

FIG. 25 illustrates a front view of a resistor with a printed circuit board in two different states.

FIG. 26A illustrates a front view of a resistor with a printed circuit board configured to engage pins.

FIG. 26B illustrates a rear view of the resistor of FIG. 26A.

FIG. 26C illustrates a view from a side edge of the resistor of FIGS. 26A and 26B.

DETAILED DESCRIPTION OF THE PREFERRED EMBODIMENTS

Figure 1:
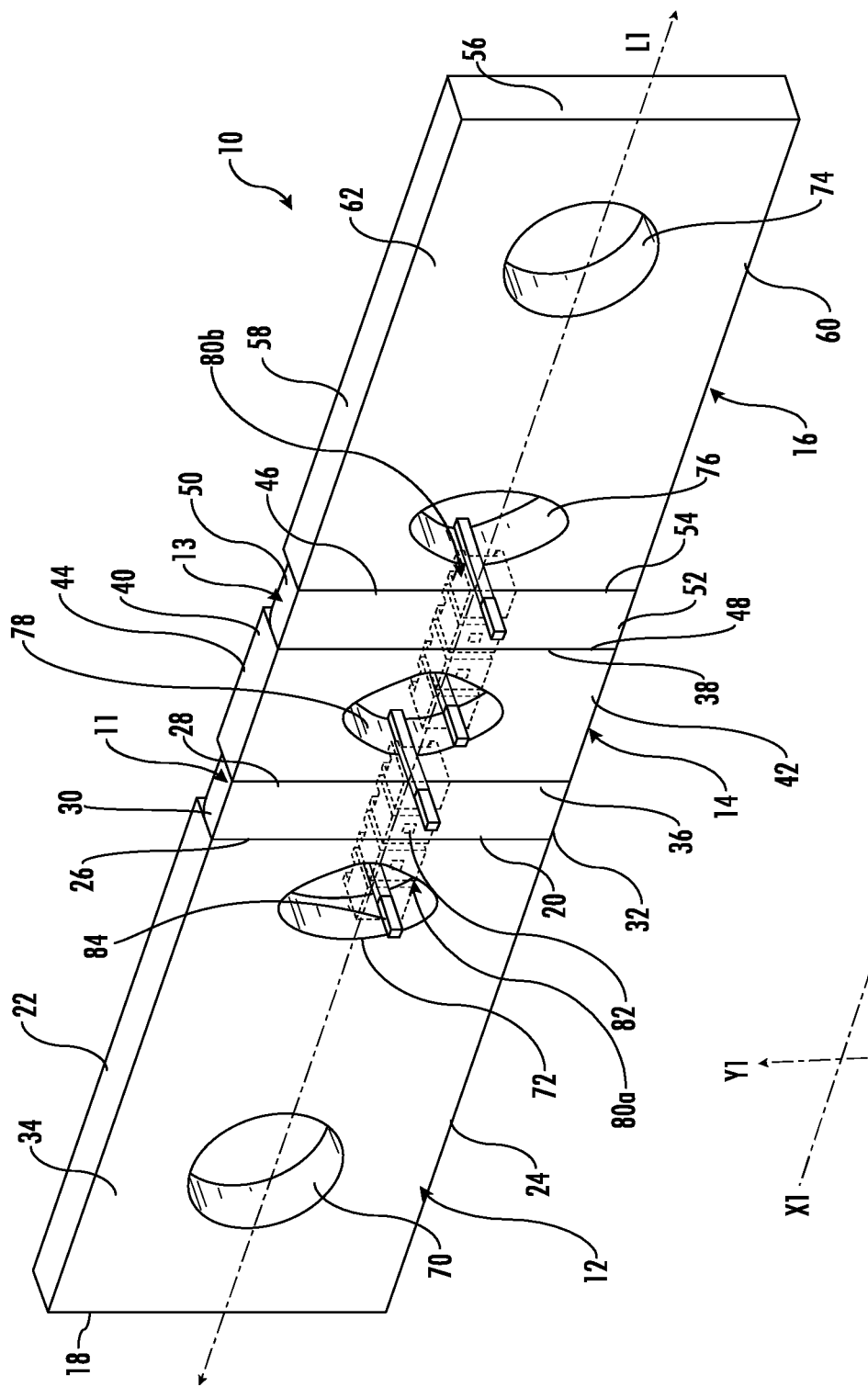
FIG. 1 illustrates is a perspective view of a resistor according to an aspect of the invention.

FIG. 1 shows a resistor 10 generally formed of a first resistive element 11 disposed between a first conductive portion 12 and a second conductive portion 14, and a second resistive element 13 disposed between the second conductive portion 14 and a third conductive portion 16.

As oriented in the depiction of FIG. 1, the first conductive portion 12 has a first or outer side 18 facing in a first direction X1, and a second or inner side 20 facing in a second direction X2 which is a direction opposite the first direction X1, a third side 22 facing in a direction Y1, and a fourth side 24 facing in a direction Y2 which is a direction opposite the direction Y1. One of ordinary skill in the art would understand that the exact orientation of the resistor 10 may vary. The first conductive portion 12 may be formed generally as a plate or a strip or a bar. The first conductive portion 12 may be formed of a conductive metal. In an embodiment, the first conductive portion 12 is formed from copper (Cu) or a Cu alloy. Other conductive materials that may be used to form the first conductive portion 12 are, either alone or in combination, tin (Sn), aluminum (Al), silver (Ag), or gold (Au), with the alloy being plated or not plated with layers of nickel (Ni), Sn, or other similar materials.

The first resistive element 11 has a first or outer side 26 facing in the first direction X1, and a second or inner side 28 facing in the second direction X2, a third side 30 facing in the direction Y1, and a fourth side 32 facing in the direction Y2. The first resistive element 11 may be formed generally as a plate or a strip or a bar. The first resistive element 11 may be formed of a resistive material, or combinations of materials including resistive materials. In an embodiment, the first resistive element 11 is formed from or comprises alloys of copper-nickel-manganese (CuNiMn), copper manganese tin (CuMnSn), copper nickel (CuNi), nickel-chromium-aluminum (NiCrAl), or nickel-chromium (NiCr), or other alloys known to those of skill in the art acceptable for use as a resistive element as part of a shunt resistor. Other resistive materials that may be used to form the first resistive element 11 are, either alone or in combination, Cu, Ni, Mn, Cr, Al, and iron (Fe).

The first conductive portion 12 is attached at the second or inner side 20 to the first or outer side 26 of the first resistive element 11. The first conductive portion 12 and the first resistive element 11 may be attached, connected, joined, bonded, or attached by various means such as welding, bonding, adhesives, ultrasonic bonding, soldering, brazing, or other methods that provide a low resistive connection, or any other acceptable connection means providing for electrical and/or thermal communication. The first conductive portion 12 is generally located at a first side 34 or first portion of the resistor 10.

As oriented in the depiction of FIG. 1, the second conductive portion 14 has a first side 36 facing in the first direction X1, and a second side 38 facing in the second direction X2, a third side 40 facing in the direction Y1, and a fourth side 42 facing in the direction Y2. The second conductive portion 14 may be formed generally as a plate or a strip or a bar. The second conductive portion 14 may be formed of a conductive metal. In an embodiment, the second conductive portion 14 is formed from copper (Cu) or a Cu alloy. Other conductive materials that may be used to form the second conductive portion 14 are, either alone or in combination, Sn, Al, Ag, or Au, with the alloy being plated or not plated with layers of Ni, Sn, or other similar materials. The second conductive portion 14 is generally located or positioned adjacent at a central location 44 or midpoint of the resistor 10.

The second conductive portion 14 is attached at the first side 36 to the second or inner side 28 of the first resistive element 11. Accordingly, the first conductive portion 12 and the second conductive portion 14 are oriented on opposite sides of the first resistive element 11. The second conductive portion 14 and the first resistive element 11 may be connected, joined, bonded, or attached by various means such as welding, bonding, adhesives, ultrasonic bonding, soldering, brazing, or other methods that provide a low resistive connection, or any other acceptable connection means providing for electrical and/or thermal communication.

The second resistive element 13 has a first or outer side 46 facing in the second direction X2, and a second or inner side 48 facing in the first direction X1, a third side 50 facing in the direction Y1, and a fourth side 52 facing in the direction Y2. The second resistive element 13 may be formed generally as a plate or a strip or a bar. The second resistive element 13 may be formed of a resistive material, or combinations of materials including resistive materials. In an embodiment, the second resistive element 13 is formed from or comprises alloys of copper-nickel-manganese (CuNiMn), copper manganese tin (CuMnSn), copper nickel (CuNi), nickel-chromium-aluminum (NiCrAl), or nickel-chromium (NiCr), or other alloys known to those of skill in the art acceptable for use as a resistive element as part of a shunt resistor. Other resistive materials that may be used to form the second resistive element 13 are, either alone or in combination, Cu, Ni, Mn, Cr, Al, and Fe.

The first resistive element 11 and the second resistive element 13 may have the same resistance value, or different resistance values. It is appreciated that the resistance values of the first resistive element 11 or the second resistive element 13 may be selectively adjusted based on need or function, such as by trimming, as is known in the relevant art.

The second conductive portion 14 is attached at the second or inner side 38 to the second or inner side 48 of the second resistive element 13. The second conductive portion 14 and the second resistive element 13 may be attached, connected, joined, bonded, or attached by various means such as welding, bonding, adhesives, ultrasonic bonding, soldering, brazing, or other methods that provide a low resistive connection, or any other acceptable connection means providing for electrical and/or thermal communication.

In the arrangement as shown in FIG. 1, the first resistive element 11 and second resistive element 13 are positioned on opposite sides of the second conductive portion 14.

As oriented in the depiction of FIG. 1, the third conductive portion 16 has an inner or second side 54 facing in the first direction X1, and a first or outer side 56 facing in the second direction X2, a third side 58 facing in the direction Y1, and a fourth side 60 facing in the direction Y2. The third conductive portion 16 may be formed generally as a plate or a strip or a bar. The third conductive portion 16 may be formed of a conductive metal. In an embodiment, the third conductive portion 16 is formed from copper (Cu) or a Cu alloy. Other conductive materials that may be used to form the third conductive portion 16 are, either alone or in combination, Sn, Al, Ag, or Au, with the alloy being plated or not plated with layers of Ni, Sn, or other similar materials. The second conductive portion 14 is generally located or positioned adjacent at a second side 62 or second portion of the resistor 10.

The third conductive portion 16 is attached at the second or inner side 54 to the first or outer side 46 of the second resistive element 13. The third conductive portion 16 and the second resistive element 13 may be attached, connected, joined, bonded, or attached by various means such as welding, bonding, adhesives, ultrasonic bonding, soldering, brazing, or other methods that provide a low resistive connection, or any other acceptable connection means providing for electrical and/or thermal communication.

In the arrangement as shown in FIG. 1, the second conductive portion 14 and the third conductive portion 16 are positioned on opposite sides of the second resistive element 13.

Although the conductive portions 12, 16 are illustrated as being a similar size and shape, the conductive portions 12, 16 can be different in one aspect of the invention. For example, the size and shape of the conductive portions 12, 16, as well as the material forming the conductive portions 12, 16 can vary. The conductive portions 12, 16 are illustrated with four sides, but the number of sides for the conductive portions 12, 16 can vary. These variations can be realized in any one or more of the other embodiments described herein.

Similarly, although the resistive elements 11, 13 are illustrated as being a similar size and shape, the resistive elements 11, 13 can be different in size, shape, or the materials comprising the resistive elements. For example, the size, dimension and/or shape of the resistive elements 11, 13, as well as the material forming the resistive elements 11, 13 can vary. The resistive elements 11, 13 are illustrated with four sides, but the number of sides for the resistive elements 11, 13 can vary. These variations can be realized in any one or more of the other embodiments described herein.

In an aspect of the invention, the first conductive portion 12 may have a first opening 70 adjacent the first or outer side 18 of the first conductive portion 12. The first opening 70 may comprise a hole completely through a portion of the first conductive portion 12 and may be generally circular in shape. The first opening 70 is positioned closer to the first side 18 of the first conductive portion 12. The first opening 70 may function as a current connection hole or area. The current connection opening 70 is only one example of how a resistor may be attached to a current that is to be monitored and/or measured. Such openings may be omitted entirely.

A second opening 72 is formed adjacent the second or inner side 20 of the first conductive portion 12. The second opening 72 may comprise a hole completely through a portion of the first conductive portion 12 and be generally oblong in shape, such as a curved oblong shape. The second opening 72 is positioned closer to the second side 20. The second opening 72 functions as a TCR adjustment opening, which may also be referred to as a TCR compensation slot, as described in greater detail herein.

In an aspect of the invention, the third conductive portion 16 has a first opening 74 adjacent the first or outer side 56 of the third conductive portion 16. The first opening 74 may comprise a hole completely through a portion of the third conductive portion 16 and may be generally circular in shape. The first opening 74 is positioned closer to the first side 56 of the third conductive portion 16. The first opening 74 may function as a current connection hole or area. The current connection opening 74 is only one example of how a resistor may be attached to a current that is to be monitored and/or measured. Such openings may be omitted entirely.

The third conductive portion 16 includes a second opening 76 adjacent the second or inner side 54 of the third conductive portion 16. The second opening 76 may comprise a hole completely through a portion of the third conductive portion 16 and be generally oblong in shape, such as a curved oblong shape. The second opening 76 is positioned closer to the second side 54. The second opening 76 functions as a TCR adjustment opening, which may also be referred to as a TCR compensation slot, as described in greater detail herein.

In an aspect of the invention, the second conductive portion 14 includes a central opening 78 that may be generally centrally located through the second conductive portion 14. The central opening 78 is generally oblong in shape, or may have a varied shape as further described herein. The central opening 78 functions as a TCR adjustment opening, which may also be referred to as a TCR compensation slot, as described in greater detail herein.

In an aspect of the invention, the first opening 70 of the first conductive portion 12 and the first opening 74 of the third conductive portion 16 have generally the same shape. In an aspect of the invention, the second opening 72 of the first conductive portion 12 and the second opening 76 of the third conductive portion 16 have the generally the same shape. In an aspect of the invention, the first conductive portion and the third conductive portions are mirrors of each other.

All of the openings (i.e. openings 70, 72, 74, 76, and 78) of the resistor 10 may be aligned along a longitudinal axis L1 of the resistor 10. Alternatively, in different embodiments, certain openings can be offset from each other.

As shown in FIG. 1, the openings 70, 72, 74, 76, and 78 are all arranged in, located within, or disposed in, an interior area of the resistor. As used herein, the term interior area with respect to the disclosed resistors means an area located away from the perimeter or outer edges of the resistor, or the perimeter outer edges of any components of the resistor, such as the resistive elements or conductive portions. The openings 70, 72, 74, 76, and 78 are therefore each preferably spaced away from outer edges, such as the lateral and longitudinal edges, or other portions of the perimeter or edges of the resistor 10. Preferably, no portion of the openings 70, 72, 74, 76, and 78 intersect, contact or cross the outer edges, such as the lateral and longitudinal edges, or the perimeter of the resistor 10. In this way, the openings 70, 72, 74, 76, and 78 are surrounded on all sides by parts of the conductive portions, the resistive elements, or combinations of those.

Openings 70, 74 are illustrated as generally being circular in FIG. 1. However, a profile of the openings 70, 74 may vary in different aspects of the invention. The term profile is used herein to refer to the overall outline, size, shape, cross-section, orientation, or other physical characteristic. The openings 70, 74 may be identical or different from each other. In one aspect, at least one of the openings 70, 74 has an elongated, slotted, or non-circular profile. The orientation of the elongated or slotted profile of the openings 70, 74 may extend in the X-direction. In another aspect, the orientation of the elongated or slotted profile of the openings 70, 74 may extend in the Y-direction. The openings 70, 74 may not extend completely through the resistor in another aspect. In certain aspects, one or more of the openings 70, 74 may be omitted completed. These variations can be realized in any one or more of the other embodiments described herein.

All aspects of the openings 72, 76, 78 may also vary. For example, the openings 72, 76, 78 may each have a different profile, dimension, size, or shape. These may be adjusted or changed based on need or function. The openings 72, 76, 78 may include one or more through openings and one or more openings that do not extend completely through the conductive portions and/or the resistive elements. The openings 72, 76, 78 may be circular, elongated, slotted, non-circular, S-shaped, N-shaped, serpentine, or any other shape as may be selected. The orientation or direction in which any of the slotted or elongated openings 72, 76, 78 extend may vary, having differences in height, length, width, etc. In certain aspects, one or more of the openings 72, 76, 78 may be omitted. These variations can be realized in any one or more of the other embodiments described herein.

The openings in the conductive portions closest to the resistive elements (e.g., the TCR adjustment openings) create or define parts of the conductive portions that function as voltage sense terminal areas adjacent to the TCR adjustment openings. These areas may be connected to voltage sense pins, as further described herein. Such voltage sense terminal areas are smaller in size than the areas of the conductive portions that define the main current terminals.

At least one bracket or header assembly 80a, 80b can be provided in one aspect, as shown in FIG. 1, which may be a header pin holding assembly as known in the art, and may be referred to as "brackets" or "header assemblies." Brackets or header assemblies 80a, 80b, 180, 2180, 2280, 2380a, 2380b, 2480a, 2480b are illustrated in phantom lines in some of the Figures for illustrative purposes only. Additional Figures, such as at least FIGS. 3, 4, 5, 6, 8, 9, 13A-13E, 17A-17M, 18, 19, 20 show aspects of brackets or header assemblies which are not specifically annotated or further described herein. One skilled in the art would understand that the brackets or header assemblies of any one of the Figures disclosed herein can be implemented and adapted to be used in any other one of the Figures.

The at least one bracket or header assembly 80a, 80b comprises a brace 82 and pins 84. In one aspect, the pins 84 are configured as mounting pins. As shown in FIG. 1, a first bracket or header assembly 80a and a second bracket or header assembly 80*b* can be provided. Two braces and four mounting pins 84 can be provided in one embodiment. In one aspect, one or more of the pins 84 can be sensing pins or ground pins. The bracket or header assemblies 80*a*, 80*b* are configured to attach and electrically connect the resistor 10 to another component.

In FIG. 1, the openings 70 and 74 are current attachment points. Pins of the bracket or header assembly 80*a* create a pair of voltage sense connections for first resistive element 11, and the pins in the bracket or header assembly 80*b* create a pair of voltage sense connections for the second resistive element 13.

A resistor is therefore provided, in an aspect of the invention, with two distinct resistive elements which can match or not match in resistance value, and that in turn provide multiple independent voltage sense points for each of the elements in a manner represented but may also be configured in other formats for connection or arrangement or quantity of elements and/or pins. Aspects of the present invention also incorporate alternate methods of creating, and different arrangements of, slots, opening or holes in the conductive or terminal portions, to provide TCR compensation values and adjustments that expand or improve upon the methods shown and described in U.S. Pat. No. 8,878, 643, the entire contents of which is incorporated by reference herein. The TCR compensation is achieved by directing the current around the sense points, causing a shadowing effect. Having the sense points in a low current density portion of the device allows for the control of the contribution that the conductive terminal material has on the TCR value of the resistor. The manner in which this feature is created allows for the positioning and attachment to, for example, mounting pins, in a way that allows for connection of the resistor to a surface created in a selected TCR opening or slot, allowing the connection to be placed in a more precise and controlled location. This isolation feature may or may not be incorporated depending on the specific requirements of the application, particularly for controlling, adjusting, or monitoring temperature coefficient of resistance.

The TCR improvement is achieved in the following manner. The TCR of copper is 3900 PPM/° C. while the resistive strip 11 may be 100 PPM/° C. The size, shape and distance of the TCR adjustment openings 72, 76, 78 with respect to the resistive elements 11, 13 can be adjusted in length in the "Y" directions (e.g., transversely) and with respect to the "X" directions (e.g., longitudinally) by a distance of the pins 84 of header with respect to the resistive elements 11, 13. The adjustment of the "Y" dimension can be used to adjust the amount of isolation that the pins associated with the bracket or header assembly 80 experience which then changes the contribution to the TCR of the copper portions or strips and resistive elements. This adjustment to this contribution directly affects the TCR of the resistor seen (e.g., measured) in the voltage sensed at the pins of the bracket or header assembly 80. This is true of any combination of voltage sense points, resistive strip and isolation holes on a resistor. The relationship of these features allows for the tuning of the TCR values with precision, and in an efficient manner.

FIG. 12 illustrates the current flux of a resistor 1210 including a first conductive portion 1212, a second conductive portion 1214, a third conductive portion 1216, a first resistive element 1211, and a second resistive element 1213. The current flux is directed towards edges of the resistor 1210 and away from the sense points. The current flow in the X-axis is minimal between openings 1272, 1276, and 1278.

As shown in FIG. 12, the openings 1270, 1272, 1274, 1276, 1278 are all arranged in an interior area of the resistor 1210. The openings 1270, 1272, 1274, 1276, 1278 are therefore each preferably spaced away from outer edges, such as the lateral and longitudinal edges, or the perimeter of the resistor 1210. No portion of the openings 1270, 1272, 1274, 1276, 1278 intersect, contact or cross the outer edges, such as the lateral and longitudinal edges, or the perimeter of the resistor 1210. In this way, the openings 270, 1272, 1274, 1276, 1278 are surrounded on all sides by parts of the conductive portions, the resistive elements, or combinations of those.

Figure 2:
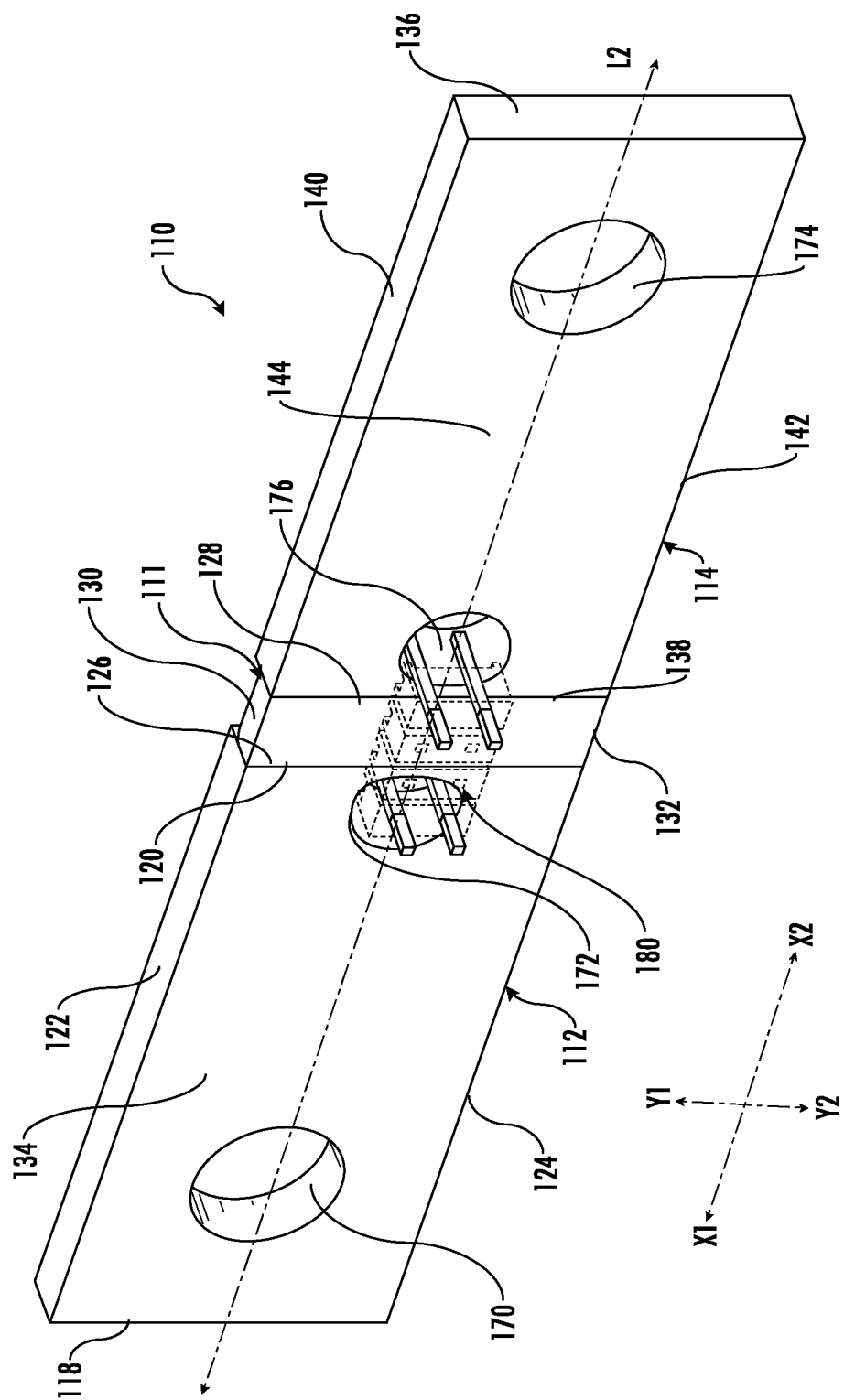
FIG. 2 illustrates a perspective view of a resistor according to an aspect of the invention.

In another aspect of the invention, shown in FIG. 2, a resistor 110 is provided. The resistor 110 is generally formed of a resistive element 111 disposed between a first conductive portion 112 and a second conductive portion 114.

As oriented in the depiction of FIG. 2, the first conductive portion 112 has a first or outer side 118 facing in a first direction X1, and a second or inner side 120 facing in a second direction X2 which is a direction opposite the first direction X1, a third side 122 facing in a direction Y1, and a fourth side 124 facing in a direction Y2 which is a direction opposite the direction Y1. The first conductive portion 112 may be formed generally as a plate or a strip or a bar. The first conductive portion 112 may be formed of a conductive metal. In an embodiment, the first conductive portion 112 is formed from copper (Cu) or a Cu alloy. Other conductive materials that may be used to form the first conductive portion 112 are, either alone or in combination, tin (Sn), aluminum (Al), silver (Ag), or gold (Au), with the alloy being plated or not plated with layers of nickel (Ni), Sn, or other similar materials.

The resistive element 111 has a first side 126 facing in the first direction X1, and a second side 128 facing in the second direction X2, a third side 130 facing in the direction Y1, and a fourth side 132 facing in the direction Y2. The resistive element 111 may be formed generally as a plate or a strip or a bar. The resistive element 111 may be formed of a resistive material, or combinations of materials including resistive materials. In an embodiment, the resistive element 111 is formed from or comprises alloys of copper-nickel-manganese (CuNiMn), copper manganese tin (CuMnSn), copper nickel (CuNi), nickel-chromium-aluminum (NiCrAl), or nickel-chromium (NiCr), or other alloys known to those of skill in the art acceptable for use as a resistive element as part of a shunt resistor. Other resistive materials that may be used to form the resistive element 111 are, either alone or in combination, Cu, Ni, Mn, Cr, Al, and Fe.

The first conductive portion 112 is attached at the second or inner side 120 to the first or outer side 126 of the resistive element 111. The first conductive portion 112 and the resistive element 111 may be attached, connected, joined, bonded, or attached by various means such as welding, bonding, adhesives, ultrasonic bonding, soldering, brazing, or other methods that provide a low resistive connection, or any other acceptable connection means providing for electrical and/or thermal communication. The first conductive portion 112 is generally located at a first side 134 or first portion of the resistor 110.

As oriented in the depiction of FIG. 2, the second conductive portion 114 has a first side 136 facing in the second direction X2, and a second side 138 facing in the first direction X1, a third side 140 facing in the direction Y1, and a fourth side 142 facing in the direction Y2. The second conductive portion 114 may be formed generally as a plate or a strip or a bar. The second conductive portion 114 may be formed of a conductive metal. In an embodiment, the second conductive portion 114 is formed from copper (Cu) or a Cu alloy. Other conductive materials that may be used to form the second conductive portion 114 are, either alone or in combination, tin (Sn), aluminum (Al), silver (Ag), or gold (Au), with the alloy being plated or not plated with layers of nickel (Ni), Sn, or other similar materials. The second conductive portion 114 is generally located or positioned adjacent a second side 144 or second portion of the resistor 110.

The second conductive portion 114 is attached at the second side 138 to the second side 128 of the resistive element 111. Accordingly, the first conductive portion 112 and the second conductive portion 114 are oriented on opposite sides of the resistive element 111. The second conductive portion 114 and the resistive element 111 may be connected, joined, bonded, or attached by various means such as welding, bonding, adhesives, ultrasonic bonding, soldering, brazing, or other methods that provide a low resistive connection, or any other acceptable connection means providing for electrical and/or thermal communication.

In an aspect of the invention, the first conductive portion 112 has a first opening 170 adjacent the first or outer side 118 of the first conductive portion 112, and a second opening 172 adjacent the second or inner side 120 of the first conductive portion 112. The first opening 170 may comprise a hole completely through a portion of the first conductive portion 112 and may be generally circular in shape. The first opening 170 is positioned closer to the first side 118 of the first conductive portion 112. The first opening 170 may function as a current connection hole or area. The current connection opening 170 is only one example of how a resistor may be attached to a current that is to be monitored and/or measured. Such openings may be omitted entirely.

The second opening 172 may comprise a hole completely through a portion of the first conductive portion 112 and be generally oblong in shape, such as a curved oblong shape. The second opening 172 is positioned closer to the second side 120. The second opening 172 functions as a TCR adjustment opening, which may also be referred to as a TCR compensation slot, as described in greater detail herein.

In an aspect of the invention, the second conductive portion 114 has a first opening 174 adjacent the first or outer side 136 of the second conductive portion 114, and a second opening 176 adjacent the second or inner side 138 of the second conductive portion 114. The first opening 174 may comprise a hole completely through a portion of the second conductive portion 114 and may be generally circular in shape. The second opening 176 may comprise a hole completely through a portion of the second conductive portion 114 and be generally oblong in shape, such as a curved oblong shape. The first opening 174 is positioned closer to the first side 136 of the second conductive portion 114 and the second opening 176 is positioned closer to the second side 138.

In an aspect of the invention, the first opening 170 of the first conductive portion 112 and the first opening 174 of the second conductive portion 114 have generally the same shape. In an aspect of the invention, the second opening 172 of the first conductive portion 112 and the second opening 176 of the second conductive portion 114 have the generally the same shape.

All of the openings (i.e. openings 170, 172, 174, and 176) of the resistor 110 may be aligned along a longitudinal axis L2 of the resistor 110. Alternatively, in different embodiments, certain openings can be offset from each other.

As shown in FIG. 2, the openings 170, 172, 174, and 176 are all arranged in an interior area of the resistor 110. The openings 170, 172, 174, and 176 are each spaced away from outer edges, such as the lateral and longitudinal edges, or the perimeter of the resistor 110. No portion of the openings 170, 172, 174, and 176 intersect, contact or cross the outer edges, such as the lateral and longitudinal edges, or the perimeter of the resistor 110. In this way, the openings 170, 172, 174, and 176 are surrounded on all sides by parts of the conductive portions, the resistive elements, or combinations of those.

As shown in FIG. 2, a bracket or header assembly 180 can be provided for attaching the resistor 110 to another component, such as a header pin. The bracket or header assembly 180 is similar to the bracket or header assembly 80 of FIG. 1, and also includes braces and mounting pins.

As shown in FIG. 2, the openings 170 and 174 are the current connections, the upper pins of the bracket or header assembly 180 are one pair of voltage senses and the lower pair of pins of the bracket or header assembly 180 are the other voltage sense pair.

Openings 170, 174 are illustrated as generally being circular in FIG. 2. However, a profile of the openings 170, 174 may vary in different aspects of the invention. The openings 170, 174 may be identical or different from each other. In one aspect, at least one of the openings 170, 174 has an elongated, slotted, or non-circular profile. The orientation of the elongated or slotted profile of the openings 170, 174 may extend in the X-direction. In another aspect, the orientation of the elongated or slotted profile of the openings 170, 174 may extend in the Y-direction. The openings 170, 174 may not extend completely through the resistor in another aspect. In certain aspects, one or more of the openings 170, 174 may be omitted completed. These variations can be realized in any one or more of the other embodiments described herein.

All aspects of the openings 172, 176 may also vary. For example, the openings 172, 176 may each have a different profile, dimension, size, or shape. These may be adjusted or changed based on need or function. The openings 172, 176 may include one or more through openings and one or more openings that do not extend completely through the conductive portions and/or the resistive elements. The openings 172, 176 may be circular, elongated, slotted, non-circular, S-shaped, N-shaped, serpentine, or any other shape as may be selected. The orientation or direction in which any of the slotted or elongated openings 172, 176 extend may vary, having differences in height, length, width, etc. In certain aspects, one or more of the openings 172, 176 may be omitted. These variations can be realized in any one or more of the other embodiments described herein.

Figure 3:
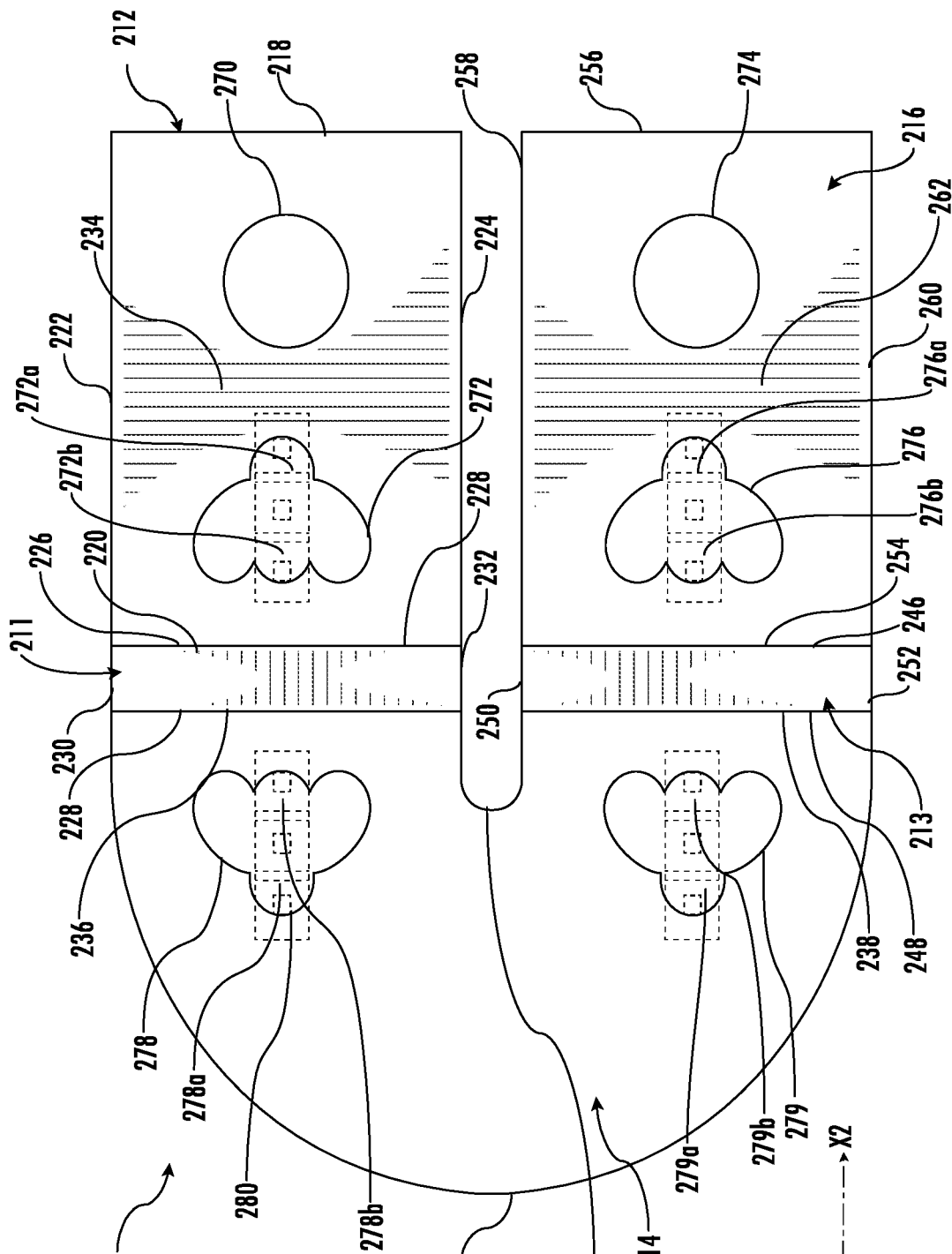
FIG. 3 illustrates a front view of a resistor according to an aspect of the invention.

In another aspect of the invention shown in FIG. 3, a resistor 210 is disclosed that is generally formed of a first resistive element 211 disposed between a first conductive portion 212 and a second conductive portion 214, and a second resistive element 213 disposed between the second conductive portion 214 and a third conductive portion 216. The resistor 210 is similar to the resistor 10 in that both resistors include two resistive elements 11, 13, 211, and 213.

The resistor 210 generally has a curved profile as opposed to the linear profile of resistors 10 and 110. In one aspect, the resistor 210 has a U-shaped profile or a "horseshoe" profile. The first conductive portion 212 and the third conductive portion 216 have a linear or straight profile and the second conductive portion 214 has a curved or U-shaped profile. The second conductive portion 214 may have a square profile in one aspect. One of ordinary skill in the art would understand that the shape of the conductive portions 212, 214, 216 can vary.

The first resistive element 211 has a first or outer side 226 facing in the second direction X2, and a second or inner side 228 facing in the first direction X1, a third side 230 facing in the direction Y1, and a fourth side 232 facing in the direction Y2. The first resistive element 211 may be formed generally as a plate or a strip or a bar. The first resistive element 211 may be formed of a resistive material, or combinations of materials including resistive materials. In an embodiment, the first resistive element 211 is formed from or comprises alloys of copper-nickel-manganese (Cu-NiMn), copper manganese tin (CuMnSn), copper nickel (CuNi), nickel-chromium-aluminum (NiCrAl), or nickel-chromium (NiCr), or other alloys known to those of skill in the art acceptable for use as a resistive element as part of a shunt resistor. Other resistive materials that may be used to form the first resistive element 211 are, either alone or in combination, Cu, Ni, Mn, Cr, Al, and Fe.

The first conductive portion 212 has a first or outer side 218 facing in the second direction X2, and a second or inner side 220 facing in the first direction X1, a third side 222 facing in the direction Y1, and a fourth side 224 facing in the direction Y2. The first conductive portion 212 may be formed generally as a plate or a strip or a bar. The first conductive portion 212 may be formed of a conductive metal. In an embodiment, the first conductive portion 212 is formed from copper (Cu) or a Cu alloy. Other conductive materials that may be used to form the first conductive portion 12 are, either alone or in combination, Sn, Al, Ag, or Au, with the alloy being plated or not plated with layers of Ni, Sn, or other similar materials.

The first conductive portion 212 is attached at the second or inner side 220 to the first or outer side 226 of the first resistive element 211. The first conductive portion 212 and the first resistive element 211 may be connected, joined, bonded, or attached by various means such as welding, bonding, adhesives, ultrasonic bonding, soldering, brazing, or other methods that provide a low resistive connection, or any other acceptable connection means providing for electrical and/or thermal communication. The first conductive portion 212 is generally located at a first side 234 or first portion of the resistor 210.

As oriented in the depiction of FIG. 3, the second conductive portion 214 has a first side 236 facing in the second direction X2, and a second side 238 also facing in the second direction X2, an inner curved side 240 and an opposite, outer curved side 242. The second conductive portion 214 may be formed generally as a plate or a strip or a bar. In one aspect, as shown in FIG. 3, the second conductive portion 214 has a curved profile. In one aspect, the second conductive portion 214 has a U-shaped profile. The second conductive portion 214 may be formed of a conductive metal. In an embodiment, the second conductive portion 214 is formed from copper (Cu) or a Cu alloy. Other conductive materials that may be used to form the second conductive portion 214 are, either alone or in combination, Sn, Al, Ag, or Au, with the alloy being plated or not plated with layers of Ni, Sn, or other similar materials. The second conductive portion 214 is generally located or positioned adjacent at a central location or midpoint of the resistor 210.

The second conductive portion 214 is attached at the first side 236 to the second or inner side 228 of the first resistive element 211. Accordingly, the first conductive portion 212 and the second conductive portion 214 are oriented on opposite sides of the first resistive element 211. The second conductive portion 214 and the first resistive element 211 may be connected, joined, bonded, or attached by various means such as welding, bonding, adhesives, ultrasonic bonding, soldering, brazing, or other methods that provide a low resistive connection, or any other acceptable connection means providing for electrical and/or thermal communication.

The second resistive element 213 has a first or outer side 246 facing in the second direction X2, and a second or inner side 248 facing in the first direction X1, a third side 250 facing in the direction Y1, and a fourth side 252 facing in the direction Y2. The second resistive element 213 may be formed generally as a plate or a strip or a bar. The second resistive element 213 may be formed of a resistive material, or combinations of materials including resistive materials. In an embodiment, the second resistive element 213 is formed from or comprises alloys of copper-nickel-manganese (Cu-NiMn), copper manganese tin (CuMnSn), copper nickel (CuNi), nickel-chromium-aluminum (NiCrAl), or nickel-chromium (NiCr), or other alloys known to those of skill in the art acceptable for use as a resistive element as part of a shunt resistor. Other resistive materials that may be used to form the second resistive element 213 are, either alone or in combination, Cu, Ni, Mn, Cr, Al, and Fe.

The second conductive portion 214 is attached at the second or inner side 238 to the second or inner side 248 of the second resistive element 213. The second conductive portion 214 and the second resistive element 213 may be connected, joined, bonded, or attached by various means such as welding, bonding, adhesives, ultrasonic bonding, soldering, brazing, or other methods that provide a low resistive connection, or any other acceptable connection means providing for electrical and/or thermal communication.

In the arrangement as shown in FIG. 3, the first resistive element 211 and second resistive element 213 are positioned on opposite sides of the second conductive portion 214.

As oriented in the depiction of FIG. 3, the third conductive portion 216 has an inner or second side 254 facing in the first direction X1, and a first or outer side 256 facing in the second direction X2, a third side 258 facing in the direction Y1, and a fourth side 260 facing in the direction Y2. The third conductive portion 216 may be formed generally as a plate or a strip or a bar. The third conductive portion 216 may be formed of a conductive metal. In an embodiment, the third conductive portion 216 is formed from copper (Cu) or a Cu alloy. Other conductive materials that may be used to form the third conductive portion 216 are, either alone or in combination, Sn, Al, Ag, or Au, with the alloy being plated or not plated with layers of Ni, Sn, or other similar materials. The second conductive portion 214 is generally located or positioned adjacent at a second side 262 or second portion of the resistor 210.

The third conductive portion 216 is attached at the second or inner side 254 to the first or outer side 246 of the second resistive element 213. The third conductive portion 216 and the second resistive element 213 may be connected, joined, bonded, or attached by various means such as welding, bonding, adhesives, ultrasonic bonding, soldering, brazing, or other methods that provide a low resistive connection, or any other acceptable connection means providing for electrical and/or thermal communication.

In the arrangement as shown in FIG. 3, the second conductive portion 214 and the third conductive portion 216 are positioned on opposite sides of the second resistive element 213. The second conductive portion 214 may also be attached to a heat sink to dissipate heat and improve the long-term stability of the part and reduce the resistive element temperature in operation.

In an aspect of the invention, the first conductive portion 212 has a first opening 270 adjacent the first or outer side 218 of the first conductive portion 212, and a second opening 272 adjacent the second or inner side 220 of the first conductive portion 212. The first opening 270 may comprise a hole completely through a portion of the first conductive portion 212 and may be generally circular in shape. The second opening 272 may comprise a hole completely through a portion of the first conductive portion 212 and be generally oblong in shape. Preferably, the second opening 272 is a generally C-shaped opening functioning as a TCR adjustment slot. As used herein, the term "C-shaped" may designate, define, refer to, or capture, multiple shapes, which may be curved shapes, such as, but not limited to, a curved opening, or an opening tracing or in the shape of an arc, or being arc-shaped, or arch-shaped, or a parabolic shape. The C-shaped opening has a curved portion, such as an outwardly curved or outwardly curving portion, curving toward the first side 218 of the first conductive portion 212, with a concave side facing the first resistive element 211. A first dimple, indentation or cut-out 272a may be formed as a semi-circular shape at a first side of the second opening 272. A second dimple, indentation or cut-out 272b may be formed as a semi-circular shape at a second side of the second opening 272. These cut-outs provide areas for pin connections and placement. The first opening 270 is positioned closer to the first side 218 of the first conductive portion 212 and the second opening 272 is positioned closer to the second side 220.

The first opening 270 and the second opening 274 comprise or provide for current connections and the pins closest to the first resistive element 211 of cut-out 272b and cut-out 278a comprise or provide for voltage connections for the resistive element 211. Thus, first opening 270 and second opening 274 are positioned adjacent what can be referred to as main current terminals of the conductive portions.

It is appreciated that the TCR adjustment openings in any disclosed embodiment form, define or comprise voltage sense terminals in areas of the conductive portions adjacent to the TCR adjustment openings. Accordingly, the designs shown and described herein provide for a wide range of positioning choices for the pins along or within the TCR adjustment openings to allow for voltage sensing at selected positions.

The pins contacting or otherwise connected to first cut-out 279a and second cut-out 276b closest to side 252 comprise or provide for the voltage sense pins for the resistive element 213. Thus, cut-out 279a and cut-out 276b are positioned adjacent what can be referred to as voltage sense terminals of the conductive portions.

In an aspect of the invention, the third conductive portion 216 has a first opening 274 adjacent the first or outer side 256 of the third conductive portion 216, and a second opening 276 adjacent the second or inner side 254 of the third conductive portion 216. The first opening 274 may comprise a hole completely through a portion of the third conductive portion 216 and may be generally circular in shape. The second opening 276 may comprise a hole completely through a portion of the third conductive portion 216 and be generally oblong in shape. The first opening 274 is positioned closer to the first side 256 of the third conductive portion 216 and the second opening 276 is positioned closer to the second side 254. The second opening 276 is preferably a generally C-shaped opening functioning as a TCR adjustment slot. The C-shaped opening has a curved portion, such as an outwardly curved or outwardly curving portion, curving toward the first side 256 of the third conductive portion 216 with a concave side facing the second resistive element 213. That is, the C-shaped opening curves outwardly away from a central portion of the resistor. A first dimple, indentation or cut-out 276a may be formed as a semi-circular shape at a first side of the second opening 276. A second dimple, indentation or cut-out 276b may be formed as a semi-circular shape at a second side of the second opening 276. These cut-outs provide areas for pin connections and placement.

In an aspect of the invention, the second conductive portion 214 includes a first opening 278 that is generally located adjacent to the first side 236 and a second opening 279 generally located adjacent to the second side 238. The openings 278, 279 may be generally oblong in shape. The openings 278, 279, as shown in FIG. 3, are generally C-shaped openings functioning as TCR adjustment openings or slots. The C-shaped opening has a curved portion, such as an outwardly curved or outwardly curving portion, curving toward the outer curved side 242 of the second conductive portion 214 with a concave side facing the first and second resistive elements 211, 213, respectively. A first dimple, indentation or cut-out 278a, 279a may be formed as a semi-circular shape at a first side of the openings 278, 279. A second dimple, indentation or cut-out 278b, 279b may be formed as a semi-circular shape at a second side of the openings 278, 279. These cut-outs provide areas for pin connections and placement. Soldering pins to a surface between the openings and the resistive elements can also provide a voltage sense point. It is appreciated that various external connections or sense leads may be connected to the voltage sense areas of the resistors disclosed herein.

In an aspect of the invention, the first opening 270 of the first conductive portion 212 and the first opening 274 of the third conductive portion 216 have generally the same shape. However, those openings can be selectively adjusted to have different shapes and to be of different sizes.

In an aspect of the invention, the second opening 272 of the first conductive portion 212, the second opening 276 of the third conductive portion 216, and the opening 278, 279 of the second conductive portion 214 have the generally the same shape. However, those openings can be selectively adjusted to have different shapes and to be of different sizes.

Openings 270, 274 are illustrated as generally being circular in FIG. 3. However, a profile of the openings 270, 274 may vary in different aspects of the invention. The openings 270, 274 may be identical or different from each other. In one aspect, at least one of the openings 270, 274 has an elongated, slotted, or non-circular profile. The orientation of the elongated or slotted profile of the openings 270, 274 may extend in the X-direction. In another aspect, the orientation of the elongated or slotted profile of the openings 270, 274 may extend in the Y-direction. The openings 270, 274 may not extend completely through the resistor in another aspect. In certain aspects, one or more of the openings 270, 274 may be omitted completed. These variations can be realized in any one or more of the other embodiments described herein.

All aspects of the openings 272, 276, 278, 279 may also vary. For example, the openings 272, 276, 278, 279 may each have a different profile, dimension, size, or shape. These may be adjusted or changed based on need or function. The openings 272, 276, 278, 279 may include one or more through openings and one or more openings that do not extend completely through the conductive portions and/or the resistive elements. The openings 272, 276, 278, 279 may be circular, elongated, slotted, non-circular, S-shaped, N-shaped, serpentine, or any other shape as may be selected. The orientation or direction in which any of the slotted or elongated openings 272, 276, 278, 279 extend may vary, having differences in height, length, width, etc. In certain aspects, one or more of the openings 272, 276, 278, 279 may be omitted. These variations can be realized in any one or more of the other embodiments described herein.

As shown in FIG. 3, the openings 272, 276, 278, and 279 are all arranged in an interior area of the resistor 210. The openings 272, 276, 278, and 279 are each spaced away from outer edges, such as the lateral and longitudinal edges, or the perimeter of the resistor 210. No portion of the openings 272, 276, 278, and 279 intersect, contact or cross the outer edges, such as the lateral and longitudinal edges, or the perimeter of the resistor 210. In this way, the openings 272, 276, 278, and 279 are surrounded on all sides by parts of the conductive portions, the resistive elements, or combinations of those.

As shown in FIG. 3, a bracket or header assembly 280 can be provided for attaching the resistor 210 to another component. The bracket or header assembly 280 is similar to the bracket or header assembly 80 of FIG. 1, and also includes braces and mounting pins.

Figure 4:
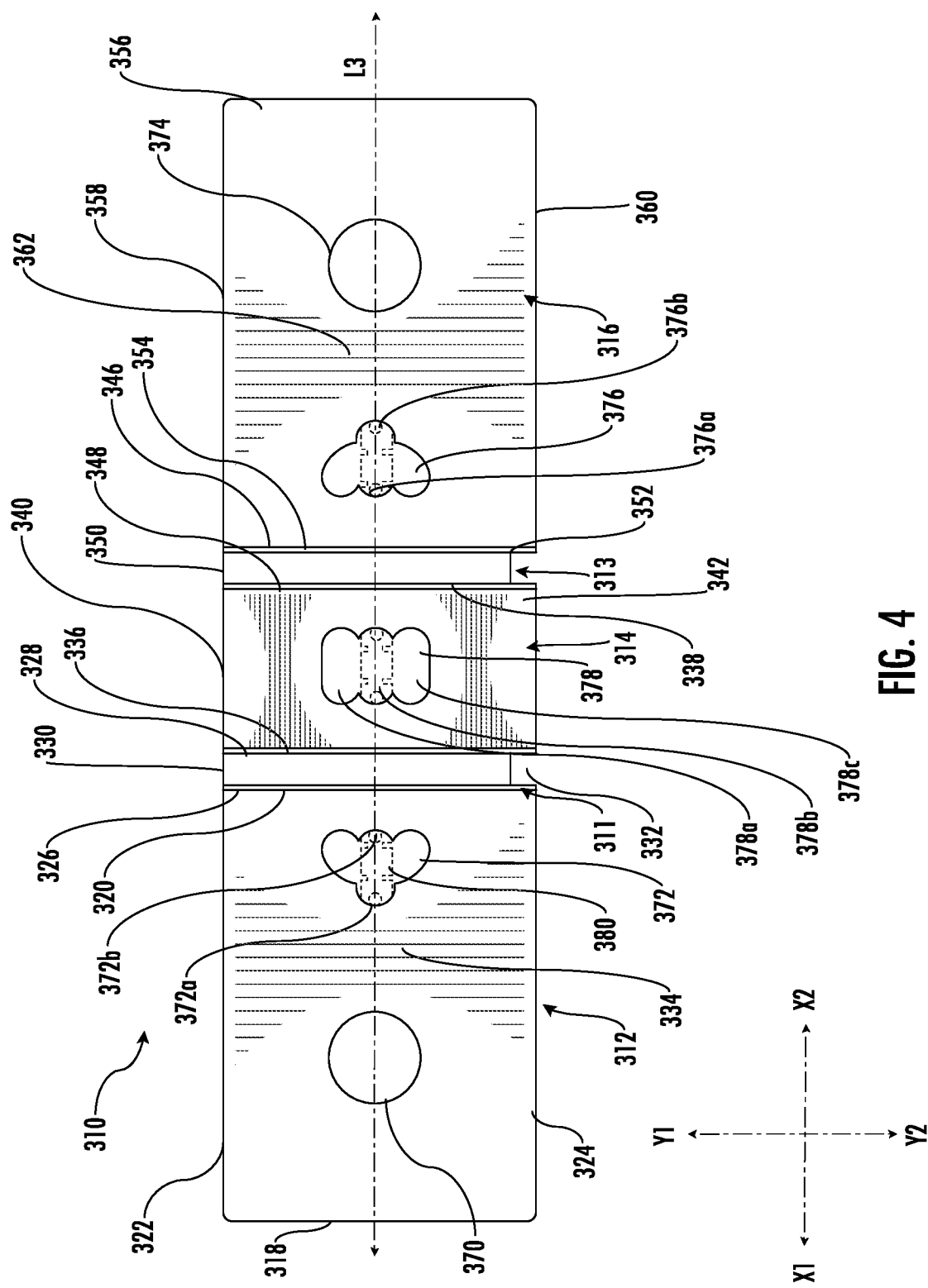
FIG. 4 illustrates a front view of a resistor according to an aspect of the invention.

FIG. 4 shows a resistor 310 generally formed of a first resistive element 311 disposed between a first conductive portion 312 and a second conductive portion 314, and a second resistive element 313 disposed between the second conductive portion 314 and a third conductive portion 316.

As oriented in the depiction of FIG. 4, the first conductive portion 312 has a first or outer side 318 facing in a first direction X1, and a second or inner side 320 facing in a second direction X2 which is a direction opposite the first direction X1, a third side 322 facing in a direction Y1, and a fourth side 324 facing in a direction Y2 which is a direction opposite the direction Y1.

The first conductive portion 312 may be formed generally as a plate or a strip or a bar. The first conductive portion 312 may be formed of a conductive metal. In an embodiment, the first conductive portion 312 is formed from copper (Cu) or a Cu alloy. Other conductive materials that may be used to form the first conductive portion 12 are, either alone or in combination, Sn, Al, Ag, or Au, with the alloy being plated or not plated with layers of Ni, Sn, or other similar materials.

The first resistive element 311 has a first or outer side 326 facing in the first direction X1, and a second or inner side 328 facing in the second direction X2, a third side 330 facing in the direction Y1, and a fourth side 332 facing in the direction Y2. The first resistive element 311 may be formed generally as a plate or a strip or a bar. The first resistive element 311 may be formed of a resistive material, or combinations of materials including resistive materials. In an embodiment, the first resistive element 311 is formed from or comprises alloys of copper-nickel-manganese (CuNiMn), copper manganese tin (CuMnSn), copper nickel (CuNi), nickel-chromium-aluminum (NiCrAl), or nickel-chromium (NiCr), or other alloys known to those of skill in the art acceptable for use as a resistive element as part of a shunt resistor. Other resistive materials that may be used to form the first resistive element 311 are, either alone or in combination, Cu, Ni, Mn, Cr, Al, and Fe.

The first conductive portion 312 is attached at the second or inner side 320 to the first or outer side 326 of the first resistive element 311. The first conductive portion 312 and the first resistive element 311 may be connected, joined, bonded, or attached by various means such as welding, bonding, adhesives, ultrasonic bonding, soldering, brazing, or other methods that provide a low resistive connection, or any other acceptable connection means providing for electrical and/or thermal communication. The first conductive portion 312 is generally located at a first side 334 or first portion of the resistor 310.

As oriented in the depiction of FIG. 4, the second conductive portion 314 has a first side 336 facing in the first direction X1, and a second side 338 facing in the second direction X2, a third side 340 facing in the direction Y1, and a fourth side 342 facing in the direction Y2. The second conductive portion 314 may be formed generally as a plate or a strip or a bar. The second conductive portion 314 may be formed of a conductive metal. In an embodiment, the second conductive portion 314 is formed from copper (Cu) or a Cu alloy. Other conductive materials that may be used to form the second conductive portion 314 are, either alone or in combination, Sn, Al, Ag, or Au, with the alloy being plated or not plated with layers of Ni, Sn, or other similar materials. The second conductive portion 314 is generally located or positioned adjacent at a central location or midpoint of the resistor 310.

The second conductive portion 314 is attached at the first side 336 to the second or inner side 328 of the first resistive element 311. Accordingly, the first conductive portion 312 and the second conductive portion 314 are oriented on opposite sides of the first resistive element 311. The second conductive portion 314 and the first resistive element 311 may be connected, joined, bonded, or attached by various means such as welding, bonding, adhesives, ultrasonic bonding, soldering, brazing, or other methods that provide a low resistive connection, or any other acceptable connection means providing for electrical and/or thermal communication.

The second resistive element 313 has a first or outer side 346 facing in the second direction X2, and a second or inner side 348 facing in the first direction X1, a third side 350 facing in the direction Y1, and a fourth side 352 facing in the direction Y2. The second resistive element 313 may be formed generally as a plate or a strip or a bar. The second resistive element 313 may be formed of a resistive material, or combinations of materials including resistive materials. In an embodiment, the second resistive element 313 is formed from or comprises alloys of copper-nickel-manganese (CuNiMn), copper manganese tin (CuMnSn), copper nickel (CuNi), nickel-chromium-aluminum (NiCrAl), or nickel-chromium (NiCr), or other alloys known to those of skill in the art acceptable for use as a resistive element as part of a shunt resistor. Other resistive materials that may be used to form the second resistive element 313 are, either alone or in combination, Cu, Ni, Mn, Cr, Al, and Fe.

The second conductive portion 314 is attached at the second or inner side 338 to the second or inner side 348 of the second resistive element 313. The second conductive portion 314 and the second resistive element 313 may be connected, joined, bonded, or attached by various means such as welding, bonding, adhesives, ultrasonic bonding, soldering, brazing, or other methods that provide a low resistive connection, or any other acceptable connection means providing for electrical and/or thermal communication.

In the arrangement as shown in FIG. 4, the first resistive element 311 and second resistive element 313 are positioned on opposite sides of the second conductive portion 314.

As oriented in the depiction of FIG. 4, the third conductive portion 316 has an inner or second side 354 facing in the first direction X1, and a first or outer side 356 facing in the second direction X2, a third side 358 facing in the direction Y1, and a fourth side 360 facing in the direction Y2. The third conductive portion 316 may be formed generally as a plate or a strip or a bar. The third conductive portion 316 may be formed of a conductive metal. In an embodiment, the third conductive portion 316 is formed from copper (Cu) or a Cu alloy. Other conductive materials that may be used to form the third conductive portion 16 are, either alone or in combination, Sn, Al, Ag, or Au, with the alloy being plated or not plated with layers of Ni, Sn, or other similar materials. The second conductive portion 314 is generally located or positioned adjacent at a second side 362 or second portion of the resistor 310.

The third conductive portion 316 is attached at the second or inner side 354 to the first or outer side 346 of the second resistive element 313. The third conductive portion 316 and the second resistive element 313 may be connected, joined, bonded, or attached by various means such as welding, bonding, adhesives, ultrasonic bonding, soldering, brazing, or other methods that provide a low resistive connection, or any other acceptable connection means providing for electrical and/or thermal communication.

In the arrangement as shown in FIG. 4, the second conductive portion 314 and the third conductive portion 316 are positioned on opposite sides of the second resistive element 313.

In an aspect of the invention, the first conductive portion 312 has a first opening 370 adjacent the first or outer side 318 of the first conductive portion 312, and a second opening 372 adjacent the second or inner side 320 of the first conductive portion 312. The first opening 370 may comprise a hole completely through a portion of the first conductive portion 312 and may be generally circular in shape. The second opening 372 may comprise a hole completely through a portion of the first conductive portion 312 and be generally curved in shape. The first opening 370 is positioned closer to the first side 318 of the first conductive portion 312 and the second opening 372 is positioned closer to the second side 320. The second opening 372 is preferably a generally C-shaped opening functioning as a TCR adjustment slot. The C-shaped opening has a curved portion, such as an outwardly curved or outwardly curving portion, curving toward the first side 318 of the first conductive portion 312 with a concave side facing the first resistive element 311. Additional features of the opening 372, including dimple, indentations or cut-outs are described below.

In an aspect of the invention, the third conductive portion 316 has a first opening 374 adjacent the first or outer side 356 of the third conductive portion 316, and a second opening 376 adjacent the second or inner side 354 of the third conductive portion 316. The first opening 374 may comprise a hole completely through a portion of the third conductive portion 316 and may be generally circular in shape. The second opening 376 may comprise a hole completely through a portion of the third conductive portion 316 and be generally curved in shape. The first opening 374 is positioned closer to the first side 356 of the third conductive portion 316 and the second opening 376 is positioned closer to the second side 354. The second opening 376 is preferably a generally C-shaped opening functioning as a TCR adjustment slot. The C-shaped opening has a curved portion, such as an outwardly curved or outwardly curving portion, curving toward the first side 356 of the third conductive portion 316 with a concave side facing the second resistive element 313. That is, the C-shaped opening curves outwardly away from a central portion of the resistor. Additional features of the opening 376, including dimple, indentations or cut-outs are described below.

The openings 372, 376 may arc or curve along the Y1-Y2 direction (transversely) or may arc or curve along the X1-X2 direction (longitudinally). As shown in FIG. 4, the openings 372, 376 may include a first generally centrally located dimple, indentation or cut-out 372a, 376a providing for a generally semicircular opening extending in the X1 direction. This dimple, indentation or cut-out provides a first pin connection area. The openings 372, 376 may include a second generally centrally located dimple, indentation or cut-out 372b, 376b providing for a generally semicircular opening extending in the X2 direction, which provides for a second pin connection area. The cut-outs 372a, 372b, 376a, 376b may lie generally along or be generally aligned along a longitudinal axis of the conductive portions.

The openings 370 and 374 are the current connections. The pins at cut-out 372b and the pin at cut-out 378b closest to 372b are the voltage sense points for resistive element 311, and the pins at cut-out 376a and cut-out 378b closest to the pin at cut-out 376a are the voltage sense points for resistive element 313.

In an aspect of the invention, the second conductive portion 314 includes a central opening 378 that is generally centrally located through the second conductive portion 314. The central opening 378 may have a "dog bone" shape or barbell shape along its transverse length (in the Y1 to Y2 direction), having a larger portion 378a at its upper area, and smaller portion 378b at its central or middle area, and a larger portion 378c at its lower area. The central opening 378 could also be rotated 90 degrees from the position shown in FIG. 4 in another variation. In one aspect, opening 372 is a first TCR adjustment opening, opening 376 is a second TCR adjustment opening, and opening 378 is a third TCR adjustment opening. The first and second TCR adjustment openings 372, 376 each generally have a C-shaped profile and are mirror images and are symmetrical with each other, in one aspect. The third TCR adjustment opening 378 has a different profile than the first and second TCR adjustment openings 372, 376, in one aspect. In one aspect, the first and second TCR adjustment openings 372, 376 each include a base region having an oblong or pill shaped profile and two curved arms extending on opposite sides of the oblong or pill shaped base region. In one aspect, the third TCR adjustment opening 378 includes three oblong or pill shaped regions connected to each other. In one aspect, each of the TCR adjustment openings 372, 376, 378 are symmetrical about the longitudinal axis L3. Each of the TCR adjustment openings 372, 376, 378 may be intersected by the longitudinal axis L3 at a respective midpoint.

In an aspect of the invention, the first opening 370 of the first conductive portion 312 and the first opening 374 of the third conductive portion 316 have generally the same shape. In an aspect of the invention, the second opening 372 of the first conductive portion 312, the second opening 376 of the third conductive portion 316 have the generally the same shape.

All of the openings (i.e. openings 370, 372, 374, 376, and 378) of the resistor 10 may be aligned along a longitudinal axis L3 of the resistor 310. Alternatively, in different embodiments, certain openings can be offset from each other.

Although a longitudinal axis L1, L2, L3 is only explicitly illustrated in FIGS. 1, 2, and 4, respectively, one skilled in the art would understand that a longitudinal axis is defined in the longitudinal direction across each resistor illustrated in the Figures.

Openings 370, 374 are illustrated as generally being circular in FIG. 4. However, a profile of the openings 370, 374 may vary in different aspects of the invention. The term profile is used herein to refer to the overall outline, size, shape, cross-section, orientation, or other physical characteristic. The openings 370, 374 may be identical or different from each other. In one aspect, at least one of the openings 370, 374 has an elongated, slotted, or non-circular profile. The orientation of the elongated or slotted profile of the openings 370, 374 may extend in the X-direction. In another aspect, the orientation of the elongated or slotted profile of the openings 370, 374 may extend in the Y-direction. The openings 370, 374 may not extend completely through the resistor in another aspect. In certain aspects, one or more of the openings 370, 374 may be omitted completed. These variations can be realized in any one or more of the other embodiments described herein.

All aspects of the openings 372, 376, 378 may also vary. For example, the openings 372, 376, 378 may each have a different profile, dimension, size, or shape. These may be adjusted or changed based on need or function. The openings 372, 376, 378 may include one or more through openings and one or more openings that do not extend completely through the conductive portions and/or the resistive elements. The openings 372, 376, 378 may be circular, elongated, slotted, non-circular, S-shaped, N-shaped, serpentine, or any other shape as may be selected. The orientation or direction in which any of the slotted or elongated openings 372, 376, 378 extend may vary, having differences in height, length, width, etc. In certain aspects, one or more of the openings 372, 376, 378 may be omitted. These variations can be realized in any one or more of the other embodiments described herein.

As shown in FIG. 4, the openings 370, 372, 374, 376, and 378 are all arranged in an interior area of the resistor 310. The openings 370, 372, 374, 376, and 378 are each spaced away from outer edges, such as the lateral and longitudinal edges, or the perimeter of the resistor 310. No portion of the openings 370, 372, 374, 376, and 378 intersect, contact or cross the outer edges, such as the lateral and longitudinal edges, or the perimeter of the resistor 310. In this way, the openings 370, 372, 374, 376, and 378 are surrounded on all sides by parts of the conductive portions, the resistive elements, or combinations of those.

At least one bracket or header assembly 380 can be provided in one aspect, as shown in FIG. 4. The at least one bracket or header assembly 380 comprises a brace and mounting pins.

Figure 18:
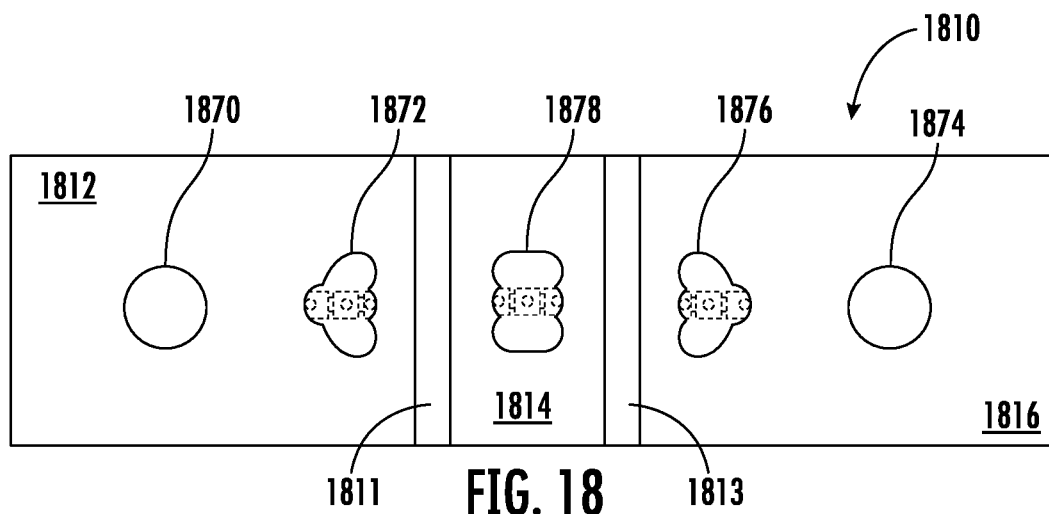
FIG. 18 illustrates a front view of a resistor according to an aspect of the invention.

FIG. 18 illustrates a resistor 1810 that is similar to the resistor 310 of FIG. 4. Resistor 1810 is generally formed of a first resistive element 1811 disposed between a first conductive portion 1812 and a second conductive portion 1814, and a second resistive element 1813 disposed between the second conductive portion 1814 and a third conductive portion 1816. The resistor 1810 includes first, second, and third TCR adjustment slots 1872, 1876, 1878, as well as a first and second outer openings 1870, 1874. The configuration, structure, function, and other characteristics of all elements of resistor 1810 in FIG. 18 are similar to the corresponding elements of resistor 310 in FIG. 4.

As shown in FIG. 18, the openings 1870, 1872, 1874, 1876, and 1878 are all arranged in an interior area of the resistor 1810. The openings 1870, 1872, 1874, 1876, and 1878 are each spaced away from outer edges, such as the lateral and longitudinal edges, or the perimeter of the resistor 1810. No portion of the openings 1870, 1872, 1874, 1876, and 1878 intersect, contact or cross the outer edges, such as the lateral and longitudinal edges, or the perimeter of the resistor 1810. In this way, the openings 1870, 1872, 1874, 1876, and 1878 are surrounded on all sides by parts of the conductive portions, the resistive elements, or combinations of those.

Figure 5:
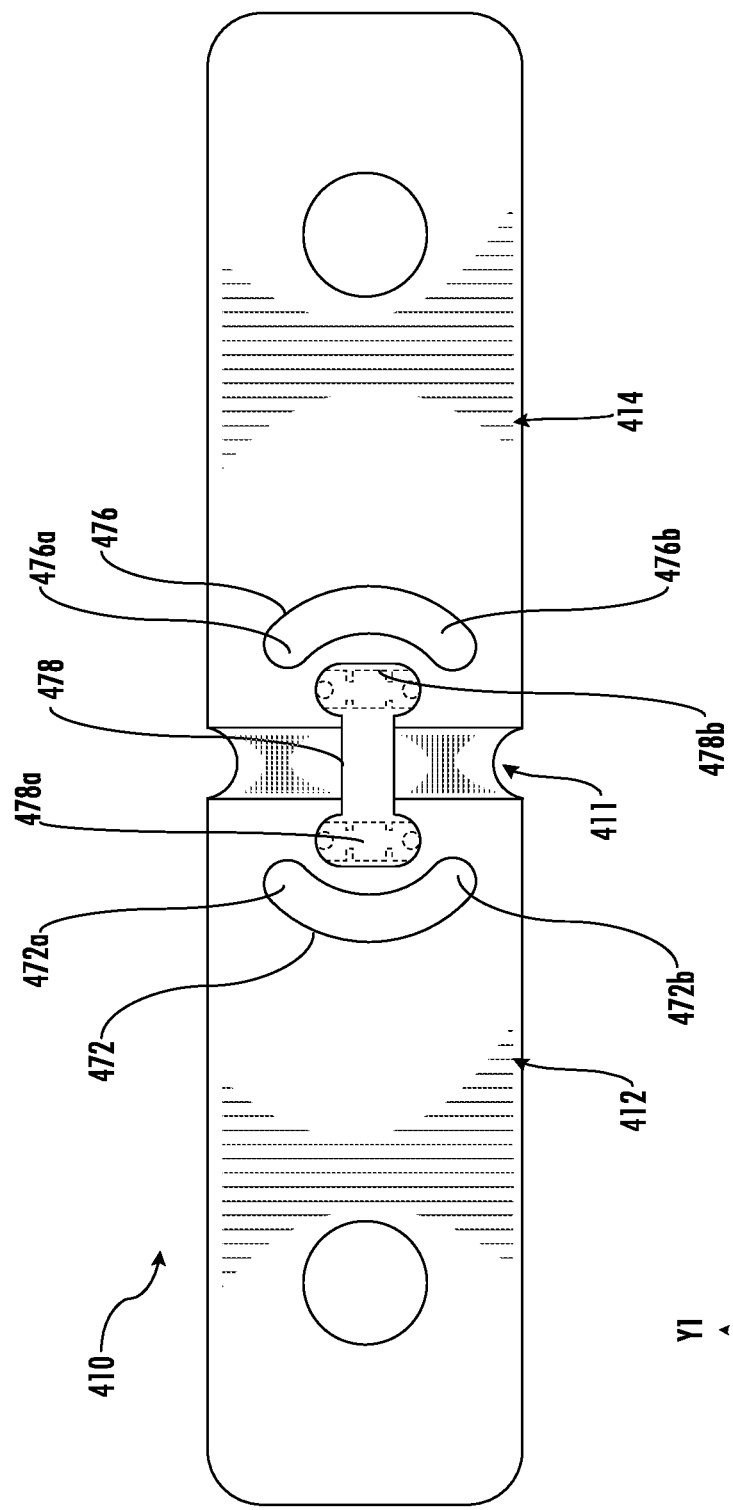
FIG. 5 illustrates a front view of a resistor according to an aspect of the invention.

FIG. 5 illustrates another embodiment of a resistor 410. The resistor 410 is generally formed of a resistive element 411 disposed between a first conductive portion 412 and a second conductive portion 414. The resistor 410 is similar to the resistor 110 of FIG. 2 and has the same function and structure as resistor 110 unless otherwise specified. As shown in FIG. 5, C-shaped TCR adjustment slots 472, 476 and a horizontally or longitudinally positioned "dog bone" shaped or barbell shaped slot 478 that extends through the first conductive portion 412, the second conductive portion 414, and the resistive element 411. In one aspect, indentations are defined on edges of the resistive element 411. These indentations can be provided at varying depths, as well as other profiles, in order to provide adjustment of resistance values for the resistor. Any of the resistors disclosed herein may include indentations or other modifications to the profiles of the resistive elements in order to adjust the resistance values of the resistors. In one aspect, the indentations adjust each section of the resistive element relative to a desired value. The outer circular openings in FIG. 5 are similar to the openings 70, 74 of FIG. 1. The upper pin of end 478a and the upper pin of end 478b are the voltage sense connections of 411. The lower pins of end 478a and the lower pin of end 478b are the voltage sense connections for element 411. Slot 478 acts as a further TCR adjustment opening or slot.

The C-shaped TCR adjustment slots 472, 476 are configured to curve about the larger end portions of the "dog bone" shaped or barbell shaped slot 478. The slots 472, 476 have a generally C-shaped or curved or arced profile, with the terminal ends 472a, 472b, 476a, 476b of the slots 472, 476 partially surrounding the ends 478a, 478b of terminal ends of the opening 478. In one aspect, slot 472 is a first TCR adjustment slot, slot 476 is a second TCR adjustment slot, and slot 478 is a third TCR adjustment slot.

The TCR adjustment slots 472, 476 are aligned along a longitudinal axis (similar to axis L3 of FIG. 4). Midpoints of each of the TCR adjustment slots 472, 476 can be centered on the longitudinal axis. The TCR adjustment slots 472, 476 can be continuously curved. In one aspect, the TCR adjustment slots 472, 476 are mirror images of each other. The TCR adjustment slots 472, 476 are shown having a continuous arc profile. In certain aspects, continuously curved or a continuous arc profile may be considered as a curved or arcing profile or shape that does not include any 45 degree or right-angle turns or bends from a first terminal end to a second terminal end. In one aspect, the TCR adjustment slots 472, 476 have a constant radius and extend for an arc length of greater than 90 degrees. The TCR adjustment slots 472, 476 are arranged in a medial area of the resistor relative to the lateral axis, in one aspect. The TCR adjustment slots 472, 476 are symmetrical with each other, in one aspect. In one aspect, each of the TCR adjustment slots 472, 476 are symmetrical about the longitudinal axis of the resistor. Each of the TCR adjustment slots 472, 476 may be intersected by the longitudinal axis at a respective midpoint.

All aspects of the slots 472, 476, 478 may vary. For example, the slots 472, 476, 478 may each have a different profile, dimension, size, or shape. These may be adjusted or changed based on need or function. The slots 472, 476, 478 may include one or more through openings and one or more openings that do not extend completely through the conductive portions and/or the resistive elements. The slots 472, 476, 478 may be circular, elongated, slotted, non-circular, S-shaped, N-shaped, serpentine, or any other shape as may be selected. The orientation or direction in which any of the slotted openings or elongated slots 472, 476, 478 extend may vary, having differences in height, length, width, etc. In certain aspects, one or more of the slots 472, 476, 478 may be omitted. These variations can be realized in any one or more of the other embodiments described herein.

As shown in FIG. 5, the slots 472, 476, and 478 are all arranged in an interior area of the resistor 410. The openings 472, 476, and 478 are each spaced away from outer edges, such as the lateral and longitudinal edges, or the perimeter of the resistor 410. No portion of the openings 472, 476, and 478 intersect, contact or cross the outer edges, such as the lateral and longitudinal edges, or the perimeter of the resistor 410. In this way, the openings 472, 476, and 478 are surrounded on all sides by parts of the conductive portions, the resistive elements, or combinations of those.

Figure 19:
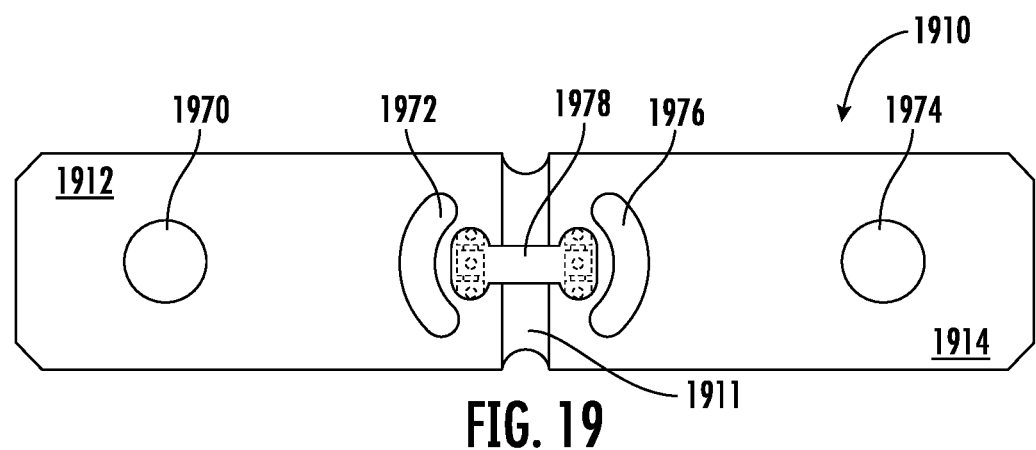
FIG. 19 illustrates a front view of a resistor according to an aspect of the invention.

FIG. 19 illustrates a resistor 1910 that is similar to the resistor 410 of FIG. 5. Resistor 1910 is generally formed of a first resistive element 1911 disposed between a first conductive portion 1912 and a second conductive portion 1914, and a second resistive element 1913 disposed between the second conductive portion 1914 and a third conductive portion 1916. The resistor 1910 includes first, second, and third TCR adjustment slots 1972, 1976, 1978, as well as a first and second outer openings 1970, 1974. The configuration, structure, function, and other characteristics of all elements of resistor 1910 in FIG. 19 are similar to the corresponding elements of resistor 410 in FIG. 5.

As shown in FIG. 19, the openings 1970, 1972, 1974, 1976, and 1978 are all arranged in an interior area of the resistor 1910. The openings 1970, 1972, 1974, 1976, and 1978 are each spaced away from outer edges, such as the lateral and longitudinal edges, or the perimeter of the resistor 1910. No portion of the openings 1970, 1972, 1974, 1976, and 1978 intersect, contact or cross the outer edges, such as the lateral and longitudinal edges, or the perimeter of the resistor 1910. In this way, the openings 1970, 1972, 1974, 1976, and 1978 are surrounded on all sides by parts of the conductive portions, the resistive elements, or combinations of those.

Figure 6:
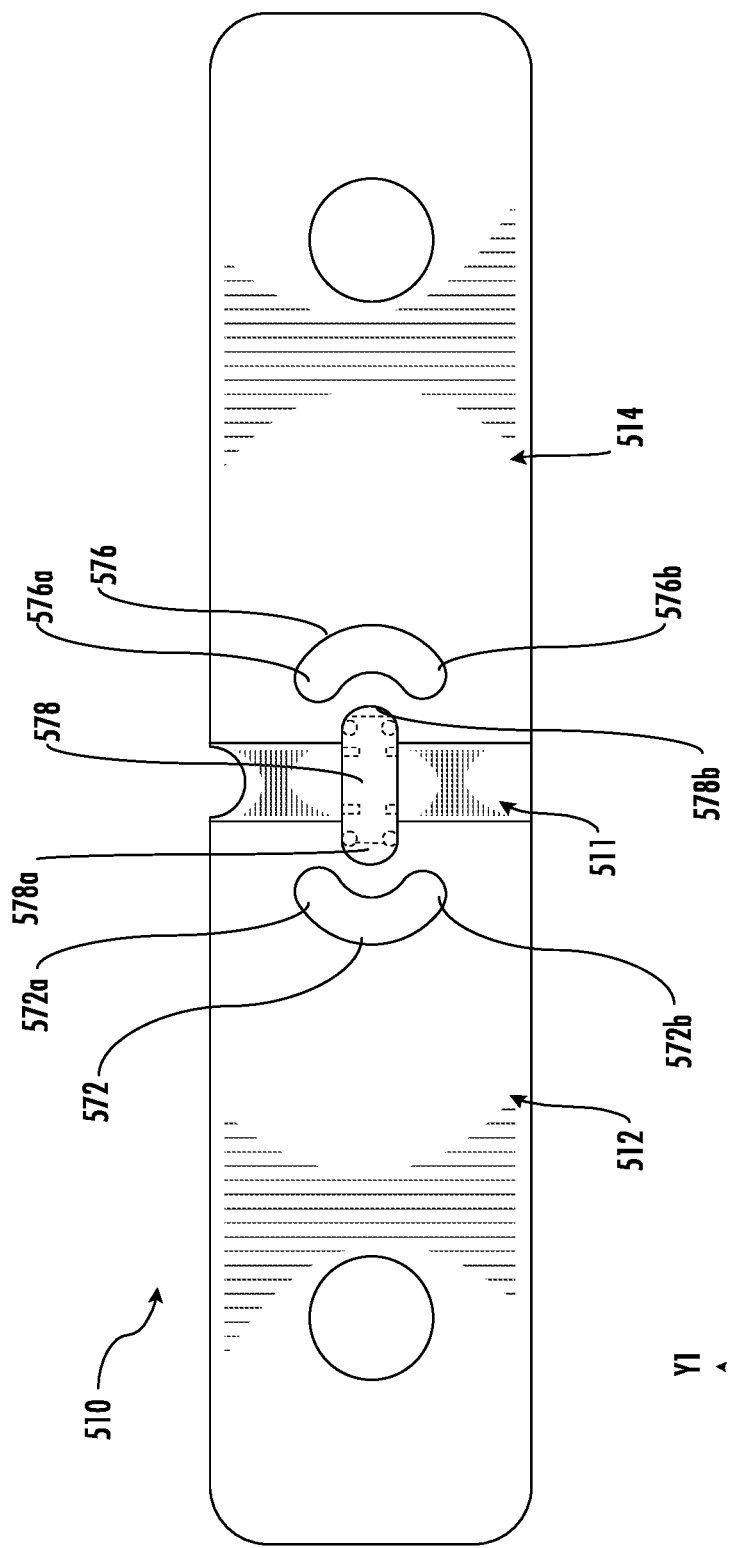
FIG. 6 illustrates a front view of a resistor according to an aspect of the invention.

FIG. 6 illustrates another embodiment of a resistor 510. The resistor 510 is generally formed of a resistive element 511 disposed between a first conductive portion 512 and a second conductive portion 514. The resistor 510 is similar to the resistor 410 except for the following modifications. The extent or length of the slots 572, 576 are shorter than the extent of the slots 472, 476. The central slot 578 is oblong in shape and does not include enlarged ends as in the "dog bone" or barbell variation. Instead, the ends 578a, 578b are generally aligned and linear. The ends 572a, 572b, 576a, 576b are curved and partially surround the respective ends 578a, 578b of the central slot 578. Slot 578 acts as a further TCR adjustment opening or slot. In one aspect, slot 572 is a first TCR adjustment slot, slot 576 is a second TCR adjustment slot, and slot 578 is a third TCR adjustment slot. In one aspect, the first and second TCR adjustment slots 572, 576 are symmetrical about the longitudinal axis of the resistor. The first and second TCR adjustment slots 572, 576 may be intersected by the longitudinal axis at a respective midpoint.

The TCR adjustment slots 572, 576 are aligned along a longitudinal axis (similar to axis L3 of FIG. 4). Midpoints of each of the TCR adjustment slots 572, 576 can be centered on the longitudinal axis. The TCR adjustment slots 572, 576 can be continuously curved. In one aspect, the TCR adjustment slots 572, 576 are mirror images of each other. The TCR adjustment slots 572, 576 are shown having a continuous arc profile. In one aspect, the TCR adjustment slots 572, 576 have a constant radius and extend for an arc length of greater than 90 degrees. The TCR adjustment slots 572, 576 are arranged in a medial area of the resistor relative to the lateral axis, in one aspect. The TCR adjustment slots 572, 576 are symmetrical with each other, in one aspect.

All aspects of the slots 572, 576, 578 may also vary. For example, the slots 572, 576, 578 may each have a different profile, dimension, size, or shape. These may be adjusted or changed based on need or function. The slots 572, 576, 578 may include one or more through openings and one or more openings that do not extend completely through the conductive portions and/or the resistive elements. The slots 572, 576, 578 may be circular, elongated, slotted, non-circular, S-shaped, N-shaped, serpentine, or any other shape as may be selected. The orientation or direction in which any of the slotted openings or elongated slots 572, 576, 578 extend may vary, having differences in height, length, width, etc. In certain aspects, one or more of the slots 572, 576, 578 may be omitted. These variations can be realized in any one or more of the other embodiments described herein.

As shown in FIG. 6, the slots 572, 576, and 578 are all arranged in an interior area of the resistor 510. The openings 572, 576, and 578 are each spaced away from outer edges, such as the lateral and longitudinal edges, or the perimeter of the resistor 510. No portion of the openings 572, 576, and 578 intersect, contact or cross the outer edges, such as the lateral and longitudinal edges, or the perimeter of the resistor 510. In this way, the openings 572, 576, and 578 are surrounded on all sides by parts of the conductive portions, the resistive elements, or combinations of those.

Figure 20:
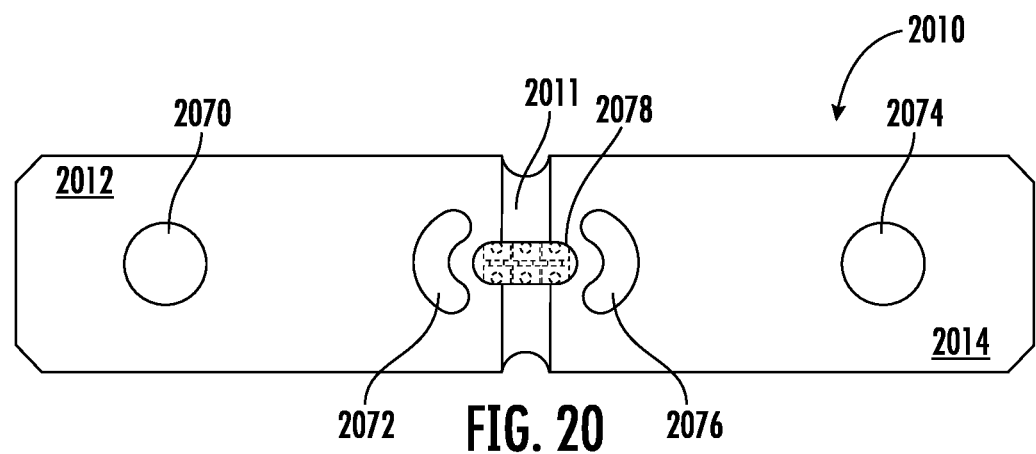
FIG. 20 illustrates a front view of a resistor according to an aspect of the invention.

FIG. 20 illustrates a resistor 2010 that is similar to the resistor 510 of FIG. 6. Resistor 2010 is generally formed of a first resistive element 2011 disposed between a first conductive portion 2012 and a second conductive portion 2014, and a second resistive element 2013 disposed between the second conductive portion 2014 and a third conductive portion 2016. The resistor 2010 includes first, second, and third TCR adjustment slots 2072, 2076, 2078, as well as a first and second outer openings 2070, 2074. The configuration, structure, function, and other characteristics of all elements of resistor 2010 in FIG. 20 are similar to the corresponding elements of resistor 510 in FIG. 6.

As shown in FIG. 20, the openings 2070, 2072, 2074, 2076, and 2078 are all arranged in an interior area of the resistor 2010. The openings 2070, 2072, 2074, 2076, and 2078 are each spaced away from outer edges, such as the lateral and longitudinal edges, or the perimeter of the resistor 2010. No portion of the openings 2070, 2072, 2074, 2076, and 2078 intersect, contact or cross the outer edges, such as the lateral and longitudinal edges, or the perimeter of the resistor 2010. In this way, the openings 2070, 2072, 2074, 2076, and 2078 are surrounded on all sides by parts of the conductive portions, the resistive elements, or combinations of those.

Figure 7:
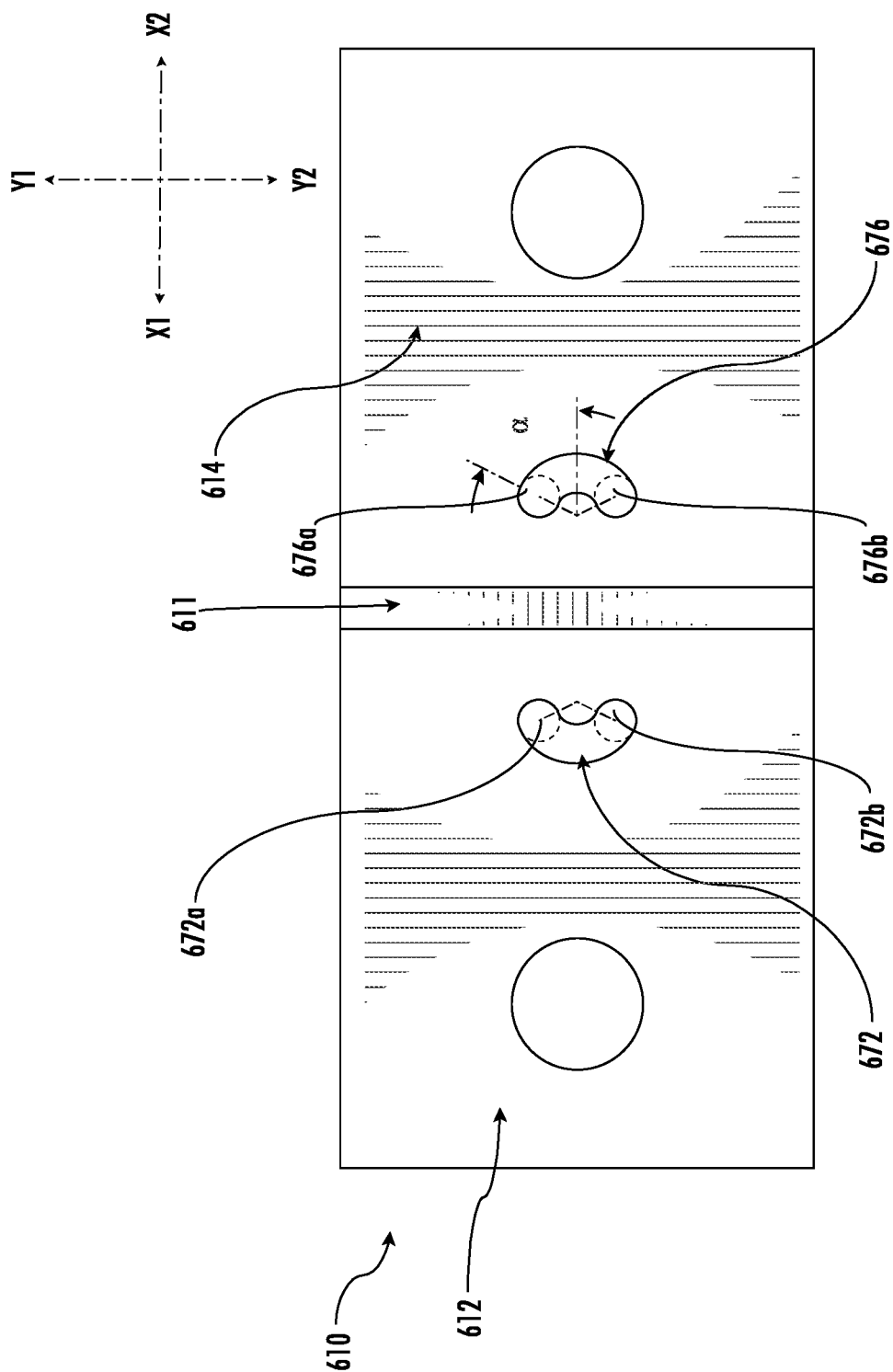
FIG. 7 illustrates a front view of a resistor according to an aspect of the invention.

FIG. 7 illustrates another embodiment of a resistor 610. The resistor 610 is generally formed of a resistive element 611 disposed between a first conductive portion 612 and a second conductive portion 614. A first and second C-shaped slot 672 and 676 are provided on the first and second conductive portions 612, 614, respectively. As shown in FIG. 7, an angle of curvature a of the curved ends 672a, 672b, 676a, 676b is angled relative to a medial or middle portion of the slots 672, 676. In one embodiment, the angle of curvature a is 65 degrees. The angle of curvature a can be 40 degrees to 90 degrees in another aspect. The overall angle defined terminal ends of each of the C-shaped slots 672, 676 is greater than 90 degrees, in one aspect. The C-shaped slots 672 and 676 are concave towards a central region of the resistor 610. This resistor 610 lacks any central opening or holes. All other aspects of the resistor 610 are similar to the aspects described herein with respect to the other embodiments of resistors. In one embodiment, pins are soldered next to the resistive element 611, in an area between the slots 672, 676 and the resistive element 611. This arrangement could be implemented in all of the other embodiments.

The TCR adjustment slots 672, 676 are aligned along a longitudinal axis (similar to axis L3 of FIG. 4). Midpoints of each of the TCR adjustment slots 672, 676 can be centered on the longitudinal axis. The TCR adjustment slots 672, 676 can be continuously curved. In one aspect, the TCR adjustment slots 672, 676 are mirror images of each other. The TCR adjustment slots 672, 676 are shown having a continuous arc profile. In one aspect, the TCR adjustment slots 672, 676 have a constant radius and extend for an arc length of greater than 90 degrees. The TCR adjustment slots 672, 676 are arranged in a medial area of the resistor relative to the lateral axis, in one aspect. The TCR adjustment slots 672, 676 are symmetrical with each other, in one aspect. In one aspect, the TCR adjustment slots 672, 676 are symmetrical about the longitudinal axis of the resistor. The TCR adjustment slots 672, 676 may be intersected by the longitudinal axis at a respective midpoint.

All aspects of the slots 672, 676 may also vary. For example, the slots 672, 676 may each have a different profile, dimension, size, or shape. These may be adjusted or changed based on need or function. The slots 672, 676 may include one or more through openings and one or more openings that do not extend completely through the conductive portions and/or the resistive elements. The slots 672, 676 may be circular, elongated, slotted, non-circular, S-shaped, N-shaped, serpentine, or any other shape as may be selected. The orientation or direction in which any of the slotted openings or elongated slots 672, 676 extend may vary, having differences in height, length, width, etc. In certain aspects, one or more of the slots 672, 676 may be omitted. These variations can be realized in any one or more of the other embodiments described herein.

As shown in FIG. 7, the slots 672, 676 are all arranged in an interior area of the resistor 610. The openings 672, 676 are each spaced away from outer edges, such as the lateral and longitudinal edges, or the perimeter of the resistor 610. No portion of the openings 672, 676 intersect, contact or cross the outer edges, such as the lateral and longitudinal edges, or the perimeter of the resistor 610. In this way, the openings 672, 676 are surrounded on all sides by parts of the conductive portions, the resistive elements, or combinations of those.

FIG. 8 illustrates another embodiment of a resistor 710. The resistor 710 is generally formed of a resistive element 711 disposed between a first conductive portion 712 and a second conductive portion 714. A first and second C-shaped slot 772 and 776 are provided on the first and second conductive portions 712, 714, respectively. As shown in FIG. 7, the angle of the curved ends 772a, 772b, 776a, 776b are angled relative to a medial or middle portion of the slots 772, 776. In one embodiment, the angle of curvature a is 45 degrees. The angle of curvature a can be 20 degrees to 70 degrees in another aspect. A central slot 778 is generally centrally located through the resistor 710, which extends from the first conductive portion 712 through the resistive element 711, and the second conductive portion 714. The central slot 778 may have a "dog bone" or barbell shape, having a larger portion 778a at the left side (i.e. the X1 side), and smaller portion at its central or middle area 778b, and a larger portion 778c at the right side (i.e. the X2 side). The central slot 778 could also be rotated 90 degrees from the position shown in FIG. 8 in another variation. The C-shaped slots 772 and 776 are concave towards a central region of the resistor 710 and towards the central slot 778. All other aspects of the resistor 710 are similar to the aspects described herein with respect to the other embodiments of resistors.

The TCR adjustment slots 772, 776 are aligned along a longitudinal axis (similar to axis L3 of FIG. 4). Midpoints of each of the TCR adjustment slots 772, 776 can be centered on the longitudinal axis. The TCR adjustment slots 772, 776 can be continuously curved. In one aspect, the TCR adjustment slots 772, 776 are mirror images of each other. The TCR adjustment slots 772, 776 are shown having a continuous arc profile. In one aspect, the TCR adjustment slots 772, 776 have a constant radius and extend for an arc length of greater than 90 degrees. The TCR adjustment slots 772, 776 are arranged in a medial area of the resistor relative to the lateral axis, in one aspect. The TCR adjustment slots 772, 776 are symmetrical with each other, in one aspect. In one aspect, slot 772 is a first TCR adjustment slot, slot 776 is a second TCR adjustment slot, and slot 778 is a third TCR adjustment slot. In one aspect, the first and second TCR adjustment slots 772, 776 are symmetrical about the longitudinal axis of the resistor. The first and second TCR adjustment slots 772, 776 may be intersected by the longitudinal axis at a respective midpoint.

All aspects of the slots 772, 776, 778 may also vary. For example, the slots 772, 776, 778 may each have a different profile, dimension, size, or shape. These may be adjusted or changed based on need or function. The slots 772, 776, 778 may include one or more through openings and one or more openings that do not extend completely through the conductive portions and/or the resistive elements. The slots 772, 776, 778 may be circular, elongated, slotted, non-circular, S-shaped, N-shaped, serpentine, or any other shape as may be selected. The orientation or direction in which any of the slotted openings or elongated slots 772, 776, 778 extend may vary, having differences in height, length, width, etc. In certain aspects, one or more of the slots 772, 776, 778 may be omitted. These variations can be realized in any one or more of the other embodiments described herein.

As shown in FIG. 8, the slots 772, 776, 778 are all arranged in an interior area of the resistor 710. The openings 772, 776, 778 are each spaced away from outer edges, such as the lateral and longitudinal edges, or the perimeter of the resistor 710. No portion of the openings 772, 776, 778 intersect, contact or cross the outer edges, such as the lateral and longitudinal edges, or the perimeter of the resistor 710. In this way, the openings 772, 776, 778 are surrounded on all sides by parts of the conductive portions, the resistive elements, or combinations of those.

Figure 9:
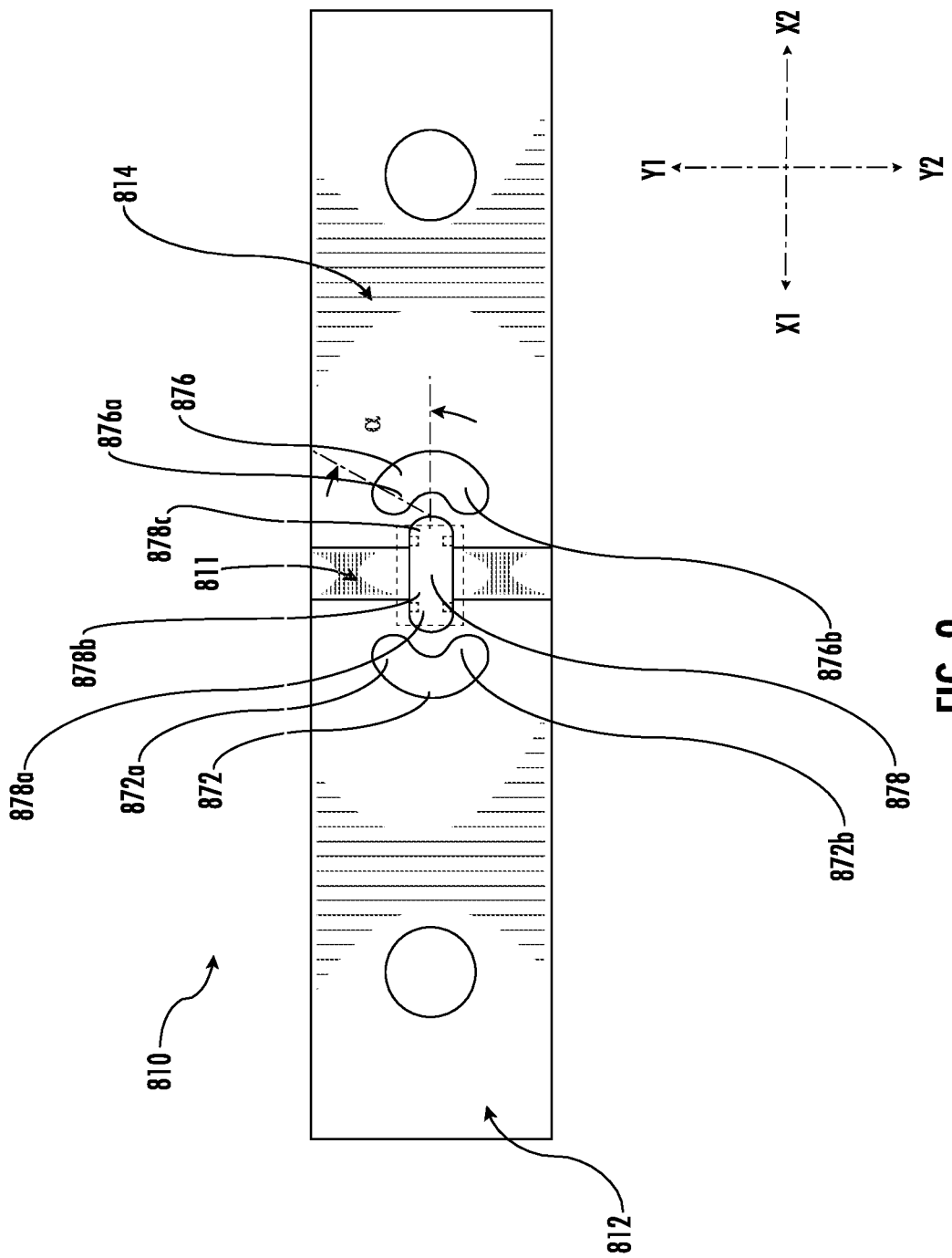
FIG. 9 illustrates a front view of a resistor according to an aspect of the invention.

FIG. 9 illustrates another embodiment of a resistor 810. The resistor 810 is generally formed of a resistive element 811 disposed between a first conductive portion 812 and a second conductive portion 814. A first slot 872 is defined on the first conductive portion 812. A central slot 878 is defined with a first end 878a in the first conductive portion 812, a middle portion 878b defined in the resistive element 811, and a second end 878c in the second conductive portion 814. A second slot 876 is defined on the second conductive portion 814. As compared to FIG. 8, the resistor 810 in FIG. 9 includes a straight or linear central slot 872. The curved ends 872a, 872b, 876a, 876b of the slots 872, 876 each partially surround respective ends of the central opening 878. The C-shaped slots 872 and 876 are concave towards a central region of the resistor 810 and towards the central opening 878. All other aspects of the resistor 810 are similar to the aspects described herein with respect to the other embodiments of resistors.

The TCR adjustment slots 872, 876 are aligned along a longitudinal axis (similar to axis L3 of FIG. 4). Midpoints of each of the TCR adjustment slots 872, 876 can be centered on the longitudinal axis. The TCR adjustment slots 872, 876 can be continuously curved. In one aspect, the TCR adjustment slots 872, 876 are mirror images of each other. The TCR adjustment slots 872, 876 are shown having a continuous arc profile. In one aspect, the TCR adjustment slots 872, 876 have a constant radius of curvature and extend for an arc length of greater than 90 degrees. The TCR adjustment slots 872, 876 are arranged in a medial area of the resistor relative to the lateral axis, in one aspect. The TCR adjustment slots 872, 876 are symmetrical with each other, in one aspect. In one aspect, slot 872 is a first TCR adjustment slot, slot 876 is a second TCR adjustment slot, and slot 878 is a third TCR adjustment slot. In one aspect, the first and second TCR adjustment slots 872, 876 are symmetrical about the longitudinal axis of the resistor. The first and second TCR adjustment slots 872, 876 may be intersected by the longitudinal axis at a respective midpoint.

All aspects of the slots 872, 876, 878 may also vary. For example, the slots 872, 876, 878 may each have a different profile, dimension, size, or shape. These may be adjusted or changed based on need or function. The slots 872, 876, 878 may include one or more through openings and one or more openings that do not extend completely through the conductive portions and/or the resistive elements. The slots 872, 876, 878 may be circular, elongated, slotted, non-circular, S-shaped, N-shaped, serpentine, or any other shape as may be selected. The orientation or direction in which any of the slotted openings or elongated slots 872, 876, 878 extend may vary, having differences in height, length, width, etc. In certain aspects, one or more of the slots 872, 876, 878 may be omitted. These variations can be realized in any one or more of the other embodiments described herein.

As shown in FIG. 9, the slots 872, 876, 878 are all arranged in an interior area of the resistor 810. The openings 872, 876, 878 are each spaced away from outer edges, such as the lateral and longitudinal edges, or the perimeter of the resistor 810. No portion of the openings 872, 876, 878 intersect, contact or cross the outer edges, such as the lateral and longitudinal edges, or the perimeter of the resistor 810. In this way, the openings 872, 876, 878 are surrounded on all sides by parts of the conductive portions, the resistive elements, or combinations of those.

Upper and lower notches in the resistive elements, as best shown in FIGS. 5 and 6, may be used to adjust the base value of the resistor, which also will affect the TCR value. These features and the shadowing feature can be "tuned" or adjusted in conjunction with each other to achieve a desired value or result.

Figure 10:
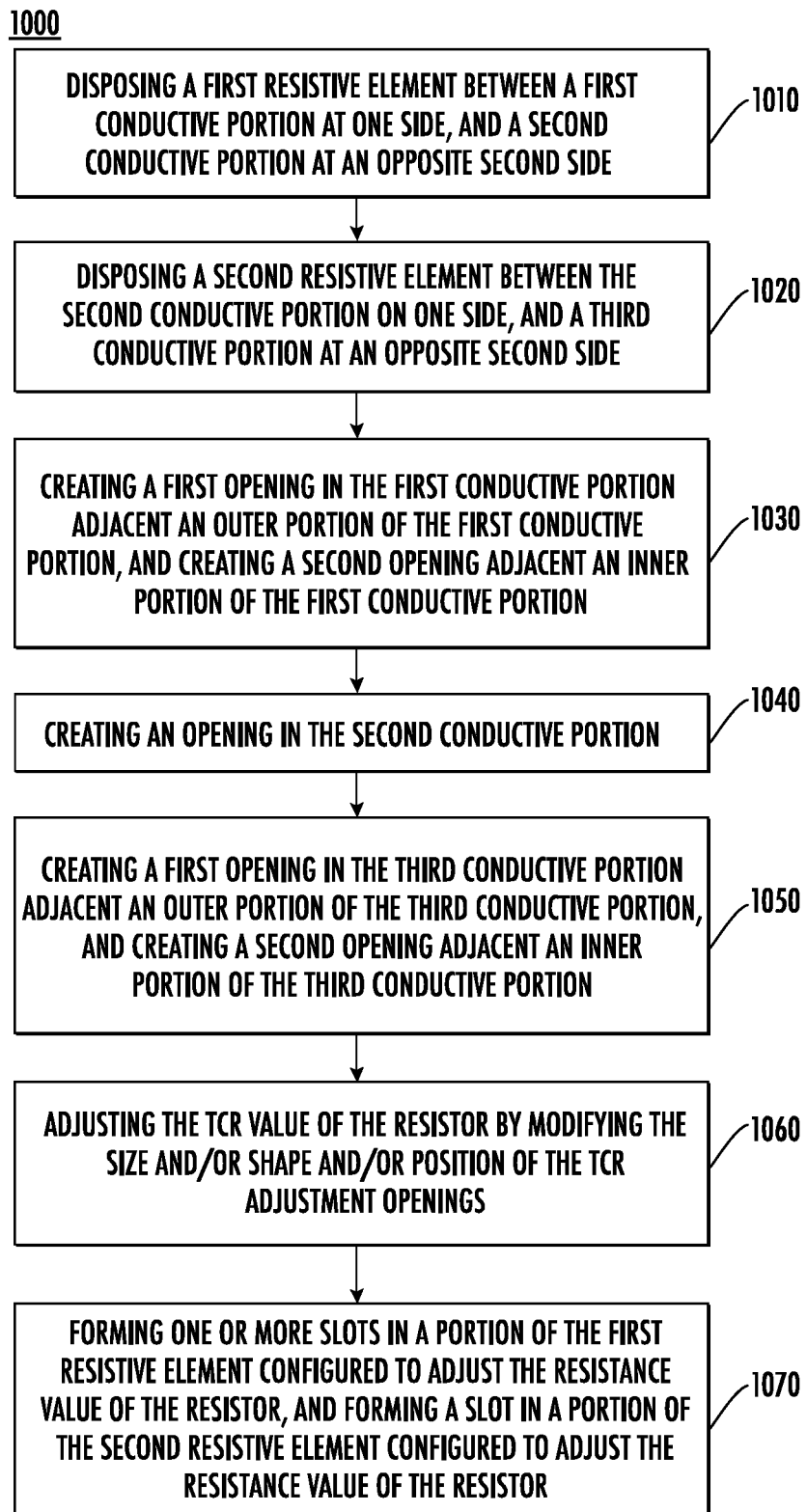
FIG. 10 illustrates a flow chart according to one aspect of the invention.

A method 1000 of making a resistor according to aspects of the invention having a first resistive element and a second resistive element is provided. The method 1000 comprises at least the following steps, as shown in the flowchart of FIG. 10.

At step 1010, a first resistive element is disposed between a first conductive portion at one side, and a second conductive portion at an opposite second side.

At step 1020, a second resistive element is disposed between the second conductive portion on one side, and a third conductive portion at an opposite second side.

At step 1030, a first opening is created in the first conductive portion adjacent an outer portion of the first conductive portion, and a second opening is created adjacent an inner portion of the first conductive portion. The second opening in the first conductive portion is provided as a TCR adjustment opening or slot.

At step 1040, an opening is created in the second conductive portion. The opening in the second conductive portion is provided as a TCR adjustment opening slot.

At step 1050, a first opening is created in the third conductive portion adjacent an outer portion of the third conductive portion, and a second opening is created adjacent an inner portion of the third conductive portion. The second opening in the third conductive portion is provided as a TCR adjustment opening or slot.

At step 1060, the TCR value of the resistor may be adjusted by modifying the size and/or shape and/or position of the TCR adjustment openings or slots. The sizes, shapes and positions of the various TCR adjustment openings or slots may be as described previously herein.

At step 1070, one or more slots may be formed in a portion of the first resistive element configured to adjust the resistance value of the resistor. A slot may be formed in a portion of the second resistive element configured to adjust the resistance value of the resistor.

Figure 11:
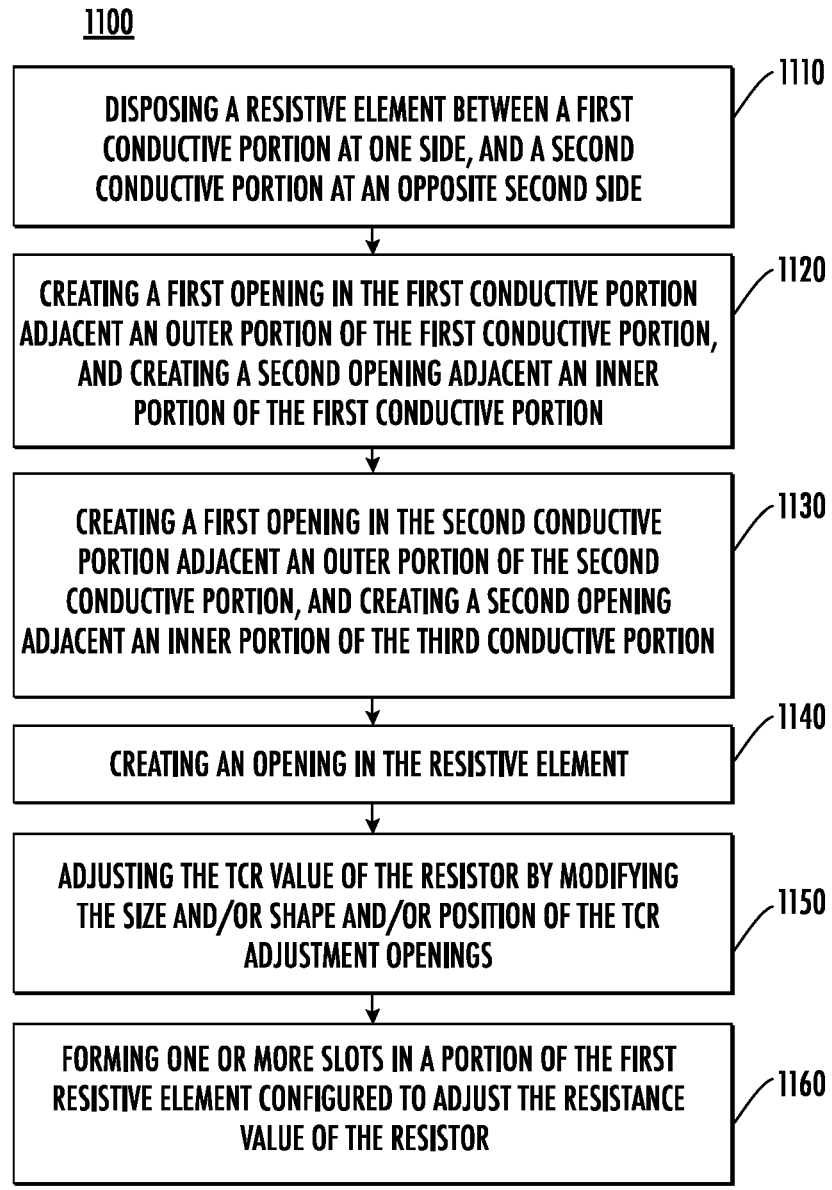
FIG. 11 illustrates another flow chart according to another aspect of the invention.

A method 1100 of making a resistor according to aspects of the invention having a resistive element is provided. The method 1100 comprises at least the following steps, as shown in the flowchart of FIG. 11.

At step 1110, a resistive element is disposed between a first conductive portion at one side, and a second conductive portion at an opposite second side.

At step 1120, a first opening is created in the first conductive portion adjacent an outer portion of the first conductive portion, and a second opening is created adjacent an inner portion of the first conductive portion. The second opening in the first conductive portion is provided as a TCR adjustment opening or slot.

At step 1130, a first opening is created in the second conductive portion adjacent an outer portion of the second conductive portion, and a second opening is created adjacent an inner portion of the third conductive portion. The second opening in the third conductive portion is provided as a TCR adjustment opening or slot.

At step 1140, an opening is created in the resistive element. The opening is provided as a TCR adjustment opening or slot. The opening may be provided in the resistive element and may also extend through the first conductive portion and the second conductive portion.

At step 1150, the TCR value of the resistor may be adjusted by modifying the size and/or shape and/or position of the TCR adjustment openings or slots. The sizes, shapes and positions of the various TCR adjustment openings or slots may be as described previously herein.

At step 1160, one or more slots may be formed in a portion of the first resistive element configured to adjust the resistance value of the resistor.

Figure 27:
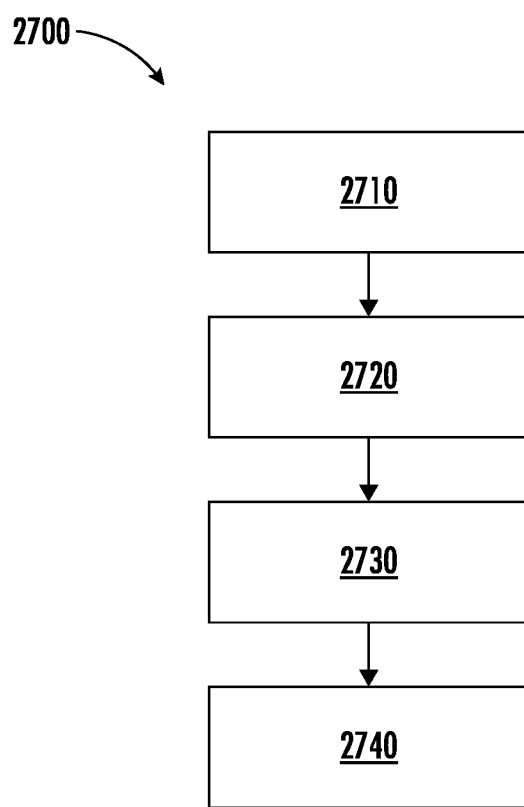
FIG. 27 illustrates a flow chart according to one aspect of the invention.

FIG. 27 illustrates a method 2700 of forming a resistor according to another aspect. As shown in FIG. 27, step 2710 includes providing a first resistive element disposed between a first conductive portion and a second conductive portion. Step 2720 includes forming a first TCR opening in the first conductive portion and forming a second TCR opening in the second conductive portion. In one aspect, the first TCR adjustment opening and the second TCR adjustment opening are each formed as an elongated slot formed with a continuous arc profile.

Step 2730 includes adjusting at least one characteristic of at least one of the first TCR opening or the second TCR opening to provide for a final TCR value, or an adjusted TCR value, of the resistor. This step can include optimization processes that are configured to adjust and configure the TCR value of the resistor. In one aspect, optimizing the TCR value of the resistor can be achieved through various processes and methods, such as experimentation, trials, and prototyping, which may include various types of monitoring, sensing and feedback.

Step 2740 includes forming a third TCR adjustment opening. In one aspect, the third TCR adjustment opening is partially defined on each of the first resistive element, the first conductive portion, and the second conductive portion. The third TCR adjustment opening is configured to adjust the TCR value of the resistor.

Figure 13A:
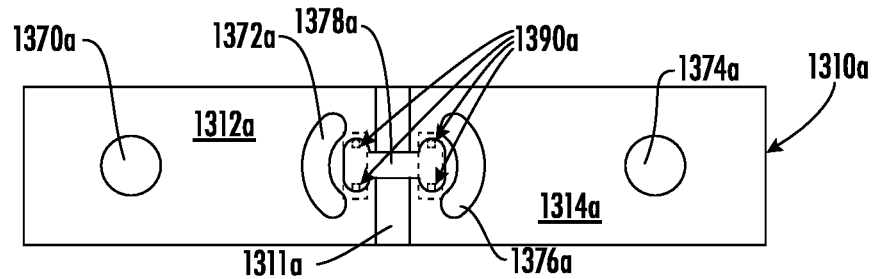
FIG. 13A illustrates a front view of another embodiment of a resistor according to an aspect of the invention.
Figure 13B:
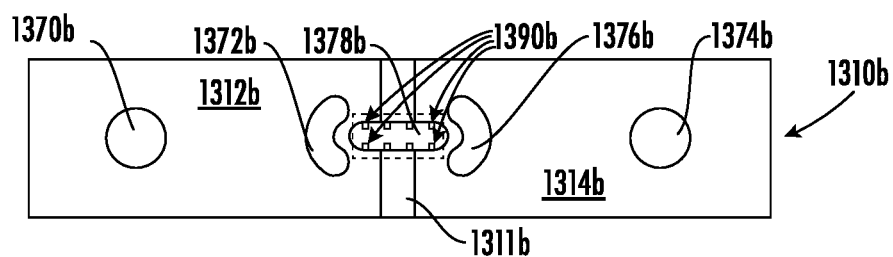
FIG. 13B illustrates a front view of another embodiment of a resistor according to an aspect of the invention.
Figure 13C:
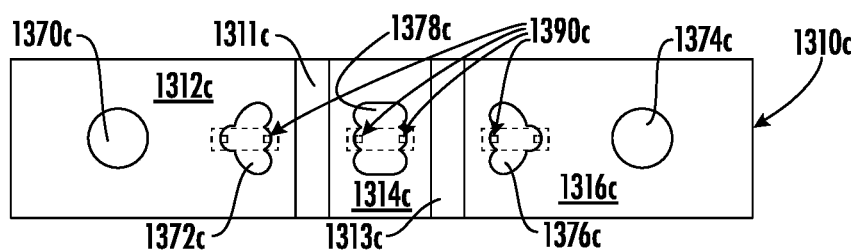
FIG. 13C illustrates a front view of another embodiment of a resistor according to an aspect of the invention.
Figure 13D:
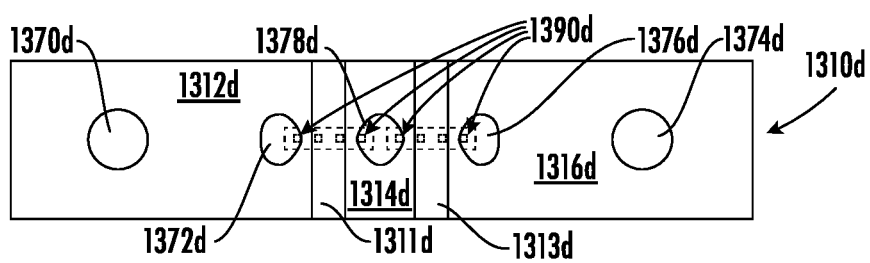
FIG. 13D illustrates a front view of another embodiment of a resistor according to an aspect of the invention.
Figure 13E:
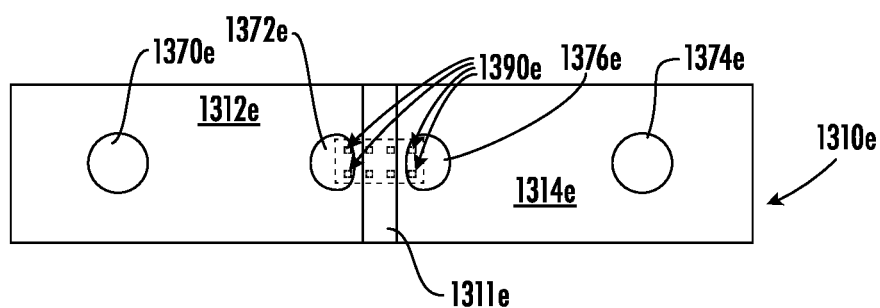
FIG. 13E illustrates a front view of another embodiment of a resistor according to an aspect of the invention.

FIGS. 13A-13E illustrate various embodiments of resistors 1310a-1310e. In FIGS. 13A, 13B, and 13E, first conductive portions 1312a, 1312b, 1312e, second conductive portions 1314a, 1314b, 1324e are provided with a resistive element 1311a, 1311b, 1311c therebetween. In FIGS. 13C and 13D, first conductive portions 1312c, 1312d, second conductive portions 1314c, 1314d, and third conductive portions 1316c, 1316d are provided and two resistive elements 1311c, 1313c, 1311d, 1313d are sandwiched between respective ones of the conductive portions. In FIGS. 13A-13E, a first plurality of voltage sense points 1390a, second plurality of voltage sense points 1390b, third plurality of voltage sense points 1390c, fourth plurality of voltage sense points 1390d, and fifth plurality of voltage sense points 1390e are provided in respective areas of the openings or slots 1378a, 1378b, 1372c, 1378c, 1376c, 1372d, 1378d, 1376d, 1372e, 1376e. One of ordinary skill in the art would appreciate and understand that other openings or slots of the resistors can include voltage sense points. In one aspect, the voltage sense points are configured to define regions or locations in which voltage sensing elements, such as sensing pins, can be arranged. The voltage sense points can be defined via openings or holders defined in brackets, bracket assemblies, headers, or header assemblies. Additionally, the left and right sides of the resistors 1310a-1310e provide current connections.

As shown in FIGS. 13A-13E, the various openings are all arranged in an interior area of the resistor 1310a-1310e. The openings are each spaced away from outer edges, such as the lateral and longitudinal edges, or the perimeter of the resistor 1310a-1310e. No portion of the openings intersect, contact or cross the outer edges, such as the lateral and longitudinal edges, or the perimeter of the resistor 1310a-1310e. In this way, the openings are surrounded on all sides by parts of the conductive portions, the resistive elements, or combinations of those.

Figure 14:
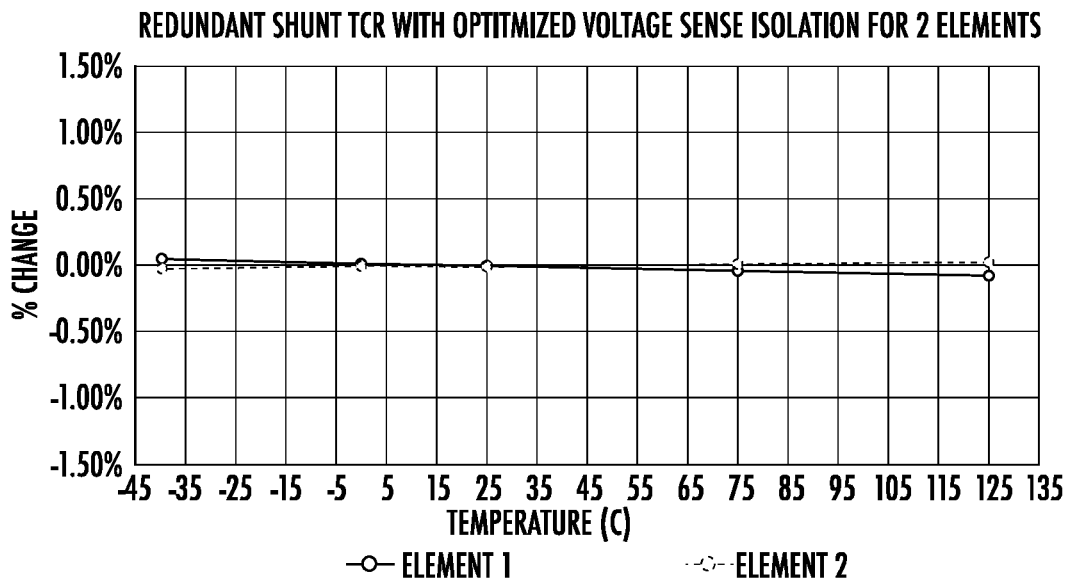
FIG. 14 is a chart illustrating measurements for a redundant shunt TCR with optimized voltage sense isolation for two elements.

FIG. 14 is a chart illustrating measurements for a redundant TCR adjustable shunt with optimized voltage sense isolation having two resistive elements. As shown in FIG. 14, Elements 1 and 2 generally have a 0% or nearly 0% change in a range of temperatures from −40 degrees Celsius to 125 degrees Celsius.

Figure 15:
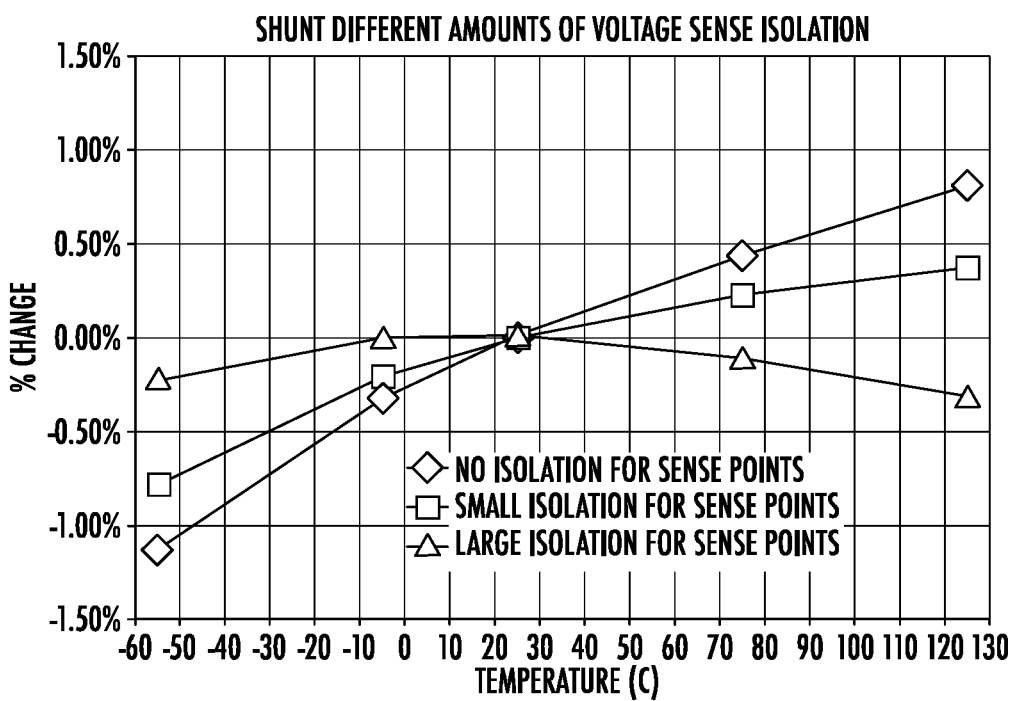
FIG. 15 is a chart illustrating measurements for a shunt with different amounts of voltage sense isolation.

FIG. 15 is a chart illustrating measurements for a shunt with different amounts or levels of voltage sense isolation. FIG. 15 illustrates three different sets of measurements, including situations with: no isolation for sense points; small isolation for sense points; and large isolation for sense points. As shown in FIG. 15, each of the three sets of data essentially converge to a 0% change at roughly 25 degrees Celsius. The percentage change generally stays negative for the situation with large isolation for sense points at negative temperatures and high temperatures. In contrast, in the situation with no isolation for sense points, the percentage change starts below −1.00% around −55 degrees Celsius and increases to above 0.75% at extreme high temperatures, i.e. roughly 135 degrees Celsius. In the situation with small isolation for sense points, at roughly −55 degrees Celsius, the percentage change is roughly −0.75% and increases to roughly 0.40% at extreme high temperatures, i.e. roughly 135 degrees Celsius.

Figure 16:
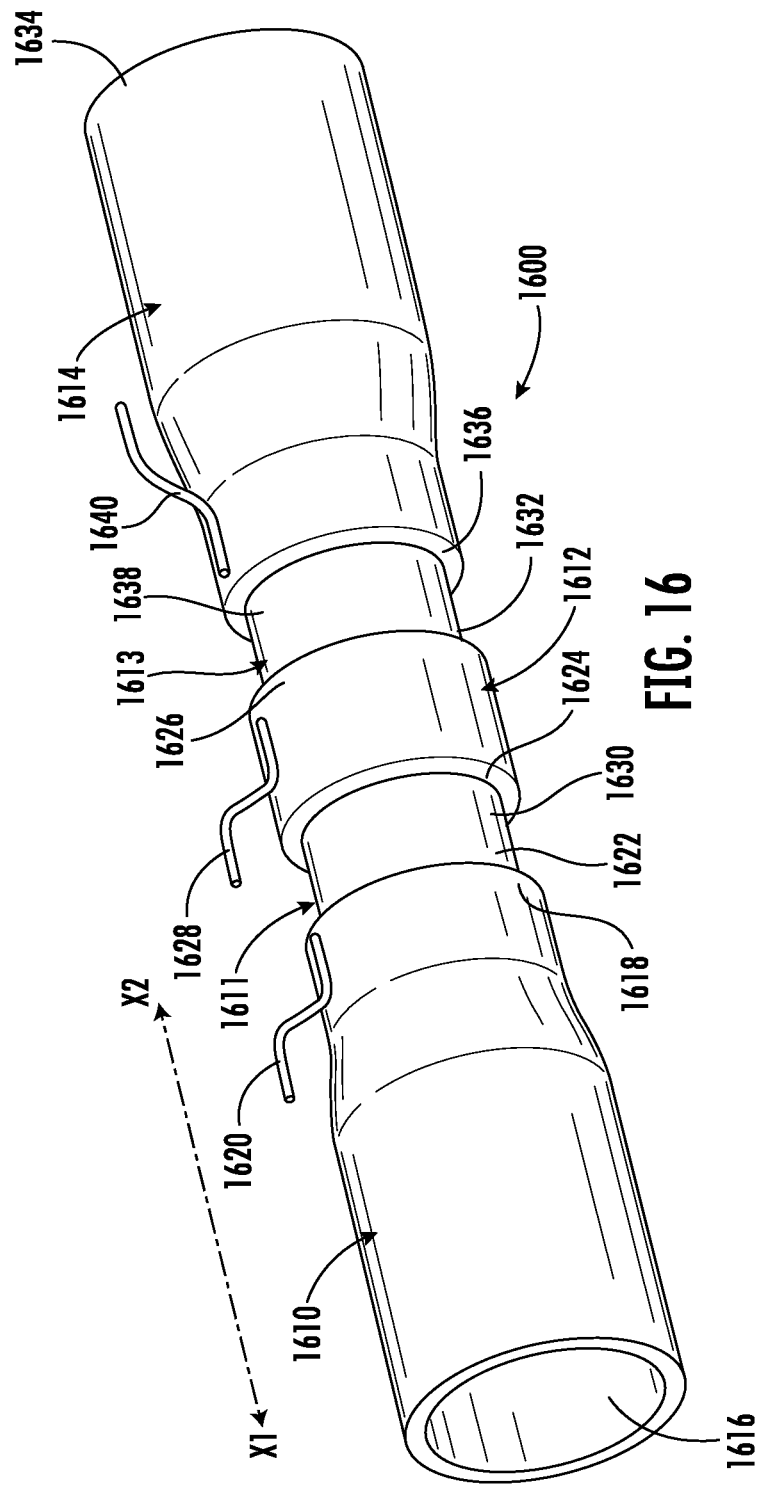
FIG. 16 illustrates a cylindrical resistor according to an aspect of the invention.

In another aspect of the invention, a shunt resistor may be configured in a generally cylindrical arrangement. As show in FIG. 16, such a cylindrical shunt 1600 comprises a first generally tubular conductive portion 1610, a first resistive element 1611 that is generally cylindrical in shape, a second or central generally tubular conductive portion 1612, a second resistive element 1613 that is generally cylindrical in shape, and a third generally tubular conductive portion 1614. The shunt resistor of FIG. 16 improves upon the arrangements shown in U.S. Pat. No. 8,344,846, the entire contents of which is incorporated by reference herein.

The first generally tubular conductive portion 1610 has a first open end 1616 facing in the first direction X1, and a second open end 1618 facing in the second direction X2 having an opening configured to receive the first resistive element 1611. A current sense lead 1620 may extend from or otherwise be attached or connected to an outer surface of a wall of the first generally tubular conductive portion 1610 adjacent the second end. The first open end 1616 may be configured to attach to an external connection, such as a cable.

The first resistive element 1611 may be formed as a cylindrical wire formed from a resistive material as described herein. The length and other dimensions of the first resistive element 1611 may be selected based on need, function or performance. The first resistive element 1611 is connected at a first end 1622 to the second open end 1618 of the first generally tubular conductive portion 1610, which is configured to receive and be connected to the first end 1622 of the first resistive element 1611. The connection may be by, for example, welding, such as magnetic pulse welding.

The second generally tubular conductive portion 1612 has a first open end 1624 facing in the first direction X1, and a second open end 1626 facing in the second direction X2, and may be essentially a ring shape. A current sense lead 1628 may extend from or otherwise be attached or connected to an outer surface of a wall of the second generally tubular conductive portion 1612. The first open end 1624 is configured to receive and connect to a second end 1630 of the first resistive element 1611. The connection may be by, for example welding, such as magnetic pulse welding.

The second resistive element 1613 may be formed as a cylindrical wire formed from a resistive material as described herein. The length and other dimensions of the second resistive element may be selected based on need, function or performance. The second resistive element 1613 is connected at a first end 1632 to the second open end 1626 of the second generally tubular conductive portion 1612. The connection may be by, for example welding, such as magnetic pulse welding.

The third generally tubular conductive portion 1614 has a first open end 1634 facing in the first direction X2, and a second open end 1636 facing in the second direction X1 and having an opening configured to receive and to be connected to a second end 1638 of the second resistive element 1613. A current sense lead 1640 may extend from or otherwise be attached or connected to an outer surface of a wall of the third generally tubular conductive portion 1614 adjacent the second end 1636. The first open end 1634 may be configured to attach to an external connection, such as a cable.

Regarding the cylindrical shunt aspect, TCR compensation may be provided based on reduced distances due to various elements of the design. For example, adjustments of the thickness of the device provide in part for TCR compensation. TCR compensation may also be provided due to placement of the voltage connections or leads, or sense connections or leads, with respect to transitional edges between conductive portions and the multiple resistive elements. The inclusion of multiple resistive elements, i.e. the redundant configuration, may also improve TCR compensation.

Adjustment of the resistance value can be made by a lathe, abrasion, or lasering operation that reduces the diameter of the exposed resistant element wires or by removing conductive material such as copper from the end of each tubular portion effectively lengthening the resistive element. In addition, resistance can be adjusted by adding termination material (such as copper or other conductive material) back to the resistive element such as by welding. Slots or openings may also be provided at various locations, to allow for additional TCR adjustments and fine tuning.

FIGS. 17A-17M illustrate multiple variations of resistors that function the same as the other embodiments described herein and are provided to show various configurations.

Each of the resistors 1710a-1710m in FIGS. 17A-17M includes a first conductive portion 1712a-1712m (i.e. the left-most conductive portion), a second conductive portion 1714a-1714m (i.e. the middle or medial conductive portion), and a third conductive portion 1716a-1716m (i.e. the right-most conductive portion). A first resistive element 1711a-1711m is arranged between the first conductive portion 1712a-1712m and the second conductive portion 1714a-1714m, and a second resistive element 1713a-1713m is arranged between the second conductive portion 1714a-1714m and the third conductive portion 1716a-1716m. Each of the resistors 1710a-1710m include TCR adjustment openings or slots, or TCR compensation openings or slots, which may include a first TCR adjustment opening or slot 1772a-1772m, a second TCR adjustment opening or slot 1776a-1776m, and a third TCR adjustment opening or slot 1778a-1778m.

Figure 17A:
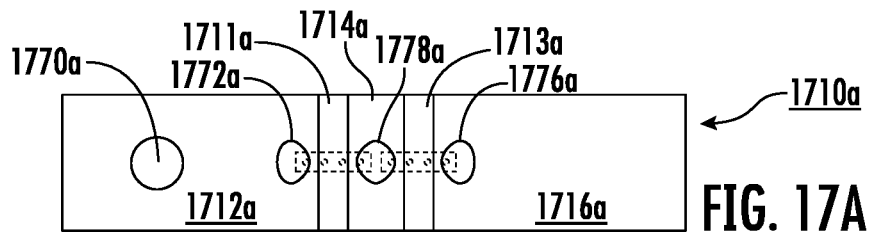
FIGS. 17A-17M illustrate variations of resistors according to multiple aspects of the invention.

FIG. 17A illustrates an aspect including a first, second and third conductive portion 1712a, 1714a, 1716a and a first and a second resistive element 1711a, 1713a. In this embodiment, the left-most conductive portion 1712a includes a current connection opening 1770a and the right-most conductive portion 1716a lacks a current connection opening. All other aspects of this embodiment are otherwise identical to the embodiment disclosed in FIG. 1.

Figure 17B:
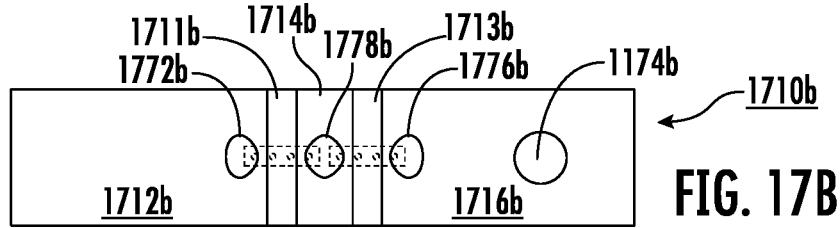

FIG. 17B illustrates an aspect including a first, second and third conductive portion 1712b, 1714b, 1716b and a first and a second resistive element 1711b, 1713b. In this embodiment, the left-most conductive portion 1712b lacks a current connection opening and the right-most conductive portion 1713 includes a current connection opening 1774b. All other aspects of this embodiment are otherwise identical to the embodiment disclosed in FIG. 1.

Figure 17C:
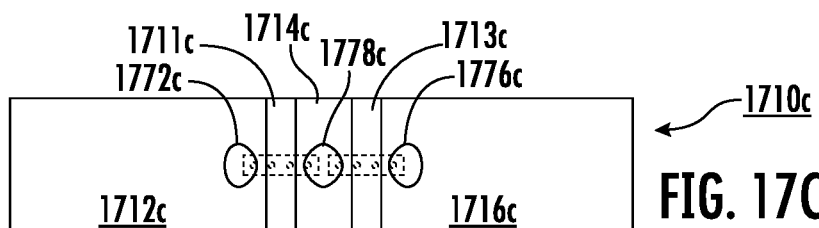

FIG. 17C illustrates an aspect including a first, second and third conductive portion 1712c, 1714c, 1716c and a first and a second resistive element 1711c, 1713c. In this embodiment, the left-most conductive portion 1712c and the right-most conductive portion 1716c both lack current connection openings. All other aspects of this embodiment are otherwise identical to the embodiment disclosed in FIG. 1.

Figure 17D:
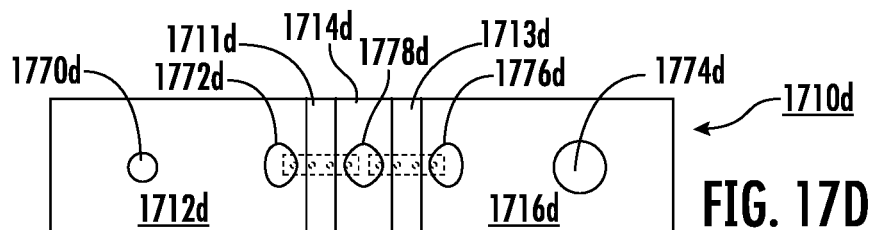

FIG. 17D illustrates an aspect including a first, second and third conductive portion 1712d, 1714d, 1716d and a first and a second resistive element 1711d, 1713d. In this embodiment, the left-most conductive portion 1712d includes a first current connection opening 1770d and the right-most conductive portion 1716d includes a second current connection opening 1774d. The second current connection opening 1774d is larger than the first current connection opening 1770d. In one aspect, the second current connection opening 1774d is at least 100% larger than the first current connection opening 1770d. All other aspects of this embodiment are otherwise identical to the embodiment disclosed in FIG. 1.

Figure 17E:
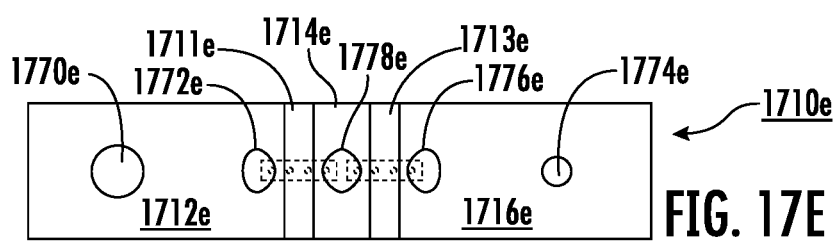

FIG. 17E illustrates an aspect including a first, second and third conductive portion 1712e, 1714e, 1716e and a first and a second resistive element 1711e, 1713e. In this embodiment, the left-most conductive portion 1712e includes a first current connection opening 1770e and the right-most conductive portion 1716e includes a second current connection opening 1774e. The second current connection opening 1774e is smaller than the first current connection opening 1770e. In one aspect, the second current connection opening 1774e is at least half the size of the first current connection opening 1770e. All other aspects of this embodiment are otherwise identical to the embodiment disclosed in FIG. 1.

Figure 17F:
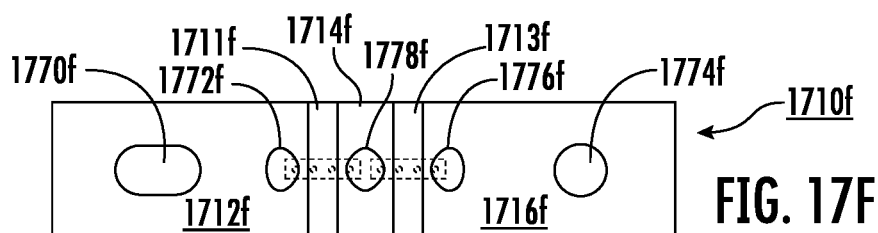

FIG. 17F illustrates an aspect including a first, second and third conductive portion 1712f, 1714f, 1716f and a first and a second resistive element 1711f, 1713f. In this embodiment, the left-most conductive portion 1712f includes a first current connection opening 1770f and the right-most conductive portion 1716f includes a second current connection opening 1774f. The first current connection opening 1770f has an oblong or elongated circular shape (i.e. a pill shape or rectangular ellipse), such as a slotted configuration, and the second current connection opening 1774f has a perfect circular or round shape. All other aspects of this embodiment are otherwise identical to the embodiment disclosed in FIG. 1.

Figure 17G:
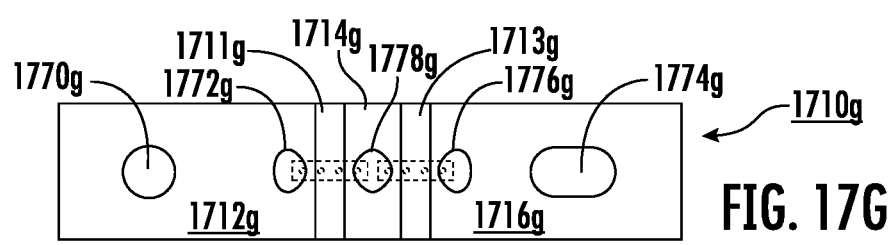

FIG. 17G illustrates an aspect including a first, second and third conductive portion 1712g, 1714g, 1716g and a first and a second resistive element 1711g, 1713g. In this embodiment, the left-most conductive portion 1712g includes a first current connection opening 1770g and the right-most conductive portion 1716g includes a second current connection opening 1774g. The second current connection opening 1774g has an oblong or elongated circular shape (i.e. a pill shape or rectangular ellipse), such as a slotted configuration, and the first current connection opening 1770g has a perfect circular or round shape. All other aspects of this embodiment are otherwise identical to the embodiment disclosed in FIG. 1.

Figure 17H:
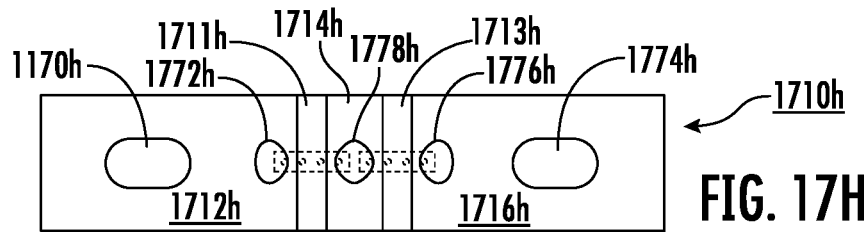

FIG. 17H illustrates an aspect including a first, second and third conductive portion 1712h, 1714h, 1716h and a first and a second resistive element 1711h, 1713h. In this embodiment, the left-most conductive portion 1712h includes a first current connection opening 1770h and the right-most conductive portion 1716h includes a second current connection opening 1774h. The first current connection opening 1770h and the second current connection opening 1774h are identical and each have an oblong or elongated circular shape (i.e. a pill shape or rectangular ellipse), such as a slotted configuration. All other aspects of this embodiment are otherwise identical to the embodiment disclosed in FIG. 1.

Figure 17I:
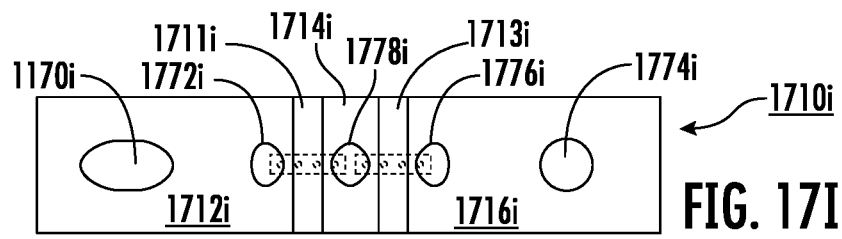

FIG. 17I illustrates an aspect including a first, second and third conductive portion 1712i, 1714i, 1716i and a first and a second resistive element 1711*i*, 1713*i*. In this embodiment, the left-most conductive portion 1712*i* includes a first current connection opening 1770*i* and the right-most conductive portion 1716*i* includes a second current connection opening 1774*i*. The first current connection opening 1770*i* has an elliptical shape and the second current connection opening 1774*i* has a perfect circular or round shape. All other aspects of this embodiment are otherwise identical to the embodiment disclosed in FIG. 1.

Figure 17J:
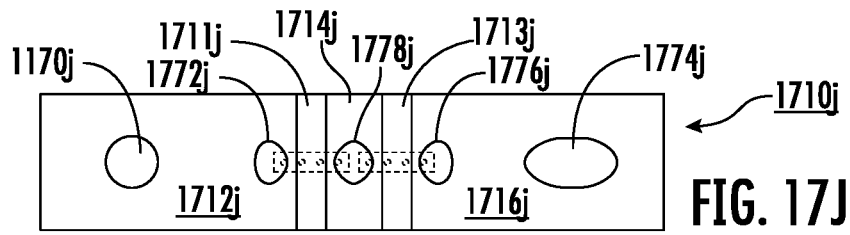

FIG. 17J illustrates an aspect including a first, second and third conductive portion 1712*j*, 1714*j*, 1716*j* and a first and a second resistive element 1711*j*, 1713*j*. In this embodiment, the left-most conductive portion 1712*j* includes a first current connection opening 1770*j* and the right-most conductive portion 1716*j* includes a second current connection opening 1774*j*. The second current connection opening 1774*j* has an elliptical shape and the first current connection opening 1770*j* has a perfect circular or round shape. All other aspects of this embodiment are otherwise identical to the embodiment disclosed in FIG. 1.

Figure 17K:
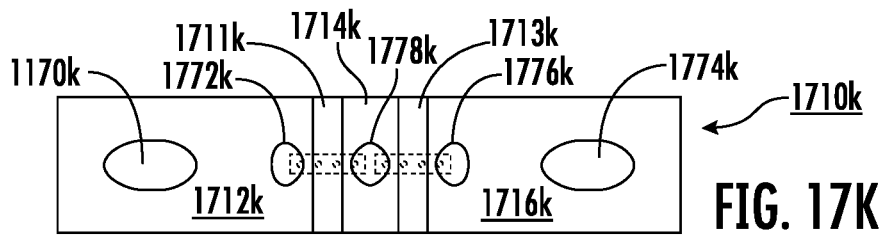

FIG. 17K illustrates an aspect including a first, second and third conductive portion 1712*k*, 1714*k*, 1716*k* and a first and a second resistive element 1711*k*, 1713*k*. In this embodiment, the left-most conductive portion 1712*k* includes a first current connection opening 1770*k* and the right-most conductive portion 1716*k* includes a second current connection opening 1774*k*. The first current connection opening 1770*k* and the second current connection opening 1774*k* are identical and each have an elliptical shape. All other aspects of this embodiment are otherwise identical to the embodiment disclosed in FIG. 1.

Figure 17L:
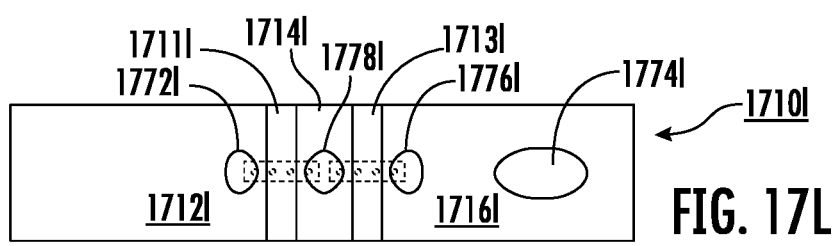

FIG. 17L illustrates an aspect including a first, second and third conductive portion 17121, 17141, 17161 and a first and a second resistive element 17111, 17131. In this embodiment, the left-most conductive portion 17121 lacks any current connection opening and the right-most conductive portion 17161 includes a current connection opening 17741. The current connection opening 17741 of the right-most conductive portion 17161 has an elliptical shape. All other aspects of this embodiment are otherwise identical to the embodiment disclosed in FIG. 1.

Figure 17M:
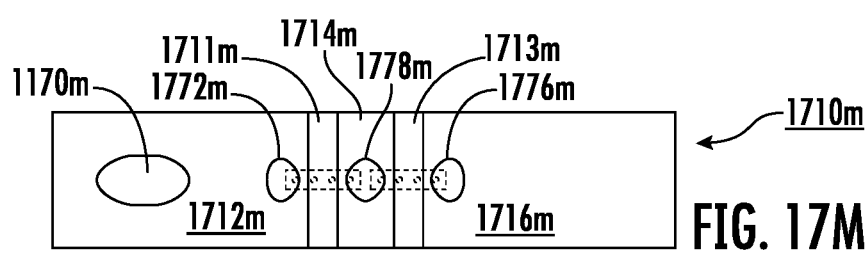

FIG. 17M illustrates an aspect including a first, second and third conductive portion 1712*m*, 1714*m*, 1716*m* and a first and a second resistive element 1711*m*, 1713*m*. In this embodiment, the right-most conductive portion 1716*m* lacks any current connection opening and the left-most conductive portion 1712*m* includes a current connection opening 1770*m*. The current connection opening 1770*m* of the left-most conductive portion 1712*m* has an elliptical shape. All other aspects of this embodiment are otherwise identical to the embodiment disclosed in FIG. 1.

As shown in FIGS. 17A-17M, the various openings are all arranged in an interior area of the resistor 1710*a*-1710*m*. The openings are each spaced away from outer edges, such as the lateral and longitudinal edges, or the perimeter of the resistor 1710*a*-1710*m*. No portion of the openings intersect, contact or cross the outer edges, such as the lateral and longitudinal edges, or the perimeter of the resistor 1710*a*-1710*m*. In this way, the openings are surrounded on all sides by parts of the conductive portions, the resistive elements, or combinations of those.

FIGS. 21A-24B generally illustrate configurations in which sensing pins are used in conjunction with resistors. These configurations may be used, in one aspect, in order to provide sensing pins within a certain voltage range of an analog to digital converter (ADC) of the ADC's analog ground reference input. In one aspect, a sense circuit may have high impedance inputs to limit current flow. The current flow within a sense circuit causes voltage drops that will affect the voltage reading of the ADC. One aspect achieving an optimized circuit configuration is through the use of an additional pin connected to the ground side of the battery shunt, that is arranged outside of the main sensing circuit. In one aspect, this design allows for a low voltage differential between the ADC analog ground reference and the sense pin ground, and thereby the current flow through the sense circuit.

For example, if the components for the sensing device use 10 mA of current when powered, then 10 mA is passed through the ground pin. If there is a minimal 1 mΩ of resistance in between the PCB pin connection and the shunt itself, it creates a 10 ρV drop. When sensing a 100 μΩ shunt, a 10 ρV drop equates to a 100 mA reading error. This error will vary part to part based on the PCB to shunt resistance and will vary within a single part over time based on the device power drawn under different operating modes. One way to address sources of error is through the use of a third or additional ground pin on the shunt, which is shown, in part, by the embodiments of FIGS. 21A, 21B, and 22.

FIGS. 21A and 21B illustrate another aspect of a resistor 2110. The resistor 2110 is generally formed of a resistive element 2111 disposed between a first conductive portion 2112 and a second conductive portion 2114. The resistive element 2111 may be welded or otherwise bonded between the first conductive portion 2112 and the second conductive portion 2114. The resistor 2110 may be similar to the resistor 110 of FIG. 2 and has a similar function and structure to resistor 110 unless otherwise specified.

As shown in FIGS. 21A and 21B, a first TCR adjustment opening 2172 and a second TCR adjustment opening 2176 are formed on the first conductive portion 2112 and the second conductive portion 2114 respectively, and current connections or connection areas are provided via a first outer circular hole 2170 on the first conductive portion 2112 and a second outer circular opening 2174 on the second conductive portion 2114. FIGS. 21A and 21B illustrate a single current sense resistor, that is, there is a single resistive element.

All aspects of the openings 2170, 2172, 2174, 2176 may vary. For example, the openings 2170, 2172, 2174, 2176 may each have a different profile, dimension, size, or shape. These may be adjusted or changed based on need or function. The openings 2170, 2172, 2174, 2176 may include one or more through openings and one or more openings that do not extend completely through the conductive portions and/or the resistive elements. The openings 2170, 2172, 2174, 2176 may be circular, elongated, slotted, non-circular, S-shaped, N-shaped, serpentine, or any other shape as may be selected. The orientation or direction in which any of the slotted or elongated openings 2170, 2172, 2174, 2176 extend may vary, having differences in height, length, width, etc. In certain aspects, one or more of the openings 2170, 2172, 2174, 2176 may be omitted. These variations can be realized in any one or more of the other embodiments described herein.

The openings 2170, 2172, 2174, 2176 are all arranged in an interior area of the resistor 2110. The openings 2170, 2172, 2174, 2176 are each spaced away from outer edges, such as the lateral and longitudinal edges, or the perimeter of the resistor 2110. No portion of the openings 2170, 2172, 2174, 2176 intersect, contact or cross the outer edges, such as the lateral and longitudinal edges, or the perimeter of the resistor 2110. In this way, the openings 2170, 2172, 2174, 2176 are surrounded on all sides by parts of the conductive portions, the resistive elements, or combinations of those.

As shown in FIGS. 21A and 21B, a header or header assembly 2180 is disclosed that is configured to provide a convenient arrangement for securing pins, such as a first pin 2184a, a second pin 2184b, and a third pin 2184c. The header assembly 2180 includes braces having a plurality of openings, i.e. a first opening 2181a, second opening 2181b, third opening 2181c, fourth opening 2181d, and fifth opening 2181e, configured to attach to or otherwise secure at least one of the pins 2184a, 2184b, 2184c. The openings 2181a-2181e define predetermined pin location or pin placement locations. As shown in FIGS. 21A and 21B only the first, fourth, and fifth openings 2181a, 2181d, 2181e are occupied by a respective one of the pins 2184a, 2184b, 2184c. This configuration is advantageous for manufacturing and allows soldering of the pins 2184a, 2184b, 2184c to inner or inside surfaces of openings 2172, 2176, which further improve TCR performance. This arrangement also assists with positioning of the pins 2184a, 2184b, 2184c relative to the resistor 2110, and further provides an insulative spacing part in the header assembly 2180.

As shown in FIGS. 21A and 21B, first and second pins 2184a and 2184b are configured as sensing pins and third pin 2184c is configured as a ground pin. Cross-sectional hatching is shown in FIG. 21B for ground pin 2184c only for illustrative purposes in order to differentiate the ground pin 2184c from the sensing pins 2184a and 2184b. The sensing pins 2184a, 2184b are preferably arranged so as to contact inner surface edges of the openings 2172, 2176 that are closest to each other, as shown in FIGS. 21A and 21B. Ground pin 2184c is arranged so as to contact an outermost surface edge of opening 2176. The ground pin 2184c generally provides a ground reference for a measurement system that is separate from the rest of the resistor. The sensing pins 2184a, 2184b are configured to be connected, such as via soldering, to a printed circuit board (PCB) or connector that is attached to the PCB. In one aspect, the sensing pins 2184a, 2184b are configured as voltage sense pins and are configured to be connected to a positive and negative voltage section of a sensing circuit.

Although three pins 2184a, 2184b, 2184c are illustrated in FIGS. 21A and 21B and the pins 2184a, 2184b, 2184c are shown in specific configurations, one of ordinary skill in the art would understand that the quantity, location, shape, orientation, and other aspects of the pins 2184a, 2184b, 2184c can vary.

Figure 22:
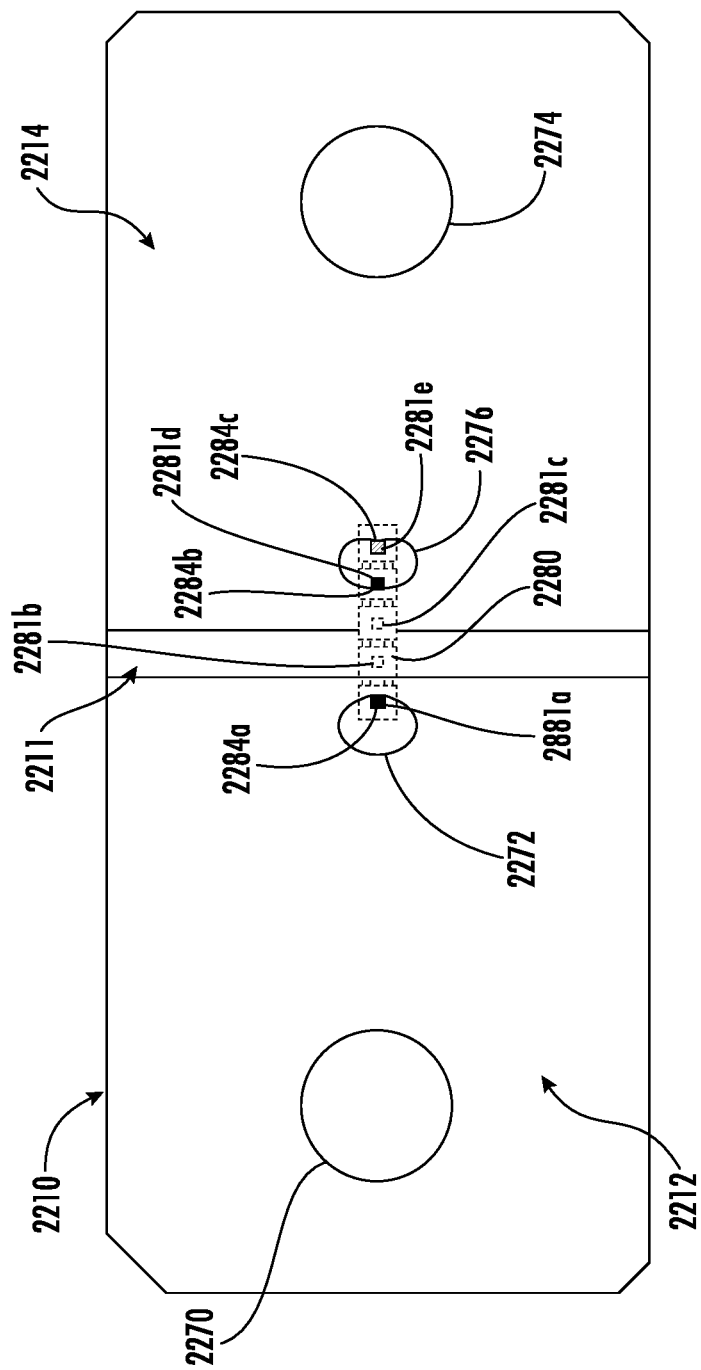
FIG. 22 illustrates a front view of another embodiment of a resistor according to an aspect of the invention.

FIG. 22 illustrates a resistor 2210 having similar characteristics as the resistor 2110 of FIGS. 21A and 21B. As shown in FIG. 22, resistor 2210 is generally formed of a resistive element 2211 disposed between a first conductive portion 2212 and a second conductive portion 2214. The resistive element 2211 may be welded or otherwise bonded between the first conductive portion 2212 and the second conductive portion 2214. The resistor 2210 may be similar to the resistor 110 of FIG. 2 and has a similar same function and structure to resistor 110 unless otherwise specified.

As shown in FIG. 22, a first TCR adjustment opening 2272 and a second TCR adjustment opening 2276 are formed on the first conductive portion 2212 and the second conductive portion 2214, respectively, and current connections or connection areas are provided via a first outer circular opening 2270 on the first conductive portion 2212 and a second outer circular opening 2274 on the second conductive portion 2214. FIG. 22 illustrates a single current sense resistor, that is, there is a single resistive element.

All aspects of the openings 2270, 2272, 2274, 2276 may vary. For example, the openings 2270, 2272, 2274, 2276 may each have a different profile, dimension, size, or shape. These may be adjusted or changed based on need or function. The openings 2270, 2272, 2274, 2276 may include one or more through openings and one or more openings that do not extend completely through the conductive portions and/or the resistive elements. The openings 2270, 2272, 2274, 2276 may be circular, elongated, slotted, non-circular, S-shaped, N-shaped, serpentine, or any other shape as may be selected. The orientation or direction in which any of the slotted or elongated openings 2270, 2272, 2274, 2276 extend may vary, having differences in height, length, width, etc. In certain aspects, one or more of the openings 2270, 2272, 2274, 2276 may be omitted. These variations can be realized in any one or more of the other embodiments described herein.

The openings 2270, 2272, 2274, 2276 are all arranged in an interior area of the resistor 2210. The openings 2270, 2272, 2274, 2276 are each spaced away from outer edges, such as the lateral and longitudinal edges, or the perimeter of the resistor 2210. No portion of the openings 2270, 2272, 2274, 2276 intersect, contact or cross the outer edges, such as the lateral and longitudinal edges, or the perimeter of the resistor 2210. In this way, the openings 2270, 2272, 2274, 2276 are surrounded on all sides by parts of the conductive portions, the resistive elements, or combinations of those.

As shown in FIG. 22, a header or header assembly 2280 is provided that is configured to provide a convenient arrangement for securing pins, such as a first pin 2284a, a second pin 2284b, and a third pin 2284c. The header assembly 2280 includes braces having a plurality of openings, i.e. a first opening 2281a, second opening 2281b, third opening 2281c, fourth opening 2281d, and fifth opening 2281e, configured to attach to or otherwise secure at least one of the pins 2284a, 2284b, 2284c. As shown in FIG. 22, only the first, fourth, and fifth openings 2281a, 2281d, 2281e are occupied by a respective one of the pins 2284a, 2284b, 2284c. This configuration is advantageous for manufacturing and allows soldering of the pins 2284a, 2284b, 2284c to inner or inside surfaces of openings 2272, 2276, which further improve TCR performance.

As shown in FIG. 22, the first and second pins 2284a, 2284b are configured as sensing pins and the third pin 2284c is configured as a ground pin. The sensing pins 2284a, 2284b are preferably arranged so as to contact inner surface edges of the openings 2272, 2276 that are closest to each other, as shown in FIG. 22. Ground pin 2284c is arranged so as to contact an outermost surface edge of opening 2276. The ground pin 2284c generally provides a ground reference for a measurement system that is separate from the rest of the resistor. The sensing pins 2284a, 2284b are configured to be connected, such as via soldering, to a printed circuit board (PCB) or connector that is attached to the PCB. In one aspect, the sensing pins 2284a, 2284b are configured as voltage sense pins and are configured to be connected to a positive and negative voltage section of a sensing circuit.

Although three pins 2284a, 2284b, 2284c are illustrated in FIG. 22 and the pins 2284a, 2284b, 2284c are shown in specific configurations, one of ordinary skill in the art would understand that the quantity, location, shape, orientation, and other aspects of the pins 2284a, 2284b, 2284c can vary.

Figure 23:
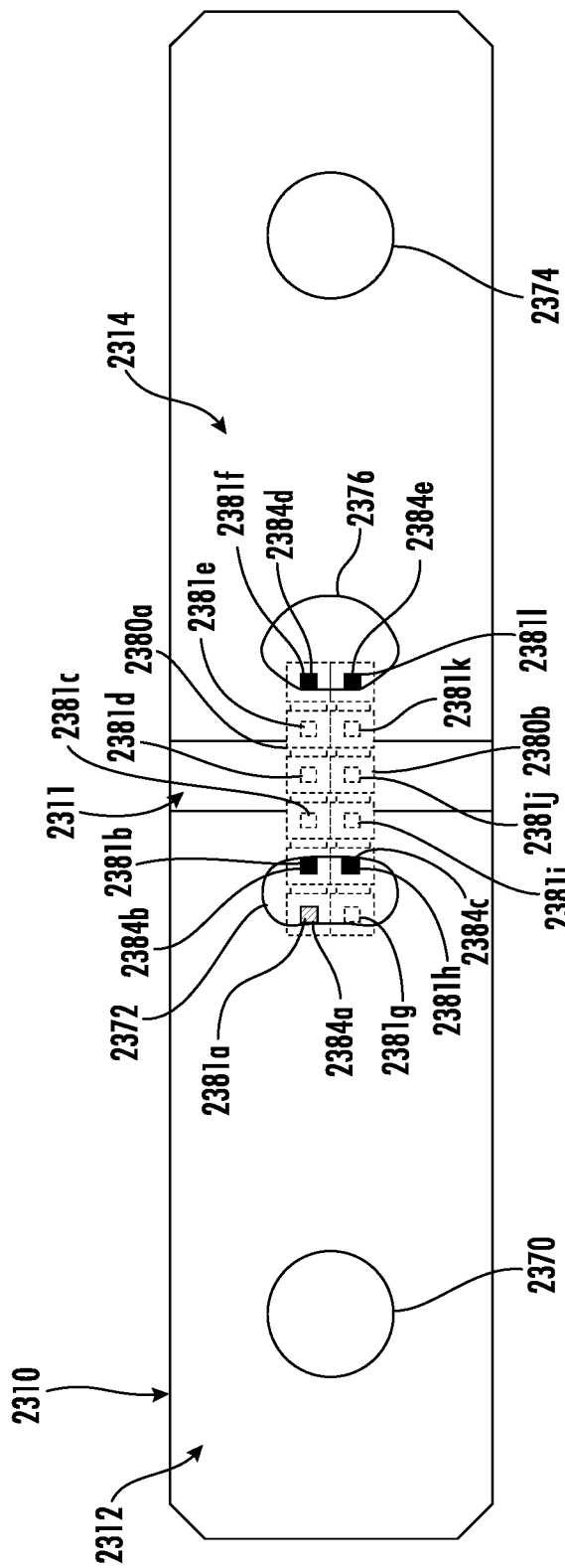
FIG. 23 illustrates a front view of another embodiment of a resistor according to an aspect of the invention.

FIG. 23 illustrates a resistor 2310 having similar characteristics as the resistor 2110 of FIGS. 21A and 21B. As shown in FIG. 23, resistor 2310 is generally formed of a resistive element 2311 disposed between a first conductive portion 2312 and a second conductive portion 2314. The resistive element 2311 may be welded or otherwise bonded between the first conductive portion 2312 and the second conductive portion 2314. The resistor 2310 may be similar to the resistor 110 of FIG. 2 and has a similar function and structure to resistor 110 unless otherwise specified.

As shown in FIG. 23, a first TCR adjustment opening 2372 and a second TCR adjustment opening 2376 are formed on the first conductive portion 2312 and the second conductive portion 2314, respectively, and current connections or connection areas are provided via outer circular openings 2370, 2374 on the first conductive portion 2312 and the second conductive portion 2314. As shown in FIG. 23, the TCR adjustment opening 2372 has a quasi-slotted profile as compared to the TCR adjustment opening 2376.

All aspects of the openings 2370, 2372, 2374, 2376 may vary. For example, the openings 2370, 2372, 2374, 2376 may each have a different profile, dimension, size, or shape. These may be adjusted or changed based on need or function. The openings 2370, 2372, 2374, 2376 may include one or more through openings and one or more openings that do not extend completely through the conductive portions and/or the resistive elements. The openings 2370, 2372, 2374, 2376 may be circular, elongated, slotted, non-circular, S-shaped, N-shaped, serpentine, or any other shape as may be selected. The orientation or direction in which any of the slotted or elongated openings 2370, 2372, 2374, 2376 extend may vary, having differences in height, length, width, etc. In certain aspects, one or more of the openings 2370, 2372, 2374, 2376 may be omitted. These variations can be realized in any one or more of the other embodiments described herein.

The openings 2370, 2372, 2374, 2376 are all arranged in an interior area of the resistor 2310. The openings 2370, 2372, 2374, 2376 are each spaced away from outer edges, such as the lateral and longitudinal edges, or the perimeter of the resistor 2310. No portion of the openings 2370, 2372, 2374, 2376 intersect, contact or cross the outer edges, such as the lateral and longitudinal edges, or the perimeter of the resistor 2310.

As shown in FIG. 23, a first header assembly 2380a and a second header assembly 2380b are provided that are configured to provide a convenient arrangement for securing pins, such as a first pin 2384a, second pin 2384b, third pin 2384c, fourth pin 2384d, and fifth pin 2384e. The header assemblies 2380a, 2380b includes braces having a plurality of openings, i.e. a first opening 2381a, second opening 2381b, third opening 2381c, fourth opening 2381d, fifth opening 2381e, sixth opening 2381f, seventh opening 2381g, eighth opening 2381h, ninth opening 2381i, tenth opening 2381j, eleventh opening 2381k, and twelfth opening 2381l, configured to attach to or otherwise secure at least one of the pins 2384a, 2384b, 2384c, 2384d, 2384e. As shown in FIG. 23, only the first opening 2381a, second opening 2381b, sixth opening 2381f, eighth opening 2381h, and twelfth opening 2381l are occupied by a respective one of the pins 2384a, 2384b, 2384c, 2384d, 2384e. This configuration is advantageous for manufacturing and allows soldering of the pins 2384a, 2384b, 2384c, 2384d, 2384e to inner or inside surfaces of openings 2372, 2376, which further improve TCR performance. FIG. 23 illustrates a dual current sense resistor, which is considered a redundant voltage connection arrangement in one aspect.

As shown in FIG. 23, the second, third, fourth, and fifth pins 2384b, 2384c, 2384d, 2384e are configured as sensing pins and the first pin 2384a is configured as a ground pin. The sensing pins 2384b, 2384c, 2384d, 2384e are preferably arranged so as to contact inner surface edges of the openings 2372, 2376 that are closest to each other, as shown in FIG. 23. Ground pin 2384a is arranged so as to contact an outermost surface edge of opening 2376. The ground pin 2384a generally provides a ground reference for a measurement system that is separate from the rest of the resistor. The sensing pins 2384b, 2384c, 2384d, 2384e are configured to be connected, such as via soldering, to a printed circuit board (PCB) or connector that is attached to the PCB. In one aspect, the sensing pins 2384b, 2384c, 2384d, 2384e are configured as voltage sense pins and are configured to be connected to a positive and negative voltage section of a sensing circuit.

Although five pins 2384a, 2384b, 2384c, 2384d, 2384e are illustrated in FIG. 23 and the pins 2384a, 2384b, 2384c, 2384d, 2384e are shown in specific configurations, one of ordinary skill in the art would understand that the quantity, location, shape, orientation, and other aspects of the pins 2384a, 2384b, 2384c, 2384d, 2384e can vary.

FIGS. 24A and 24B illustrates a resistor 2410 having similar characteristics as the resistor 2110 of FIGS. 21A and 21B. As shown in FIGS. 24A and 24B, resistor 2410 is generally formed of a resistive element 2411 disposed between a first conductive portion 2412 and a second conductive portion 2414. The resistive element 2411 may be welded or otherwise bonded between the first conductive portion 2412 and the second conductive portion 2414. The resistor 2410 may be similar to the resistor 110 of FIG. 2 and has a similar function and structure to resistor 110 unless otherwise specified.

As shown in FIGS. 24A and 24B, a first TCR adjustment slot 2472 and a second TCR adjustment slot 2476 are formed on the first conductive portion 2412 and the second conductive portion 2414, respectively, and current sense connections or connection areas are provided via outer circular openings 2470, 2474 on the first conductive portion 2412 and the second conductive portion 2414.

All aspects of the openings 2470, 2472, 2474, 2476 may vary. For example, the openings 2470, 2472, 2474, 2476 may each have a different profile, dimension, size, or shape. These may be adjusted or changed based on need or function. The openings 2470, 2472, 2474, 2476 may include one or more through openings and one or more openings that do not extend completely through the conductive portions and/or the resistive elements. The openings 2470, 2472, 2474, 2476 may be circular, elongated, slotted, non-circular, S-shaped, N-shaped, serpentine, or any other shape as may be selected. The orientation or direction in which any of the slotted or elongated openings 2470, 2472, 2474, 2476 extend may vary, having differences in height, length, width, etc. In certain aspects, one or more of the openings 2470, 2472, 2474, 2476 may be omitted. These variations can be realized in any one or more of the other embodiments described herein.

The openings 2470, 2472, 2474, 2476 are all arranged in an interior area of the resistor 2410. The openings 2470, 2472, 2474, 2476 are each spaced away from outer edges, such as the lateral and longitudinal edges, or the perimeter of the resistor 2410. No portion of the openings 2470, 2472, 2474, 2476 intersect, contact or cross the outer edges, such as the lateral and longitudinal edges, or the perimeter of the resistor 2410. In this way, the openings 2470, 2472, 2474, 2476 are surrounded on all sides by parts of the conductive portions, the resistive elements, or combinations of those.

FIGS. 26A-26C illustrate a resistor 2610 having similar characteristics as the resistor 2110 of FIGS. 21A and 21B. As shown in FIGS. 26A-26C, the resistor 2610 is generally formed of a resistive element 2611 disposed between a first conductive portion 2612 and a second conductive portion 2614. The resistive element 2611 may be welded or otherwise bonded between the first conductive portion 2612 and the second conductive portion 2614. The resistor 2610 may be similar to the resistor 110 of FIG. 2 and has a similar function and structure to resistor 110 unless otherwise specified.

As shown in FIGS. 26A-26C, a first TCR adjustment opening 2672 and a second TCR adjustment opening 2676 are formed on the first conductive portion 2612 and the second conductive portion 2614, respectively, and current connections or connection areas are provided via outer circular openings 2670, 2674 on the first conductive portion 2612 and the second conductive portion 2614.

All aspects of the openings 2670, 2672, 2674, 2676 may vary. For example, the openings 2670, 2672, 2674, 2676 may each have a different profile, dimension, size, or shape. These may be adjusted or changed based on need or function. The openings 2670, 2672, 2674, 2676 may include one or more through openings and one or more openings that do not extend completely through the conductive portions and/or the resistive elements. The openings 2670, 2672, 2674, 2676 may be circular, elongated, slotted, non-circular, S-shaped, N-shaped, serpentine, or any other shape as may be selected. The orientation or direction in which any of the slotted or elongated openings 2670, 2672, 2674, 2676 extend may vary, having differences in height, length, width, etc. In certain aspects, one or more of the openings 2670, 2672, 2674, 2676 may be omitted. These variations can be realized in any one or more of the other embodiments described herein.

The openings 2670, 2672, 2674, 2676 are all arranged in an interior area of the resistor 2610. The openings 2670, 2672, 2674, 2676 are each spaced away from outer edges, such as the lateral and longitudinal edges, or the perimeter of the resistor 2610. No portion of the openings 2670, 2672, 2674, 2676 intersect, contact or cross the outer edges, such as the lateral and longitudinal edges, or the perimeter of the resistor 2610. In this way, the openings 2670, 2672, 2674, 2676 are surrounded on all sides by parts of the conductive portions, the resistive elements, or combinations of those.

As shown in FIGS. 26A-26C, a header assembly 2680 is provided that is configured to provide a convenient arrangement for securing pins, such as a first pin 2684a, second pin 2684b, third pin 2684c, and fourth pin 2684d. The header assembly 2680 includes at least one brace having a plurality of openings, i.e. a first opening 2681a, second opening 2681b, third opening 2681c, and fourth opening 2681d, configured to attach to or otherwise secure at least one of the pins 2684a, 2684b, 2684c, 2684d.

As shown in FIGS. 26A-26C, the first opening 2681a, second opening 2681b, third opening 2681c, and fourth opening 2681d are occupied by a respective one of the first pin 2684a, second pin 2684b, third pin 2684c, and fourth pin 2684d. This configuration is advantageous for manufacturing and allows soldering of the pins 2684a, 2684b, 2684c, 2684d to inner or inside surfaces of openings 2672, 2676, which further improve TCR performance.

The pins 2684a, 2684b, 2684c, 2684d are configured to be connected, such as via soldering, to a printed circuit board (PCB) 2695 or a connector that is attached to the PCB. In one aspect, the pins 2684a, 2684b, 2684c, 2684d are configured as voltage sense pins and are configured to be connected to a positive and negative voltage section of a sensing circuit.

As shown in FIGS. 24A and 24B, a first header assembly 2480a and a second header assembly 2480b are provided that are configured to provide a convenient arrangement for securing pins, such as a first pin 2484a, second pin 2484b, third pin 2484c, fourth pin 2484d, and fifth pin 2484e. The header assemblies 2480a, 2480b includes braces having a plurality of openings, i.e. a first opening 2481a, second opening 2481b, third opening 2481c, fourth opening 2481d, fifth opening 2481e, sixth opening 2481f, seventh opening 2481g, eighth opening 2481h, ninth opening 2481i, tenth opening 2481j, eleventh opening 2481k, and twelfth opening 2481l, configured to attach to or otherwise secure at least one of the pins 2484a, 2484b, 2484c, 2484d, 2484e. As shown in FIG. 24A, only the first opening 2481a, second opening 2481b, sixth opening 2481f, eighth opening 2481h, and twelfth opening 2481l are occupied by a respective one of the pins 2484a, 2484b, 2484c, 2484d, 2484e. This configuration is advantageous for manufacturing and allows soldering of the pins 2484a, 2484b, 2484c, 2484d, 2484e to inner or inside surfaces of openings 2472, 2476, which further improve TCR performance. FIGS. 24A and 24B illustrate a dual current sense resistor, which is considered a redundant voltage connection arrangement in one aspect.

As shown in FIGS. 24A and 24B, the second, third, fourth, and fifth pins 2484b, 2484c, 2484d, 2484e are configured as sensing pins and the first pin 2484a is configured as a ground pin, which is shown by cross-hatching in FIG. 24B for illustrative purposes only. The sensing pins 2484b, 2484c, 2484d, 2484e are preferably arranged so as to contact inner surface edges of the openings 2472, 2476 that are closest to each other, as shown in FIGS. 24A and 24B. Ground pin 2484a is arranged so as to contact an outermost surface edge of opening 2476. The ground pin 2484a generally provides a ground reference for a measurement system that is separate from the rest of the resistor. The sensing pins 2484b, 2484c, 2484d, 2484e are configured to be connected, such as via soldering, to a printed circuit board (PCB) or connector that is attached to the PCB. In one aspect, the sensing pins 2484b, 2484c, 2484d, 2484e are voltage sense pins and are configured to be connected to a positive and negative voltage section of a sensing circuit.

Although five pins 2484a, 2484b, 2484c, 2484d, 2484e are illustrated in FIGS. 24A and 24B and the pins 2484a, 2484b, 2484c, 2484d, 2484e are shown in specific configurations, one of ordinary skill in the art would understand that the quantity, location, shape, orientation, and other aspects of the pins 2484a, 2484b, 2484c, 2484d, 2484e can vary.

FIG. 25 illustrates another resistor 2510 having similar characteristics as the resistor 2110 of FIGS. 21A and 21B. As shown in FIG. 25, the resistor 2510 is generally formed of a resistive element 2511 disposed between a first conductive portion 2512 and a second conductive portion 2514. The resistive element 2511 may be welded or otherwise bonded between the first conductive portion 2512 and the second conductive portion 2514. The resistor 2510 may be similar to the resistor 110 of FIG. 2 and has a similar function and structure to resistor 110 unless otherwise specified.

As shown in FIG. 25, a first TCR adjustment opening 2572 and a second TCR adjustment opening 2576 are formed on the first conductive portion 2512 and the second conductive portion 2514, and current connections or connection areas are provided via outer circular openings 2570, 2574 on the first conductive portion 2512 and the second conductive portion 2514. As shown in FIG. 25, the first TCR adjustment opening 2572 is formed as an oval, and the second TCR adjustment opening 2576 has an elongated, slot-like profile. FIG. 25 illustrates one aspect of a single current sense resistor, that is, there is a single resistive element.

All aspects of the openings 2570, 2572, 2574, 2576 may vary. For example, the openings 2570, 2572, 2574, 2576 may each have a different profile, dimension, size, or shape. These may be adjusted or changed based on need or function. The openings 2570, 2572, 2574, 2576 may include one or more through openings and one or more openings that do not extend completely through the conductive portions and/or the resistive elements. The openings 2570, 2572, 2574, 2576 may be circular, elongated, slotted, non-circular, S-shaped, N-shaped, serpentine, or any other shape as may be selected. The orientation or direction in which any of the slotted or elongated openings 2570, 2572, 2574, 2576 extend may vary, having differences in height, length, width, etc. In certain aspects, one or more of the openings 2570, 2572, 2574, 2576 may be omitted. These variations can be realized in any one or more of the other embodiments described herein.

The openings 2570, 2572, 2574, 2576 are all arranged in an interior area of the resistor 2510. The openings 2570, 2572, 2574, 2576 are each spaced away from outer edges, such as the lateral and longitudinal edges, or the perimeter of the resistor 2510. No portion of the openings 2570, 2572, 2574, 2576 intersect, contact or cross the outer edges, such as the lateral and longitudinal edges, or the perimeter of the resistor 2510. In this way, the openings 2570, 2572, 2574, 2576 are surrounded on all sides by parts of the conductive portions, the resistive elements, or combinations of those.

The resistor shown in FIG. 25 does not include a header or header assembly, as disclosed in FIGS. 21A-24B. Instead, FIG. 25, illustrates a PCB 2595, 2595' that is used in conjunction with the resistor 2510. Instead of using pins that engage an interior of openings formed on the resistor, the configuration of FIG. 25 relies on surface connections between the resistor 2510 and the PCB 2595.

The PCB is illustrated in a state prior to engaging the resistor 2510 as element 2595' in a bottom region of FIG. 25, and the PCB is illustrated in a state engaging the resistor 2510 as element 2595 in the upper region of FIG. 25.

Sensing areas 2596a, 2596b, 2596c are provided on the PCB 2595. The sensing areas 2596a, 2596b, 2596c essentially provide the same function as the sensing pins described herein. A connection is provided between the resistor 2510 and the PCB 2595 via engagement of conductor portions 2597a, 2597b formed on the PCB 2595 with the resistor 2510. Areas 2598a, 2598b are non-conductive regions of the PCB 2595. In the embodiment shown in FIG. 25, via on the PCB are used for voltage sensing.

As shown in the embodiments, the outer openings (i.e. openings 70, 74, 170, 174, 270, 274, 370, 374, 1270, 1274, 1370a-e, 1374a-e, 1770a, 1774b, 1770d, 1774d, 1770e, 1774e, 1770f, 1774f, 1770g, 1774g, 1770h, 1774h, 1770i, 1774i, 1770j, 1774j, 1770k, 1774k, 1774l, 1770m, 1870, 1874, 1970, 1974, 2070, 2074, 2170, 2174, 2270, 2274, 2370, 2374, 2470, 2474, 2570, 2574, 2670, 2674 and the unlabeled outer circular openings in FIGS. 5-8) may function as a current connection hole or area. The current connection openings provide only one example of how a resistor may be attached to a current that is to be monitored and/or measured. Such openings may be omitted entirely.

As shown in the embodiments, the interior or inner openings (i.e. openings 72, 76, 78, 172, 176, 272, 276, 278, 279, 372, 376, 378, 472, 476, 478, 572, 576, 578, 672, 676, 772, 776, 872, 876, 1272, 1276, 1278, 1372a-1372e, 1376a-1376e, 1378a-1378e, 1772a-1772m, 1776a-1776m, 1778a-1778m, 1872, 1876, 1878, 1972, 1976, 1978, 2072, 2076, 2078, 2172, 2176, 2272, 2276, 2372, 2376, 2472, 2476, 2572, 2576, 2672, 2676) function as TCR adjustment openings, which are also referred to as a TCR compensation slots. The TCR adjustment openings (i.e. openings 72, 76, 78, 172, 176, 272, 276, 278, 279, 372, 376, 472, 476, 572, 576, 578, 672, 676, 772, 776, 872, 876, 1272, 1276, 1278, 1372a-1372e, 1376a-1376e, 1378d, 1772a-1772m, 1776a-1776m, 1778a-1778m, 1872, 1876, 1972, 1976, 2072, 2076, 2172, 2176, 2272, 2276, 2372, 2376, 2472, 2476, 2572, 2576, 2672, 2676) each have a perimeter or perimeter sidewall that is continuously curved, non-linear, and non-circular. In one aspect, the perimeter of the TCR openings is defined by a perimeter wall formed by the resistive elements, conductive portions, and/or combinations thereof, and the perimeter has a portion that is continuously curved, non-linear, and non-circular.

Certain TCR adjustment openings (i.e. openings 378, 478, 578, 778, 878, 1378a-1378c, 1878, 1978, 2078) are exceptions to the continuously curved, non-linear, and non-circular perimeters for the TCR adjustment openings, and each of these TCR adjustment openings have alternative shaped perimeters or perimeter sidewalls.

Certain TCR adjustment openings (i.e. openings 272, 276, 278, 279, 372, 376, 472, 476, 572, 576, 672, 676, 772, 776, 872, 876, 1372a-1372c, 1376a-1376c, 1872, 1876, 1972, 1976, 2072, 2076) have a perimeter or perimeter sidewall with a continuous arc profile. In one aspect, the perimeter of the TCR openings is defined by a perimeter wall formed by the resistive elements, conductive portions, and/or combinations thereof, and the perimeter has a portion formed by a continuous arc.

Certain TCR adjustment openings (i.e. openings 72, 76, 78, 172, 176, 1272, 1276, 1278, 1372d, 1372e, 1376d, 1376e, 1772a-1772m, 1776a-1776m, 1778a-1778m, 2172, 2176, 2272, 2276, 2372, 2376, 2472, 2476, 2572, 2576, 2672, 2676) have a perimeter or perimeter sidewall with an oblong, oval, or oblong oval profile. In one aspect, the perimeter of the TCR openings is defined by a perimeter wall formed by the resistive elements, conductive portions, and/or combinations thereof, and the perimeter has a portion formed with an oblong, oval, or oblong oval profile.

In each of the embodiments described herein, the TCR adjustment openings may be generally located in an interior area of the respective portions, whether in the conductive strips or resistive elements. The TCR adjustment openings are each generally arranged in interior areas of the resistors, in one aspect. The openings in the conductive portions may be surrounded, such as completely surrounded, by the materials of the conductive portions. The opening in the resistive elements may be surrounded, such as completely surrounded, by the materials of the resistive elements or may be surrounded by the materials of the resistive elements and the materials of the conductive portions to the extent the openings extend through parts of the conductive openings. The openings are formed away from an outer perimeter edge of the conductive strips or resistive elements. The openings in the resistive element are formed away from the outer or perimeter edges of the resistive element or resistor.

Any of the resistors disclosed herein can be used in battery management systems for hybrid-EV, full-EV, hybrid plug-in EV for high, mid-, and low voltage systems, as well as current monitoring in wind generators and other alternative energy generation. The resistors could also be used in direct current sensing, current sensing in conjunction to and attached to other circuitry, as well as the automotive, industrial, and renewable energy industries.

Although the features and elements of the present invention are described in the example embodiments in particular combinations, each feature may be used alone without the other features and elements of the example embodiments or in various combinations with or without other features and elements of the present invention.

In the drawings and specification there has been set forth embodiments of the invention, and although specific terms are employed these are used in a generic and descriptive sense only and not for purposes of limitation. Changes in the form and the proportion of parts as well as in the substitution of equivalents are contemplated as circumstances may suggest or render expedient without departing from the spirit or scope of the invention as further defined in the following claims.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

The present disclosure is not limited to the precise construction and compositions disclosed herein. Moreover, the present concepts expressly include any and all combinations and subcombinations of the preceding elements and features.

What is claimed is:

1. A resistor comprising:
   a resistive element disposed between a first conductive portion and a second conductive portion;
   a first temperature coefficient of resistance (TCR) adjustment opening provided through the first conductive portion and positioned in a first interior area of the resistor, a perimeter of the first TCR adjustment opening defined by at least a portion of the first conductive portion, the first TCR adjustment opening having one of a generally oblong, or generally oval, or generally oblong oval shape, wherein a profile, dimension, size, or shape of the first TCR adjustment opening is configured to adjust a TCR value of the resistor; and
   a second temperature coefficient of resistance (TCR) adjustment opening provided through the second conductive portion and positioned in a second interior area of the resistor, a perimeter of the second TCR adjustment opening defined by at least a portion of the second conductive portion, the second TCR adjustment opening having a non-circular perimeter.

2. The resistor of claim 1, wherein the second TCR adjustment opening has one of a generally oblong, or generally oval, or generally oblong oval shape.

3. The resistor of claim 1, wherein the second TCR adjustment opening has one of a generally elongated or generally slotted profile.

4. The resistor of claim 1, wherein a portion of the first TCR adjustment opening curves toward the resistive element.

5. The resistor of claim 4, wherein a portion of second first TCR adjustment opening curves toward the resistive element.

6. The resistor of claim 1, wherein at least a portion of the perimeter of the first TCR adjustment opening extends along a linear path.

7. The resistor of claim 6, wherein the linear path extends in a transverse direction with respect to a longitudinal extension direction of the resistor.

8. The resistor of claim 6, wherein at least a portion of the perimeter of the first TCR adjustment opening curves away from the resistive element.

9. The resistor of claim 6, wherein a portion of the perimeter of the first TCR adjustment opening facing a first longitudinal side of the resistor is curved, and wherein a portion of the perimeter of the first TCR adjustment opening facing a second longitudinal side of the resistor opposite from the first longitudinal side is curved.

10. The resistor of claim 1, wherein the first TCR adjustment opening has a greater dimension along a transverse direction than in a longitudinal direction of the resistor.

11. The resistor of claim 1, further comprising a header assembly, the header assembly comprising at least one pin configured as a voltage sense pin, the at least one pin configured to contact at least a portion of the perimeter of the first TCR adjustment opening or at least a portion of the perimeter of the second TCR adjustment opening.

12. The resistor of claim 11, wherein the at least one pin comprises a first pin positioned so as to contact at least a portion of the perimeter of the first TCR adjustment opening.

13. The resistor of claim 12, wherein the header assembly further includes a second pin positioned so as to contact at least a portion of the perimeter of the second TCR adjustment opening, the second pin configured as a voltage sense pin.

14. The resistor of claim 13, wherein the first pin and the second pin are positioned so as to contact respective portions of the perimeters of the first TCR adjustment opening and the second TCR adjustment opening that are closest to each other.

15. The resistor of claim 13, wherein the first pin is soldered to at least a portion of the perimeter of the first TCR adjustment opening, and the second pin is soldered to at least a portion of the perimeter of the second TCR adjustment opening.

16. The resistor of claim 13, wherein the header assembly further includes a third pin positioned so as to contact at least a portion of the second TCR adjustment opening at a position other than a position of the second pin, the third pin configured as a ground pin.

17. The resistor of claim 13, wherein a portion of the first TCR adjustment opening curves toward the resistive element and wherein the first pin is positioned so as to contact the perimeter of the first TCR adjustment opening adjacent the portion the first TCR adjustment opening that curves toward the resistive element.

18. The resistor of claim 17, wherein a portion of the second TCR adjustment opening curves toward the resistive element and wherein the second pin is positioned so as to contact the perimeter of the second TCR adjustment opening adjacent the portion the second TCR adjustment opening that curves toward the resistive element.

19. A resistor comprising:
   a resistive element disposed between a first conductive portion and a second conductive portion;
   a first temperature coefficient of resistance (TCR) adjustment opening extending through the first conductive portion and positioned in an interior area of the resistor;
   a second temperature coefficient of resistance (TCR) adjustment opening extending through the second conductive portion and positioned in an interior area of the resistor; and a third temperature coefficient of resistance (TCR) adjustment opening extending through the resistive element and at least one of the first conductive portion or the second conductive portion.

20. The resistor of claim 19, wherein at least one of a first profile of the first TCR adjustment opening, a second profile of the second TCR adjustment opening, or a third profile of the third TCR adjustment opening, are configured to adjust a TCR value of the resistor.

21. The resistor according to claim 19, wherein the first TCR adjustment opening and the second TCR adjustment opening are each formed having a continuously curved, non-linear, non-circular perimeter.

22. The resistor according to claim 19, wherein the first TCR adjustment opening and the second TCR adjustment opening are each formed comprising an elongated slot having a continuous arc profile.

23. The resistor according to claim 19, wherein the first TCR adjustment opening and the second TCR adjustment opening each have an oblong or oval profile.

24. The resistor according to claim 19, wherein the first TCR adjustment opening and the second TCR adjustment opening each have at least portions having concave profiles relative to a direction of the resistive element.

25. The resistor according to claim 19, wherein the third TCR adjustment opening extends for an entire longitudinal extent of the resistive element.

26. The resistor according to claim 19, wherein a first portion of the third TCR adjustment opening is partially surrounded by a portion the first TCR adjustment opening, and a second portion of the third TCR adjustment opening is partially surrounded by a portion of the second TCR adjustment opening.

* * * * *